(12) United States Patent
Kim et al.

(10) Patent No.: US 12,363,840 B2
(45) Date of Patent: Jul. 15, 2025

(54) DISPLAY DEVICE

(71) Applicant: LG ELECTRONICS INC., Seoul (KR)

(72) Inventors: Hoyoung Kim, Seoul (KR); Haesuk Choi, Seoul (KR); Heegun Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 195 days.

(21) Appl. No.: 18/027,875

(22) PCT Filed: Sep. 23, 2020

(86) PCT No.: PCT/KR2020/012819
§ 371 (c)(1),
(2) Date: Mar. 22, 2023

(87) PCT Pub. No.: WO2022/065532
PCT Pub. Date: Mar. 31, 2022

(65) Prior Publication Data
US 2023/0380084 A1    Nov. 23, 2023

(51) Int. Cl.
*H05K 5/02* (2006.01)
(52) U.S. Cl.
CPC ................... *H05K 5/0217* (2013.01)
(58) Field of Classification Search
CPC ........ H05K 5/0217; G06F 1/16; G06F 1/1652
See application file for complete search history.

(56) References Cited

U.S. PATENT DOCUMENTS

| | | | | |
|---|---|---|---|---|
| 9,756,757 | B2* | 9/2017 | Park | H05K 7/16 |
| 10,534,402 | B1* | 1/2020 | Kim | H05K 1/118 |
| 10,789,863 | B2* | 9/2020 | Song | H05K 1/189 |
| 11,521,521 | B2* | 12/2022 | Chung | G09F 11/21 |
| 2007/0241002 | A1* | 10/2007 | Wu | G06F 1/1601 |
| | | | | 206/150 |
| 2018/0070467 | A1* | 3/2018 | Kim | H10K 50/84 |

(Continued)

FOREIGN PATENT DOCUMENTS

| | | |
|---|---|---|
| KR | 10-2017-0126061 A | 11/2017 |
| KR | 10-2020-0041846 A | 4/2020 |

(Continued)

*Primary Examiner* — Sagar Shrestha
(74) *Attorney, Agent, or Firm* — Birch, Stewart, Kolasch & Birch, LLP

(57) ABSTRACT

Disclosed is a display device. The display device of the present disclosure includes: a housing which is elongated, and has a base; a roller which is rotatably installed on the base inside the housing; a display panel which is wound around or unwound from the roller; a module cover which is elongated in a longitudinal direction of the housing, has a plurality of segments arranged sequentially in an up-down direction of the display panel in a rear of the display panel, and is wound around or unwound from the roller along with the display panel; and a foldable link which is located in the rear of the display panel, has one side pivotally connected to the base, and has the other side pivotally connected to an upper side of the module cover so that the display panel and module cover stand up while being unwound from the roller, wherein the base is tilted at a certain angle with respect to a bottom of the housing.

7 Claims, 69 Drawing Sheets

(56) References Cited

U.S. PATENT DOCUMENTS

2018/0160554 A1* 6/2018 Kang .................. H05K 5/0017
2019/0138058 A1* 5/2019 Kwon ..................... G09G 3/22
2019/0324501 A1* 10/2019 Kim .................... H05K 5/0017
2019/0371214 A1* 12/2019 Kim ....................... H10K 50/84
2020/0205301 A1* 6/2020 Song ................... H05K 5/0017
2022/0015249 A1* 1/2022 Kim .................... H05K 5/0217

FOREIGN PATENT DOCUMENTS

WO    WO 2010/054380 A2    5/2010
WO    WO 2019/180027 A1    9/2019

\* cited by examiner

FIG. 1
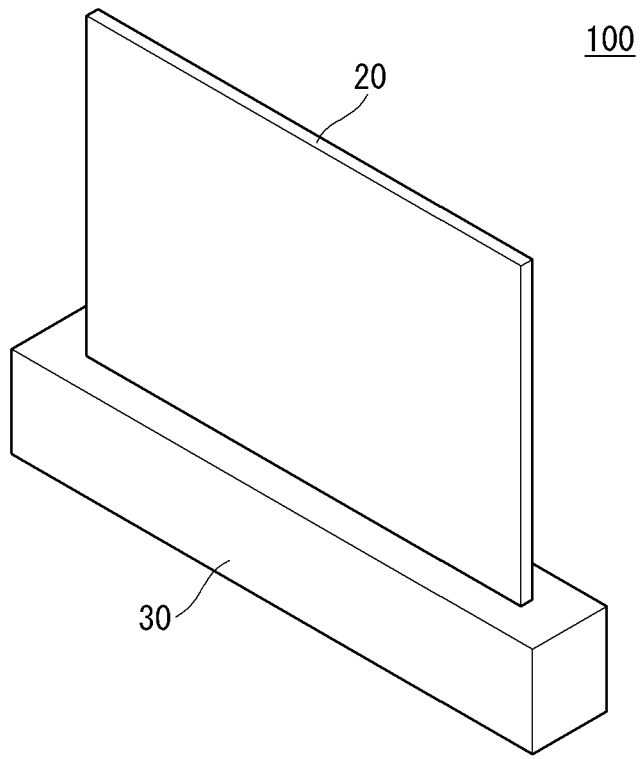
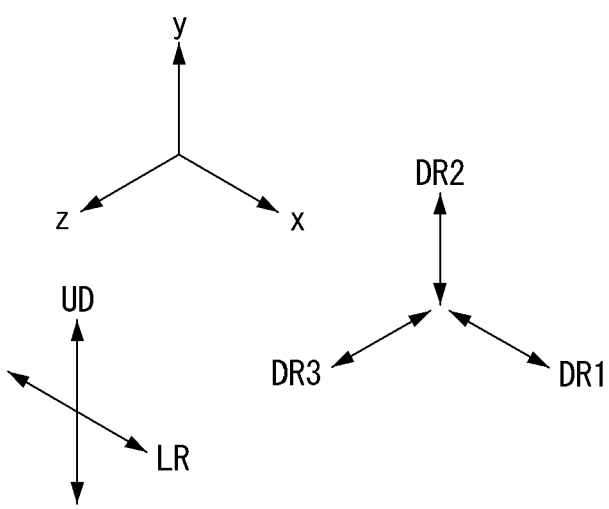

FIG. 10
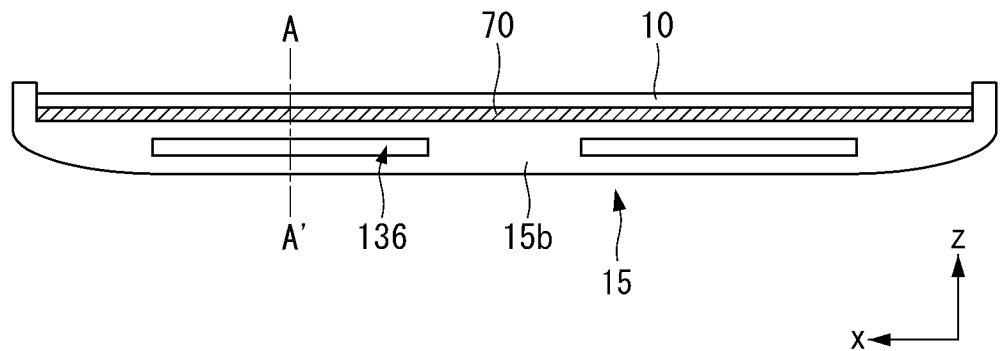
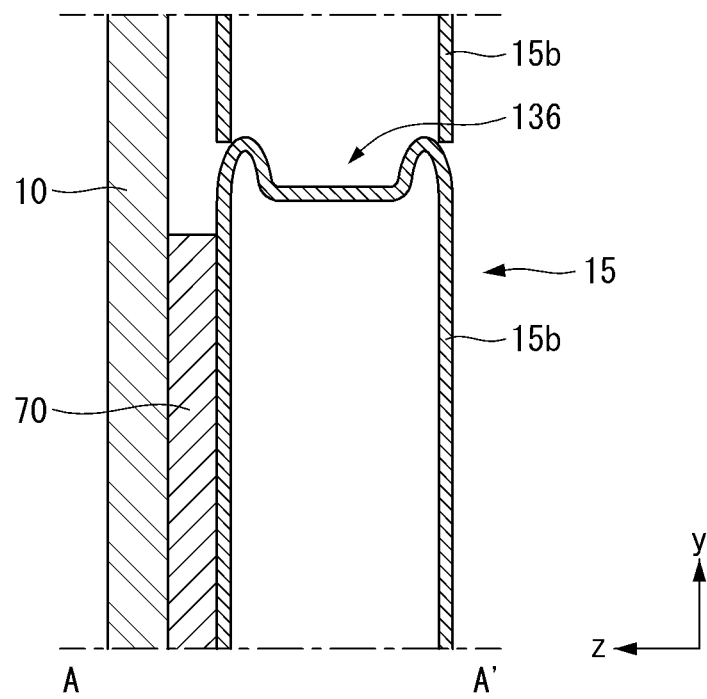

FIG. 12
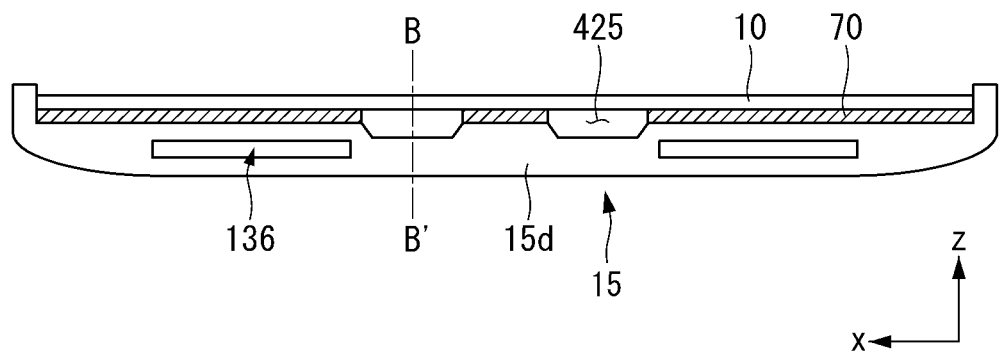
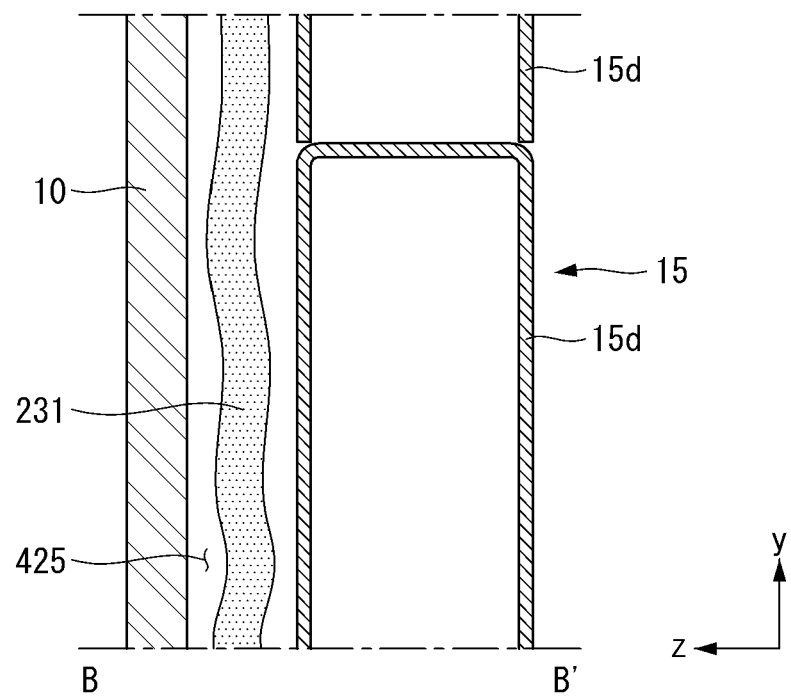

FIG. 13
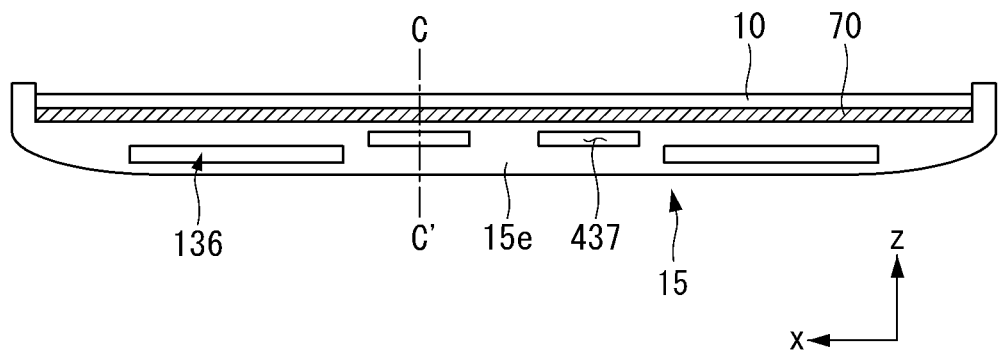
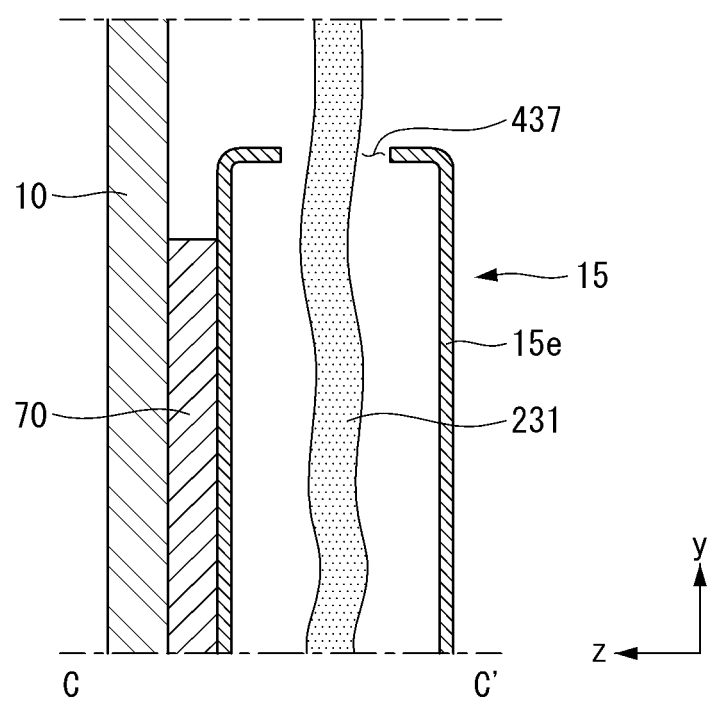

DISPLAY DEVICE

CROSS REFERENCE TO RELATED APPLICATION

This application is the National Phase of PCT International Application No. PCT/KR2020/012819, filed on Sep. 23, 2020, which is hereby expressly incorporated by reference into the present application.

TECHNICAL FIELD

The present disclosure relates to a display device.

BACKGROUND ART

As the information society develops, the demand for display devices is also increasing in various forms. In response to this, various display devices such as Liquid Crystal Display Device (LCD), Plasma Display Panel (PDP), Electroluminescent Display (ELD), and Vacuum Fluorescent Display (VFD) have been researched and used in recent years.

Among them, a display device using an organic light emitting diode (OLED) has superior luminance characteristics and viewing angle characteristics compared to a liquid crystal display device, and can be implemented in an ultra-thin shape as it does not require a backlight unit.

In addition, a flexible display panel can be bent or wound on a roller. By using the flexible display panel, it is possible to implement a display device that is roll out from a roller or wound on a roller. A lot of researches have been accomplished on a structure for winding or unwinding a flexible display panel on/from a roller.

DISCLOSURE

Technical Problem

An object of the present disclosure is to solve the above problems and other problems.

Another object of the present disclosure may be to improve the durability of a foldable link of a rollable display device.

Another object of the present disclosure may be to provide a structure in which a flexible display panel is uniformly wound around and unwound from a roller.

Technical Solution

According to an aspect of the present disclosure, there is provided a display device including: a housing which is elongated, and has a base; a roller which is rotatably installed on the base inside the housing; a display panel which is wound around or unwound from the roller; a module cover which is elongated in a longitudinal direction of the housing, has a plurality of segments arranged sequentially in an up-down direction of the display panel in a rear of the display panel, and is wound around or unwound from the roller along with the display panel; and a foldable link which is located in the rear of the display panel, has one side pivotally connected to the base, and has the other side pivotally connected to an upper side of the module cover so that the display panel and module cover stand up while being unwound from the roller, wherein the base is tilted at a certain angle with respect to a bottom of the housing.

Advantageous Effects

The effect of the display device according to the present disclosure will be described as follows.

According to at least one of the embodiments of the present disclosure, the durability of a foldable link of a rollable display device may be improved.

According to at least one of the embodiments of the present disclosure, a structure in which a flexible display panel is uniformly wound around and unwound from a roller may be provided.

Further scope of applicability of the present disclosure will become apparent from the following detailed description. However, it should be understood that the detailed description and specific embodiments such as preferred embodiments of the present disclosure are given by way of example only, since various changes and modifications within the spirit and scope of the present disclosure may be clearly understood by those skilled in the art.

DESCRIPTION OF DRAWINGS

FIGS. 1 to 69 are diagrams illustrating examples of a display device according to embodiments of the present disclosure.

MODE FOR INVENTION

Figure 2:
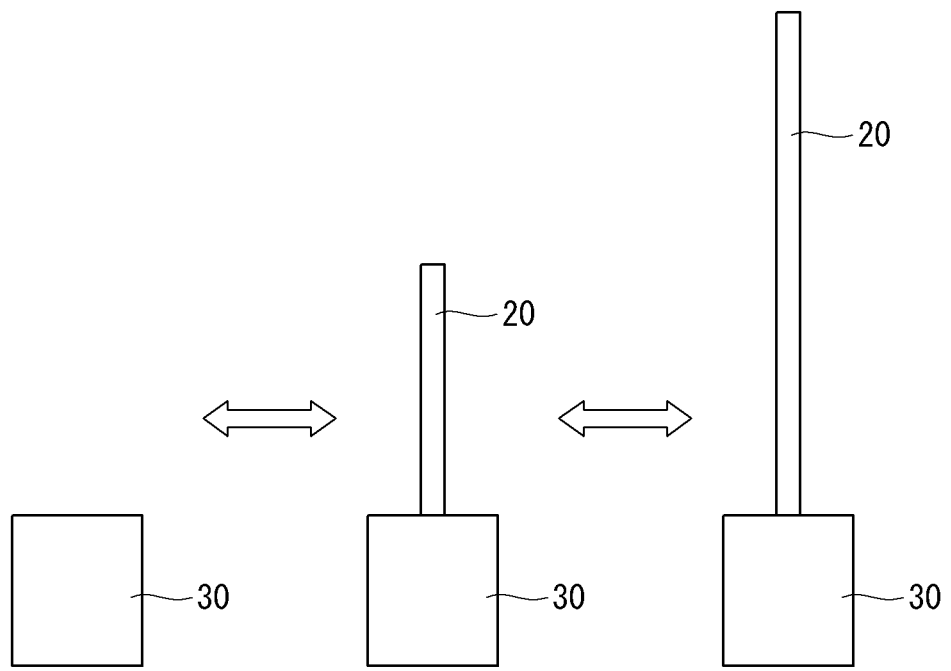

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In general, suffixes such as "module" and "unit" may be used to refer to elements or components. Use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to assist in easy understanding of various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another.

It will be understood that when an element is referred to as being "connected with" another element, there may be intervening elements present. In contrast, it will be understood that when an element is referred to as being "directly connected with" another element, there are no intervening elements present.

A singular representation may include a plural representation unless context clearly indicates otherwise.

In the following description, even if the embodiment is described with reference to specific drawings, if necessary, reference numerals not appearing in the specific drawings may be referred to, and reference numerals not appearing in the specific drawings are used in a case where the above reference numerals appear in the other figures.

Referring to FIG. 1, a display device 100 may include a display unit 20 and a housing 30. The housing 30 may have an internal space. At least a portion of the display unit 20 may be located inside the housing 30. At least a portion of the display unit 20 may be located outside the housing 30. The display unit 20 may display a screen.

A direction parallel to the length direction of the housing 30 may be referred to as a first direction DR1, a +x axis direction, a −x axis direction, a left direction, or a right direction. A direction in which the display unit 20 displays a screen may be referred to as a +z axis, a front side direction, or a forward direction. A direction opposite to the direction in which the display unit 20 displays a screen may be referred to as a −z axis, a rear side direction, or a rear. A third direction DR3 may be parallel to a +z axis direction or a −z axis direction. A direction parallel to a height direction of the display device 100 may be referred to as a second direction DR2, a +y axis direction, a −y axis direction, an upper direction, or a lower direction.

A third direction DR3 may be a direction perpendicular to the first direction DR1 and/or the second direction DR2. The first direction DR1 and the second direction DR2 may be collectively referred to as a horizontal direction. In addition, the third direction DR3 may be referred to as a vertical direction. The left-right direction LR may be parallel to the first direction DR1, and the up-down direction UD may be parallel to the second direction DR2.

Referring to FIG. 2, the entire display unit 20 may be located inside the housing 30. At least a portion of the display unit 20 may be located outside the housing 30. The extent to which the display unit 20 is exposed to the outside of the housing 30 may be adjusted as necessary.

Figure 3:
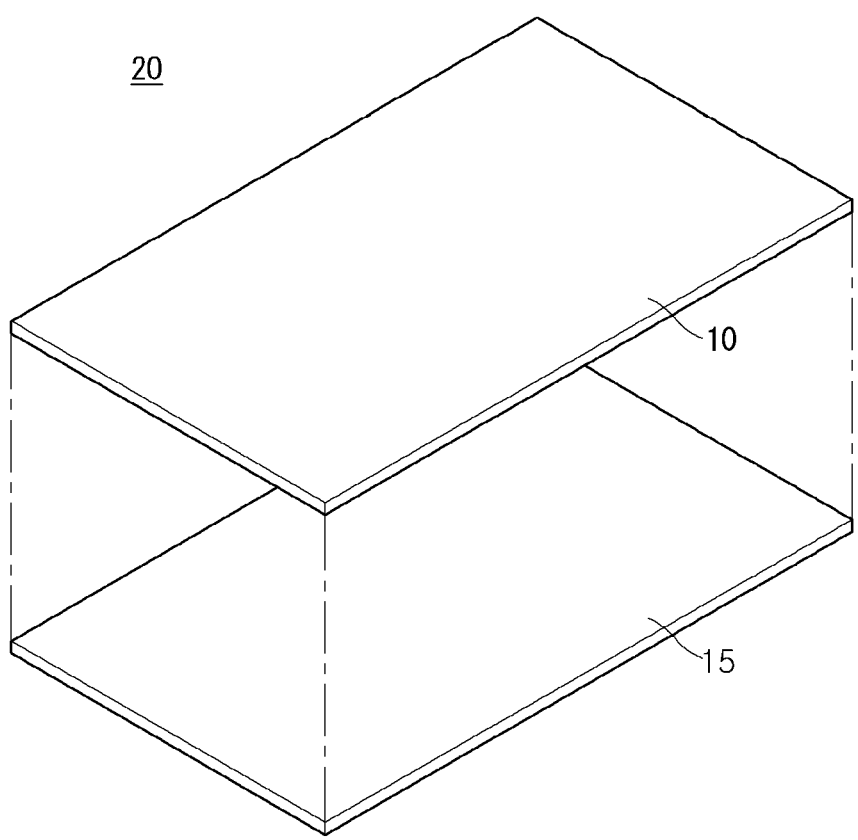

Referring to FIG. 3, the display unit 20 may include a display panel 10 and a plate 15. The display panel 10 may be flexible. For example, the display panel 10 may be an organic light emitting display (OLED).

The display panel 10 may have a front surface for displaying an image. The display panel 10 may have a rear surface opposite to the front surface. The front surface of the display panel 10 may be covered with a light-transmitting material. For example, the light-transmitting material may be a synthetic resin or a film.

The plate 15 may be coupled, fastened, or attached to the rear surface of the display panel 10. The plate 15 may include a metal material. The plate 15 may be referred to as a module cover 15, a cover 15, a display panel cover 15, a panel cover 15, or an apron 15.

Figure 4:
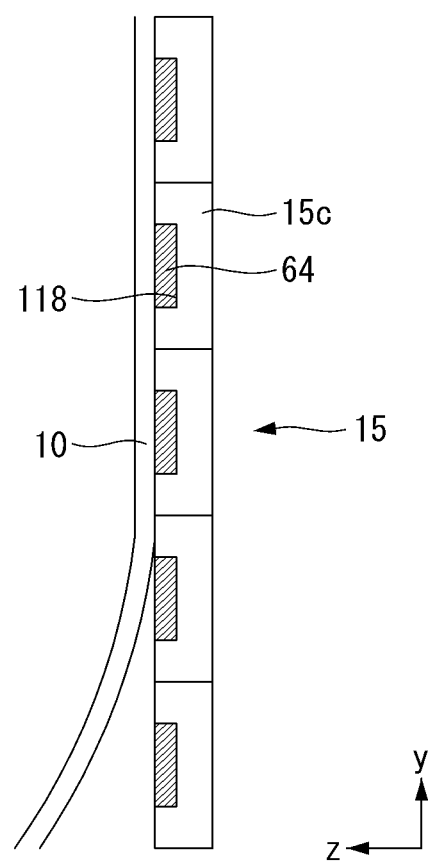

Referring to FIG. 4, the plate 15 may include a plurality of segments 15c. A magnet 64 may be located inside a recess 118 of the segment 15c. The recess 118 may be located on a surface of the segment 15c facing the display panel 10. The recess 118 may be located in the front surface of each segment 15c. Since the magnet 64 is received inside the recess 118, the magnet 64 may not protrude out of the segment 15c. The display panel 10 may be flat without being crumpled even when it comes into contact with the segment 15c.

Figure 5:
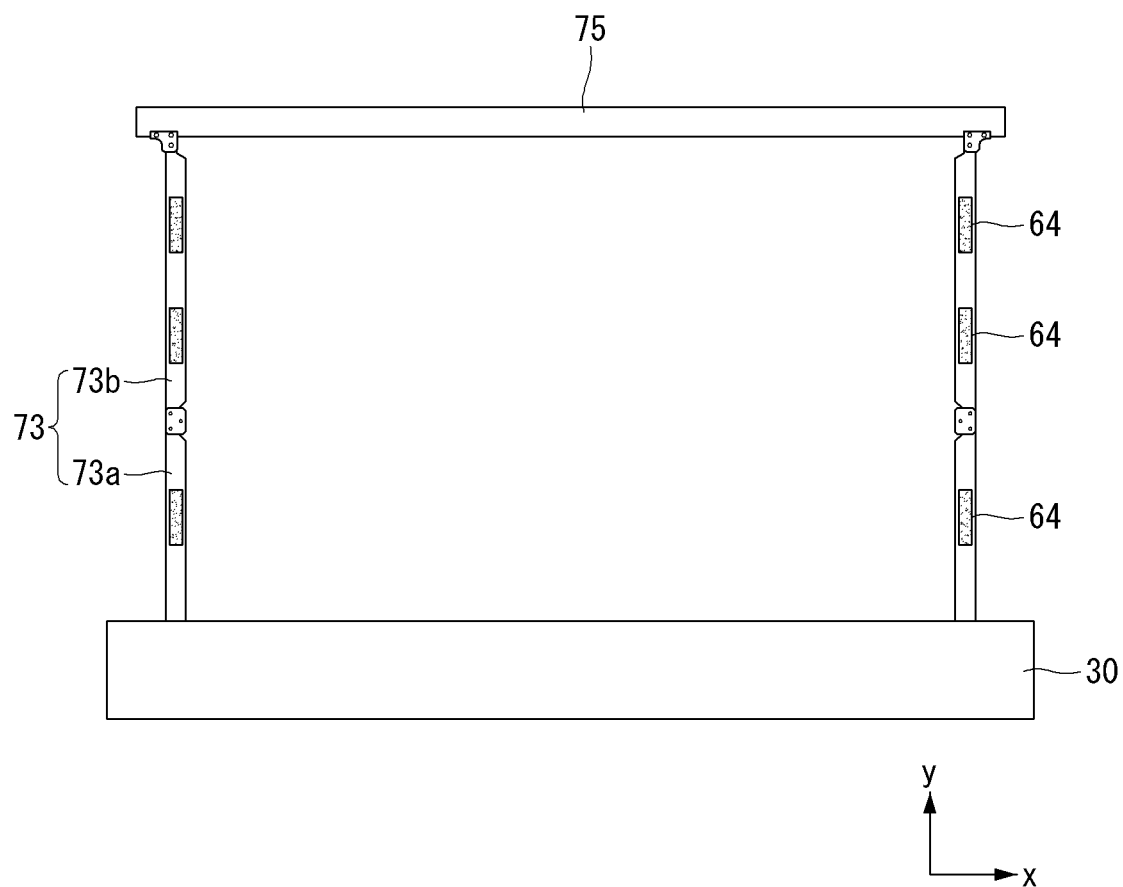

Referring to FIG. 5, a plurality of magnets 64 may be located on a link 73. For example, at least one magnet 64 may be located on a first arm 73a and at least one magnet 64 may be located on a second arm 73b. A plurality of magnets 64 may be spaced apart from each other.

Figure 6:
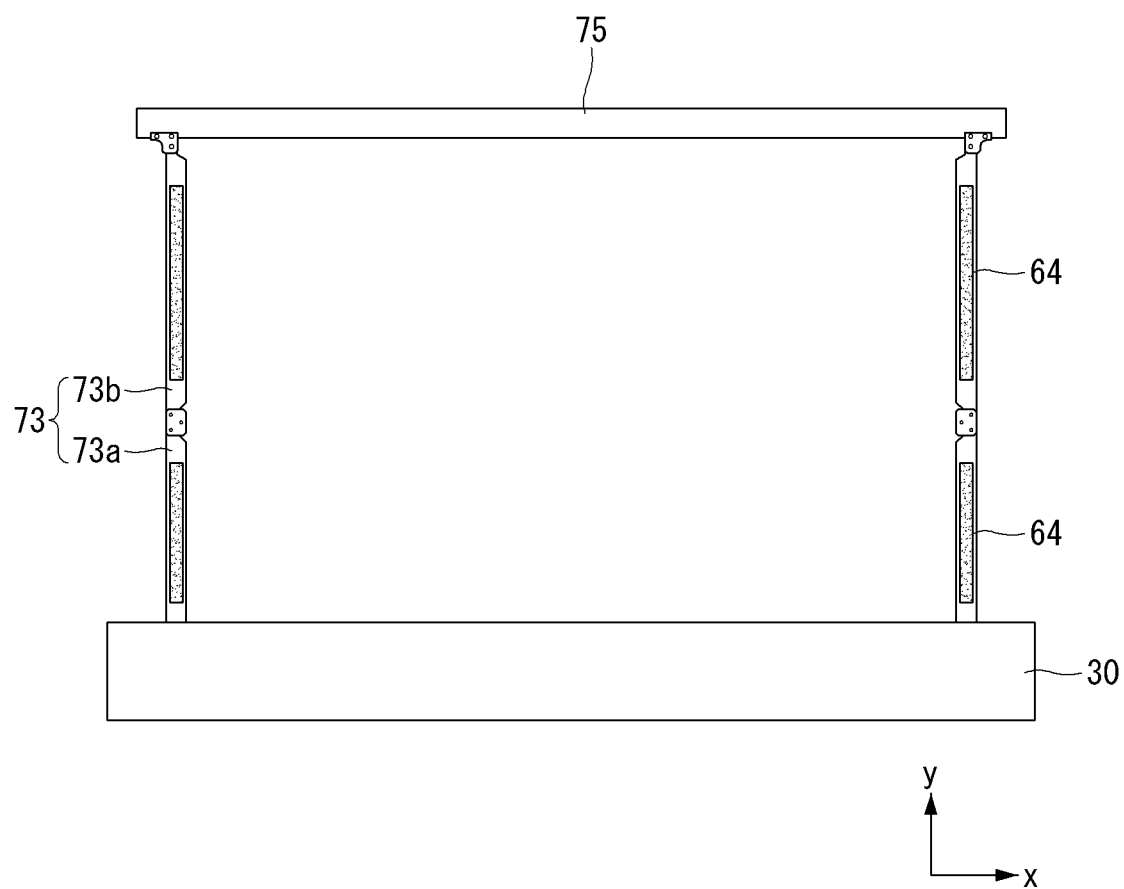

Referring to FIG. 6, one magnet 64 may be located on each of the first arm 73a and the second arm 73b. The magnet 64 may have a shape extending long in the direction of the long side of the first arm 73a and the second arm 73b. Since the magnet 64 has a shape extending long in the direction of the long side of the first arm 73a and the second arm 73b, the area of a portion where the link 73 comes into close contact with the display panel and the module cover may be increased. Accordingly, adhesion between the link 73 and the display panel and the module cover may be strengthened.

Figure 7:
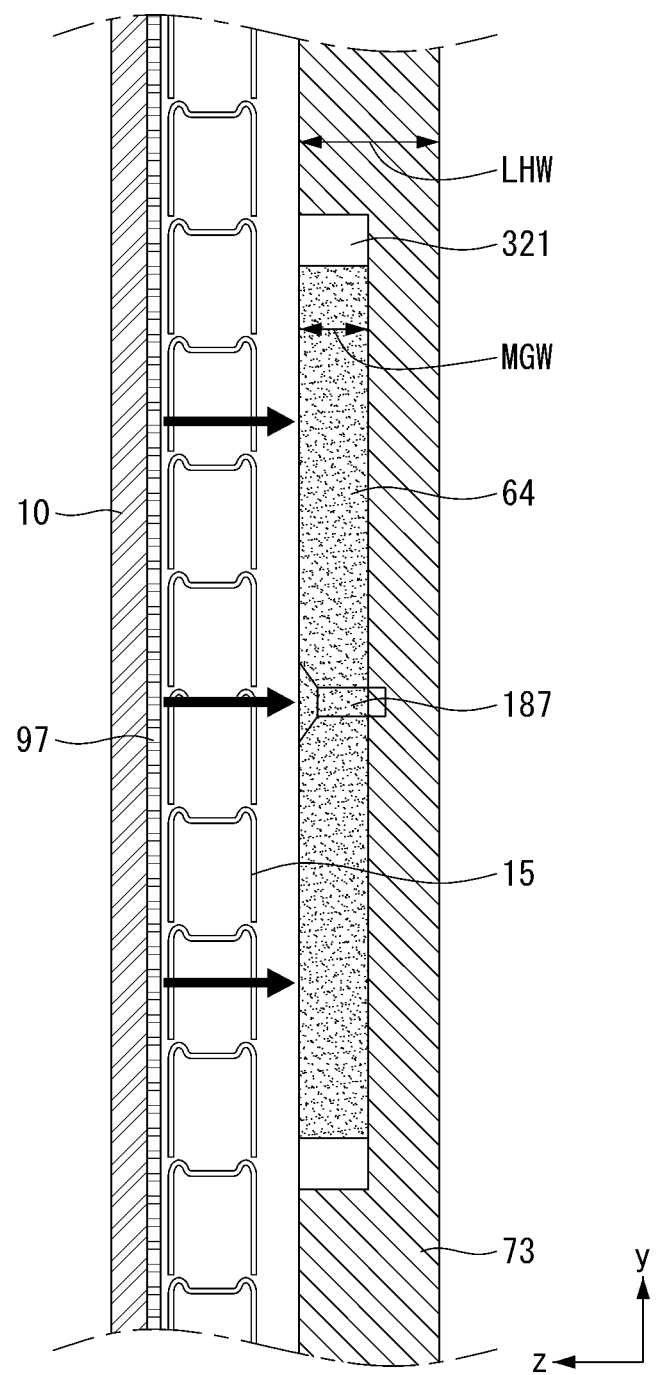

Referring to FIG. 7, the magnet 64 may be located in a recessed portion 321 formed on the link 73. The recessed portion 321 may have a shape recessed toward the inside of the link 73. The magnet 64 may be coupled to the link 73 through at least one screw 187.

A width LHW by which the recessed portion 321 is recessed to the inner side of link 73 may be equal to or larger than a thickness MGW of the magnet 64. If the thickness MGW of the magnet 64 is larger than the width LHW of the recessed portion 321, the display panel 10 and the module cover 15 may not come into close contact with the link 73. In this case, the display panel 10 may be wrinkled or not flat.

A panel protection portion 97 may be located on the rear surface of the display panel 10. The panel protection portion 97 can prevent the display panel 10 from being damaged due to friction with the module cover 15. The panel protection portion 97 may include a metal material. The panel protection portion 97 may have a very thin thickness. For example, the panel protection portion 97 may have a thickness of about 0.1 mm.

Since the panel protection portion 97 includes a metal material, mutual attraction with the magnet 64 may act. Accordingly, the module cover 15 located between the panel protection portion 97 and the link 73 may be in close contact with the magnet 64 even if it does not contain a metal material.

Figure 8:
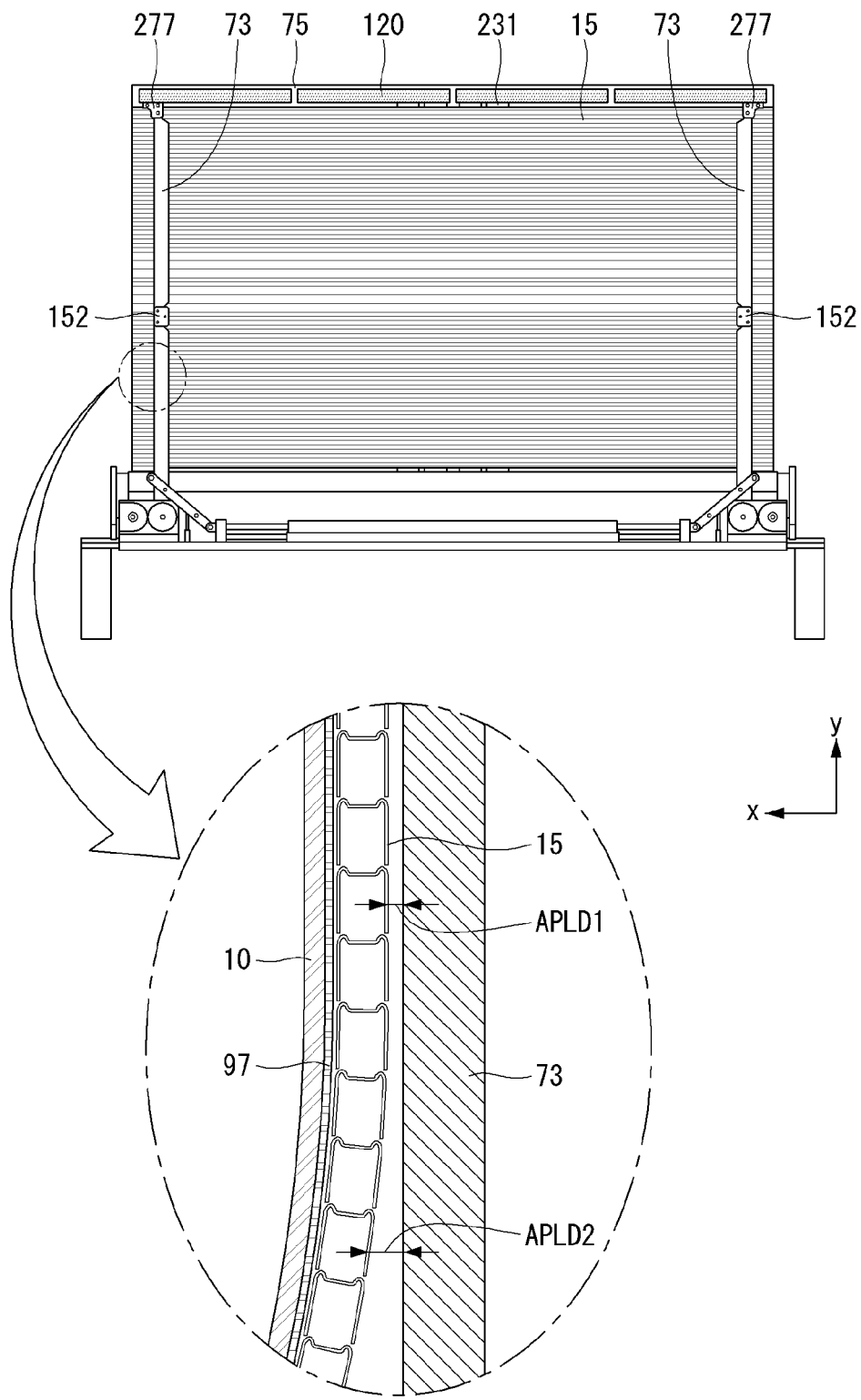
Figure 15:
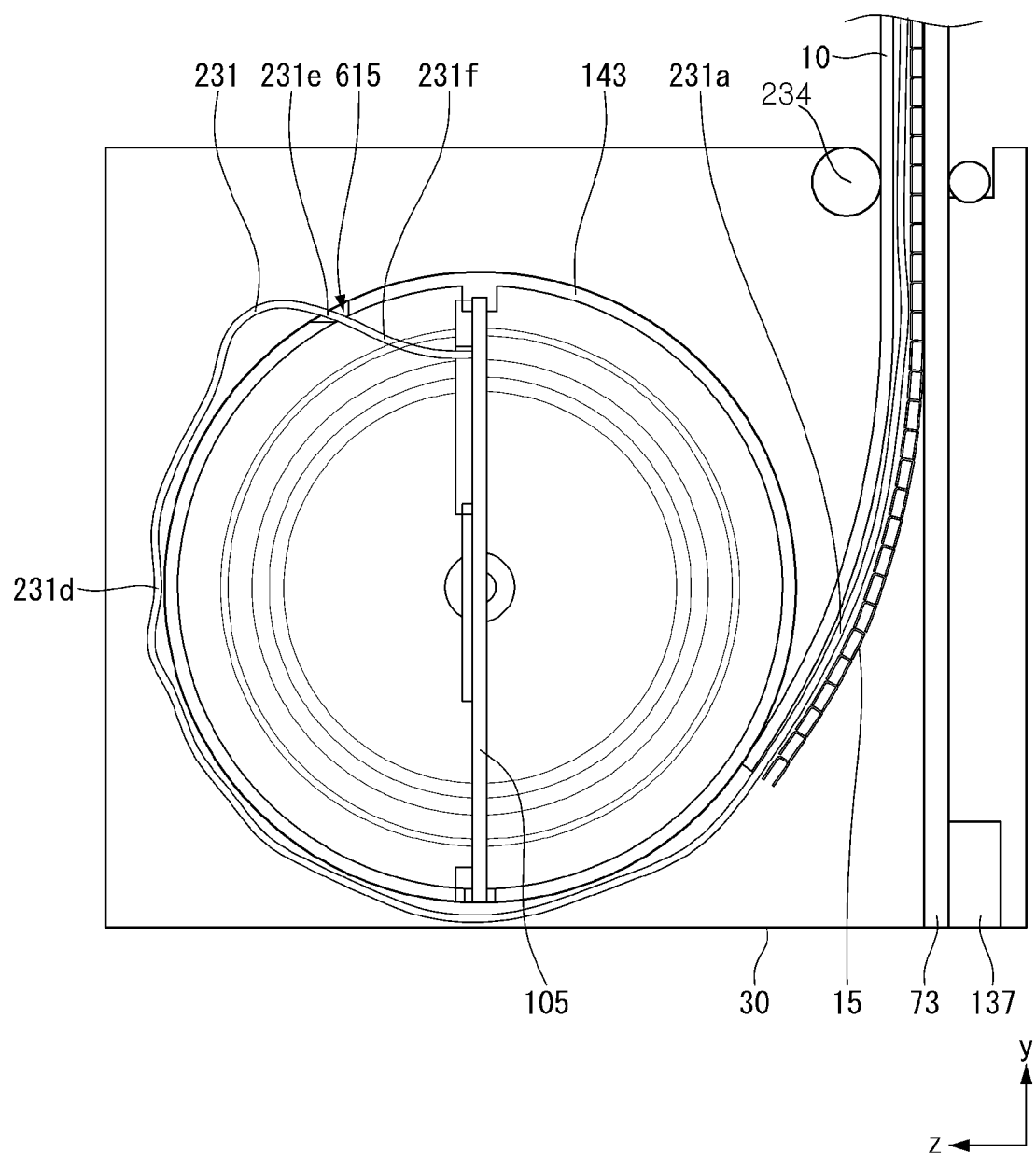

Referring to FIG. 8, the module cover 15 may be in close contact with the link 73 by an upper bar 75 in an upper side and a lower guide bar 234 in a lower side (see FIG. 15). A portion of the link 73 between the upper bar 75 and the guide bar 234 may not come into close contact with the module cover 15. Alternatively, the center of the link 73 may not come into close contact with the module cover 15. A central portion of the link 73 may be near an arm joint 152. In this case, the distance APRD1, APLD2 between the module cover 15 and the link 73 may not be constant. In this case, the display panel 10 may be bent or crooked.

Figure 9:
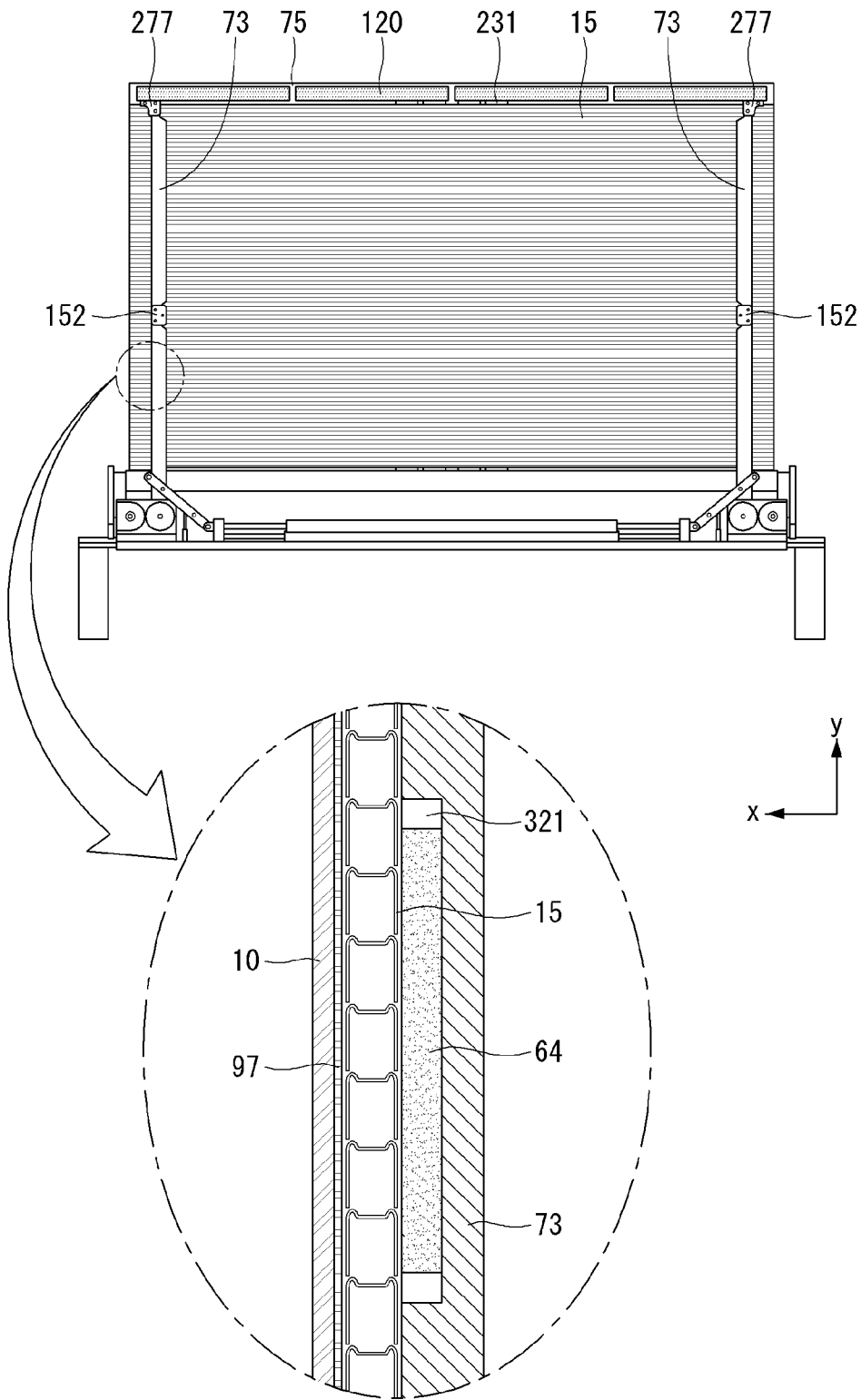

Referring to FIG. 9, when the magnet 64 is located on the recessed portion 321 of the link 73, the magnet 64 attracts the panel protection portion 97. Therefore, the module cover 15 may also be in close contact with the magnet 64 at the same time. That is, the center of the link 73 may be in close contact with the module cover 15.

Referring to FIG. 10, a bead 136 may be formed on the upper surface of a segment 15b. The bead 136 may be recessed to the inner side of the segment 15b. The bead 136 may be recessed in the −y axis direction. For example, the bead 136 may be formed by pressing the segment 15b. A plurality of beads 136 may be formed on the segment 15b. A plurality of beads 136 may be spaced apart from each other. The bead 136 may enhance the rigidity of segment 15b. The bead 136 may prevent the shape of the segment 15b from being deformed from an external impact.

Figure 11:
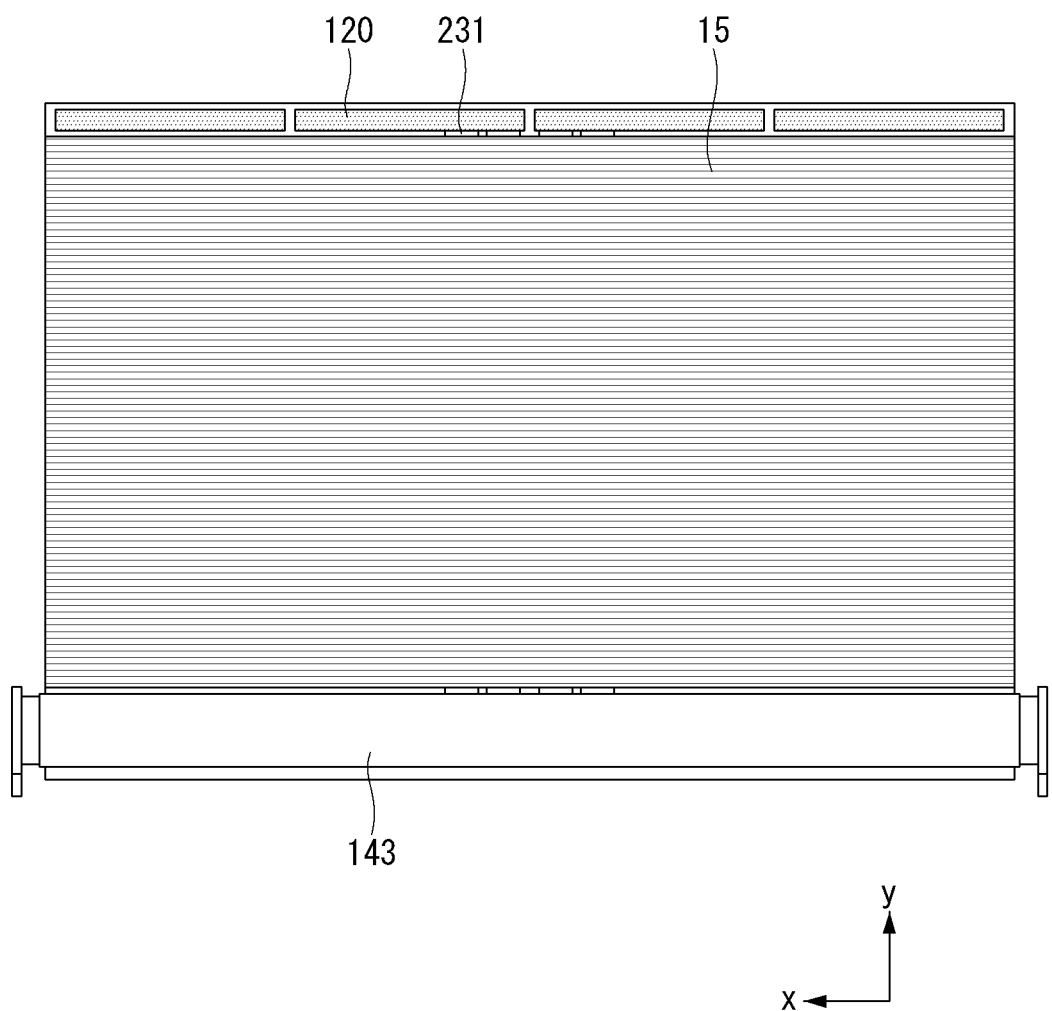

Referring to FIG. 11, a source PCB 120 may be located in the upper side of the module cover 15. When the source PCB 120 is rolled up or down, its location may change along with the movement of the module cover 15. A FFC cable 231 may be located in the center of the module cover 15 based on a first direction. The FFC cables 231 may be located in both ends of the module cover 15 based on the first direction.

Referring to FIG. 12, the segment 15d may include a recessed portion 425 recessed in the −z-axis direction. The recessed portion 425 may form a space between the display panel 10 and the module cover 15. The FFC cable 231 may be accommodated in a space formed by the recessed portion 425. In addition, the recessed portion 425 may improve the rigidity of the segment 15d.

The bead 136 may be located on the segment 15d excluding a portion where the recessed portion 425 is located. Since the thickness of the segment 15d in a third direction is thin at the portion where the recessed portion 425 is located, the bead 136 may not be located at the portion where the recessed portion 425 is located.

Referring to FIG. 13, a segment 15e may have a penetrating portion 437 located in the center of the segment 15e in the first direction. The penetrating portion 437 may penetrate the center of the segment 15e in the second direction. That is, the penetrating portion 437 may be a hole located inside the segment 15e. The penetrating portion 437 may be a portion where the FFC cable 231 is located. Since the penetrating portion 437 is formed inside the segment 15e, the thickness of the segment 15e can be reduced compared to a case where the FFC cable 231 is located in the recessed portion 425.

The bead 136 may be located on the segment 15e excluding a portion where the penetrating portion 437 is located. Since the thickness of the segment 15e in the third direction is thin at a portion where the penetrating portion 437 is located, the bead 136 may not be located in the portion where the penetrating portion 437 is located.

Figure 14:
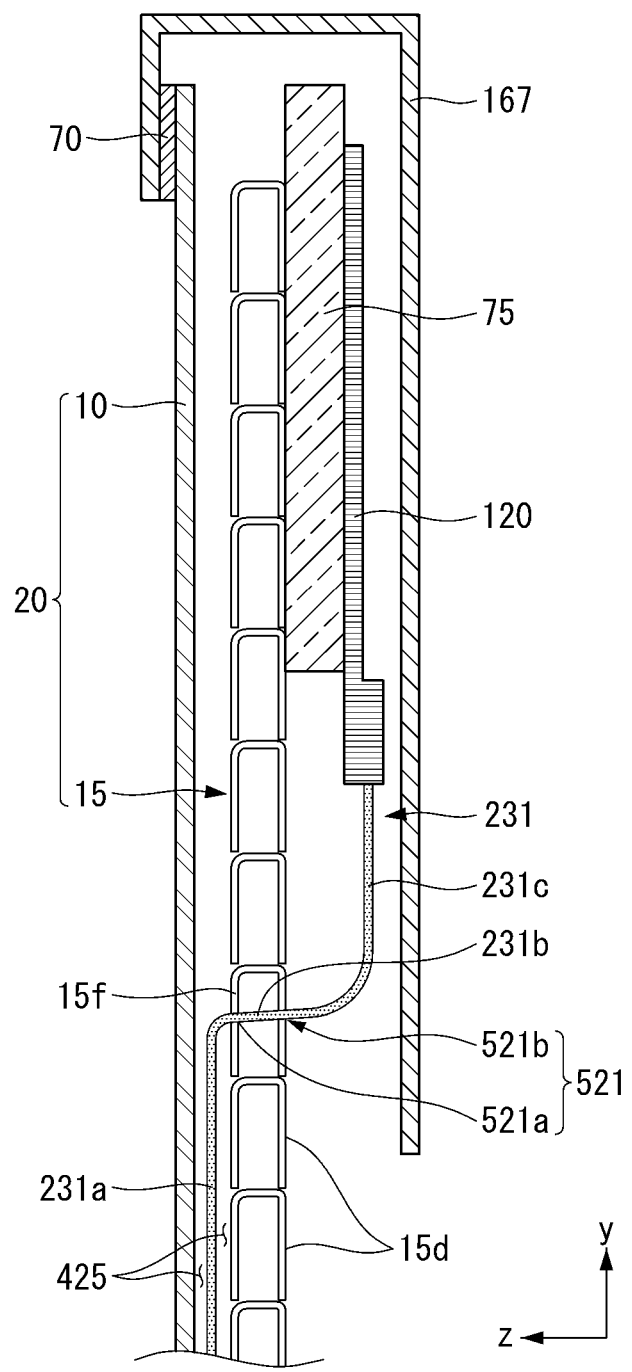

Referring to FIG. 14, a top case 167 may cover the source PCB 120 and the upper bar 75 as well as the display panel 10 and the module cover 15. One surface of the upper bar 75 may be coupled to the rear surface of the module cover 15 and the other surface may be coupled to the source PCB 120. The upper bar 75 may be fixed to the module cover to support the source PCB 120.

The lower end of the FFC cable 231 may be connected to a timing controller board 105 (see FIG. 15) inside a panel roller 143 (see FIG. 15). The FFC cable 231 may be wound around or unwound from the panel roller 143 together with the display unit 20.

A part of the FFC cable 231 may be located between the display panel 10 and the module cover 15. A portion of the FFC cable 231 located between the display panel 10 and the module cover 15 may be referred to as a first portion 231a. The first portion 231a may be located in the recessed portion 425 formed by a plurality of segments 15d. Alternatively, the first portion 231a may be accommodated in the recessed portion 425 formed by the plurality of segments 15d.

A part of FFC cable 231 may penetrate a segment 15f. A portion of the FFC cable 231 penetrating the segment 15f may be referred to as a second portion 231b. The segment 15f may include a first hole 521a formed on the front surface and a second hole 521b formed on the rear surface. The first hole 521a and the second hole 521b may be interconnected to form one hole 521. The hole 521 may penetrate the segment 15f in the third direction. The second portion 231b may penetrate the hole 521. The hole 521 may also be referred to as a connection hole 521.

The upper end of the FFC cable 231 may be electrically connected to the source PCB 120. A part of the FFC cable 231 may be located on the rear surface of the module cover 15. A portion of the FFC cable 231 located on the rear surface of the module cover 15 may be referred to as a third portion 231c. The third portion 231c may be electrically connected to the source PCB 120.

The third portion 231c may be covered by the top case 167. Accordingly, the third portion 231c may not be exposed to the outside.

Referring to FIG. 15, the FFC cable 231 may be connected to the timing controller board 105 mounted on the panel roller 143. A penetrating hole 615 may be formed on the panel roller 143, and the FFC cable 231 may be connected to the timing controller board 105 through the penetrating hole 615. The penetrating hole 615 may be located in one side of the panel roller 143 and may penetrate an outer circumferential portion of the panel roller 143. The FFC cable 231 may be connected to one side of the timing controller board 105 through the penetrating hole 615.

Even when the FFC cable 231 is located on the outer circumference of the panel roller 143, it can maintain connection with the timing controller board 105 due to the penetrating hole 615. Accordingly, the FFC cable 231 may rotate together with the panel roller 143 and not be twisted. A part of the FFC cable 231 may be wound around the panel roller 143. A portion of the FFC cable 231 wound around the panel roller 143 may be referred to as a fourth portion 231d. The fourth portion 231d may contact the outer circumferential surface of the panel roller 143.

A part of the FFC cable 231 may penetrate the penetrating hole 615. A portion of the FFC cable 231 penetrating the penetrating hole 615 may be referred to as a fifth portion 231e.

The lower end of the FFC cable 231 may be electrically connected to the timing controller board 105. A part of the FFC cable 231 may be located inside the panel roller 143. A portion of the FFC cable 231 located inside the panel roller 143 may be referred to as a sixth portion 231f. The sixth portion 231f may be electrically connected to the timing controller board 105.

Figure 16:
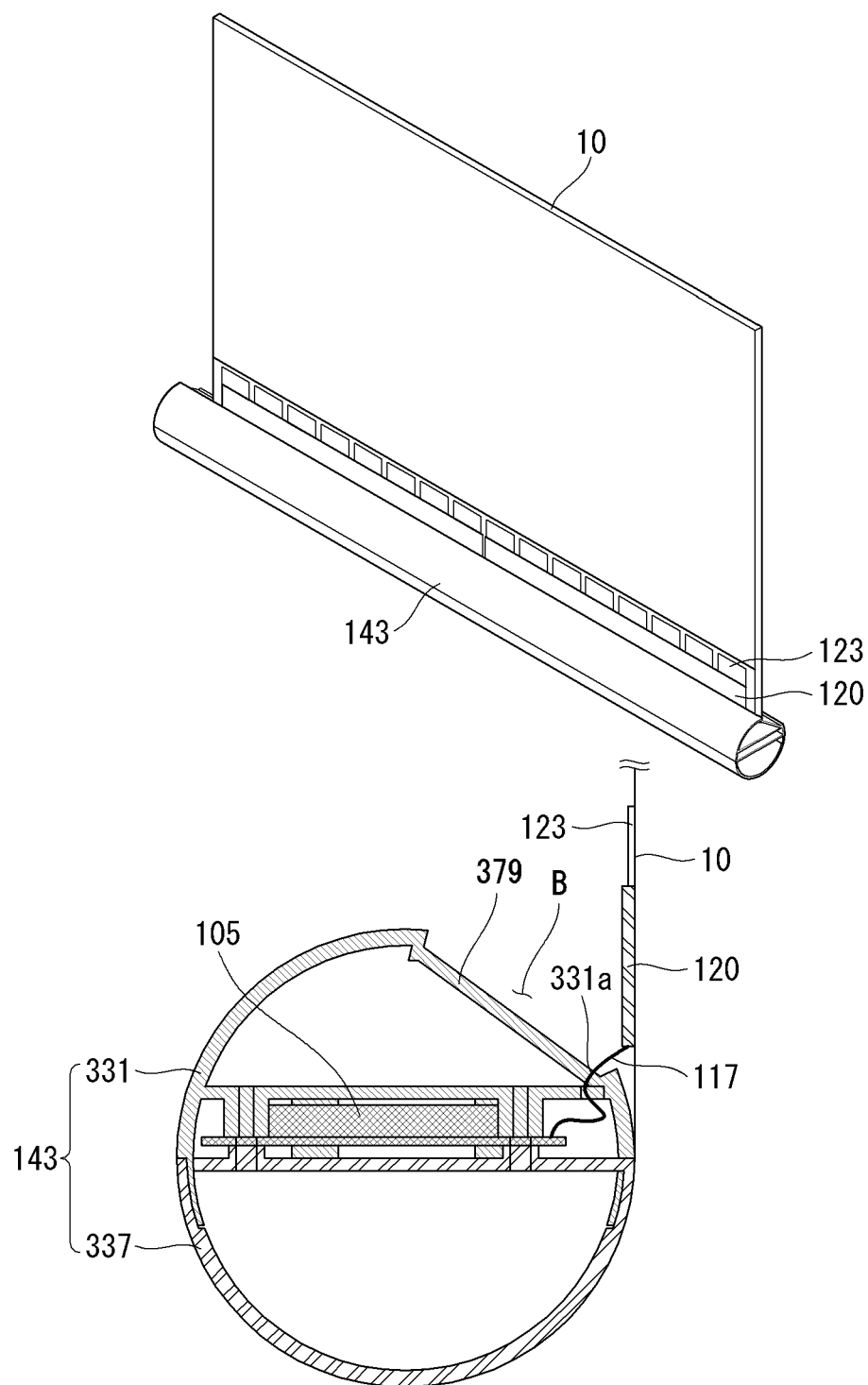

Referring to FIG. 16, the lower end of the display panel 10 may be connected to a roller 143. The display panel 10 may be wound around or unwound from the roller 143. A front surface of the display panel 10 may be coupled to a plurality of source PCBs 120. The plurality of source PCBs 120 may be spaced apart from each other.

A source Chip On Film (COF) 123 may connect the display panel 10 and the source PCB 120. The source COF 123 may be located on the front surface of the display panel 10. The roller 143 may include a first part 331 and a second part 337. The first part 331 and the second part 337 may be fastened by a screw. The timing controller board 105 may be mounted inside the roller 143.

The source PCB 120 may be electrically connected to the timing controller board 105. The timing controller board 105 may transfer digital video data and a timing control signal to the source PCB 120.

The cable 117 may electrically connect the source PCB 120 and the timing controller board 105. For example, the cable 117 may be a flexible flat cable (FFC). The cable 117 may penetrate a hole 331a. The hole 331a may be formed in a seating portion 379 or the first part 331. The cable 117 may be located between the display panel 10 and the second part 337.

The seating portion 379 may be formed on the outer circumference of the first part 331. The seating portion 379 may be formed by stepping a part of the outer circumference of the first part 331. The seating portion 379 may form a space B. When the display unit 20 is wound around the roller 143, the source PCB 120 may be accommodated in the seating portion 379. Since the source PCB 120 is accommodated in the seating portion 379, it may not be bent or crooked, and durability may be improved.

The cable 117 may electrically connect the timing controller board 105 and the source PCB 120.

Figure 17:
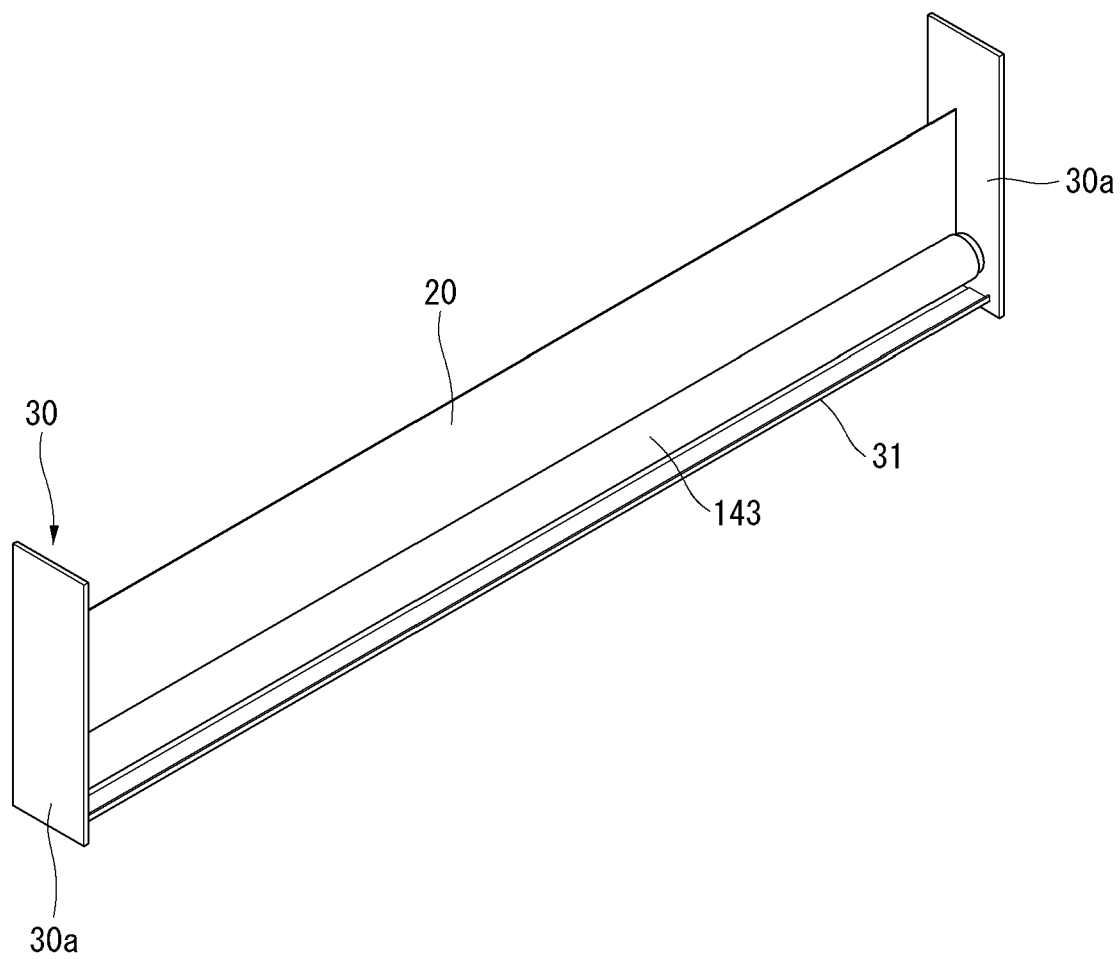

Referring to FIG. 17, the roller 143 around which the display unit 20 is wound may be installed in a first base 31. A first base 31 may be a lower surface of the housing 30. The roller 143 may extend long along the longitudinal direction of the housing 30. The first base 31 may be connected to the side surface 30a of the housing 30.

Figure 18:
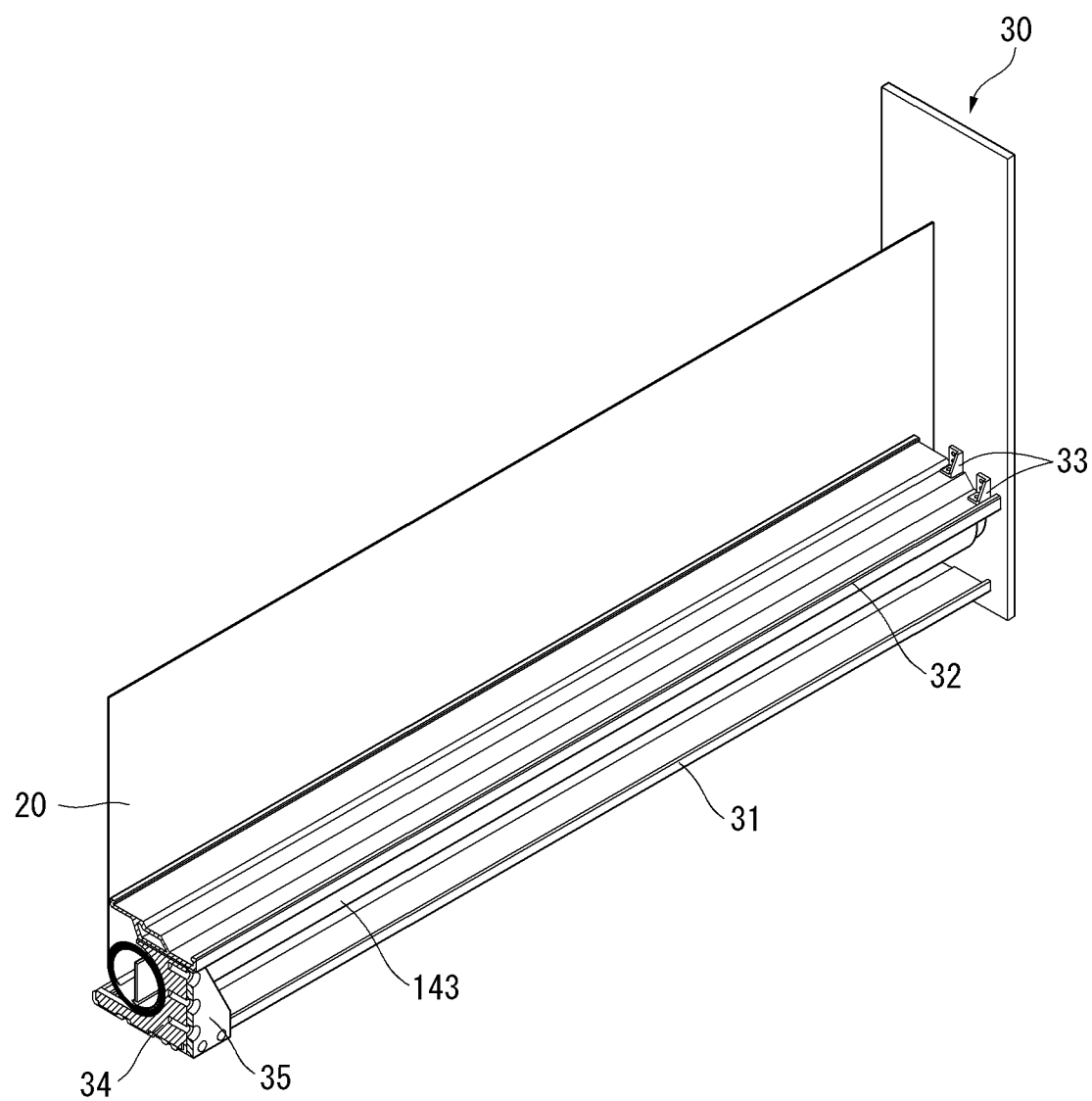
Figure 19:
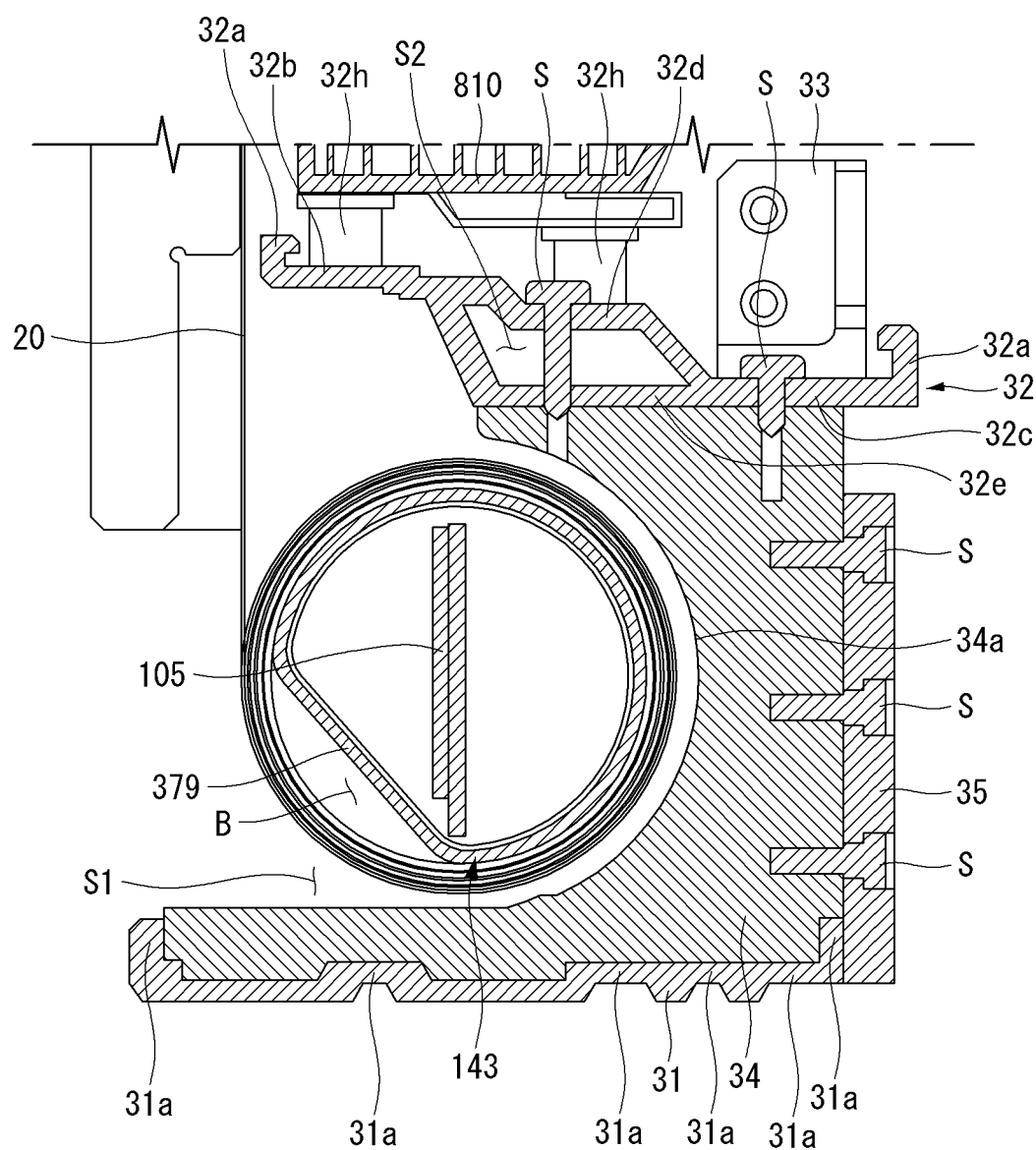

Referring to FIGS. 18 and 19, a beam 31a may be formed in the first base 31. The beam 31a may improve a bending or torsional rigidity of the first base 31. Many components can be installed in the first base 31, and the first base 31 can receive a large load. As rigidity of the first base 31 is improved, sagging due to a load may be prevented. For example, the beam 31a may be formed by a press process.

A second base 32 may be spaced apart from the upper side of the first base 31. A space S1 may be formed between the first base 31 and the second base 32. The roller 143 around which the display unit 20 is wound may be accommodated in the space S1. The roller 143 may be located between the first base 31 and the second base 32.

The second base 32 may be connected to the side surface 30a of the housing 30. A bracket 33 may be fastened to the upper surface of the first base 31. The bracket 33 may be fastened to the side surface 30a of the housing 30.

The beam 32a may be formed in second base 32. The beam 32a can improve the bending or torsional rigidity of the second base 32. For example, the beam 32a may be formed by a press process.

The third part 32d may be connected to the first part 32b and the second part 32c. The fourth part 32e may be connected to the first part 32b and the second part 32c. A space S2 may be formed between the third part 32d and the fourth part 32e. Accordingly, the bending or torsional rigidity of the second base 32 may be improved. The third part 32d may be referred to as a reinforcing rib 32d or a rib 32d. The fourth part 32e may be referred to as a reinforcing rib 32e or a rib 32e.

Many components can be installed in the second base 32, and the second base 32 may receive a large load. As rigidity of the second base 32 is improved, sagging due to a load may be prevented. A first reinforcing plate 34 may be located between the first base 31 and the second base 32. The first reinforcing plate 34 and the second base 32 may be fastened by a screw.

The first reinforcing plate 34 may support the second base 32. The first reinforcing plate 34 may prevent the second base 32 from sagging. The first reinforcing plate 34 may be located in the central portion of the first base 31 or the central portion of the second base 32. The first reinforcing plate 34 may include a curved portion 34a. The curved portion 34a may be formed along the roller 143. The curved portion 34a may not contact the roller 143 or the display unit 20 wound around the roller 143. The curved portion 34a may maintain a certain distance from the roller 143 so as not to interfere with the rotation of the roller 143.

The second reinforcing plate 35 may be fastened to the first base 31 and the first reinforcing plate 34. The second reinforcing plate 35 may support the first reinforcing plate 34. The second reinforcing plate 35 may be located in a rear of the first reinforcing plate 34. The second reinforcing plate 35 may be located in a rear of the first base 31. The second reinforcing plate 35 may be located perpendicular to the first base 31. The second reinforcing plate 35 may be fastened to the beam 31a of the first base 31. The second base 32 may face the front or rear surface of the housing 30.

Figure 20:
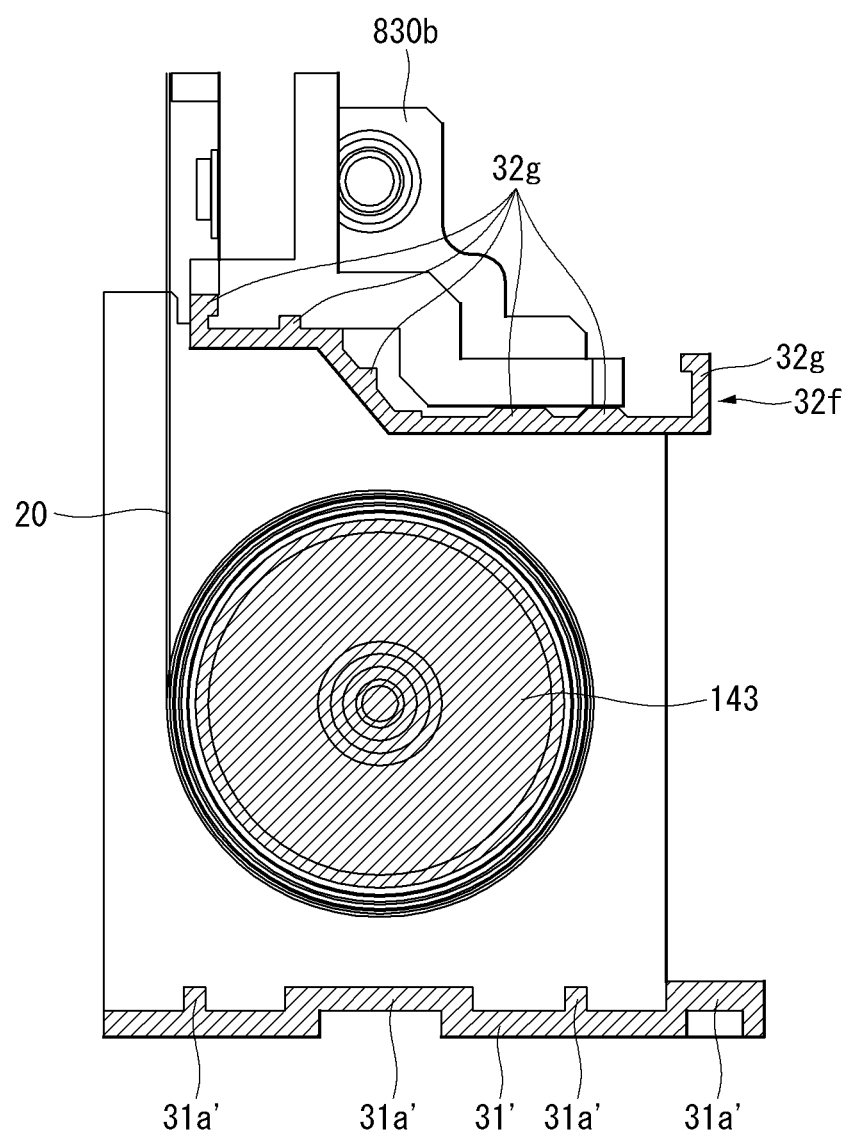

Referring to FIG. 20, a second base 32f may not form a space. When the load applied to the second base 32f is not large, the second base 32f may have sufficient rigidity by including a beam 32g. A first base 31' may include a beam 31a'.

Figure 21:
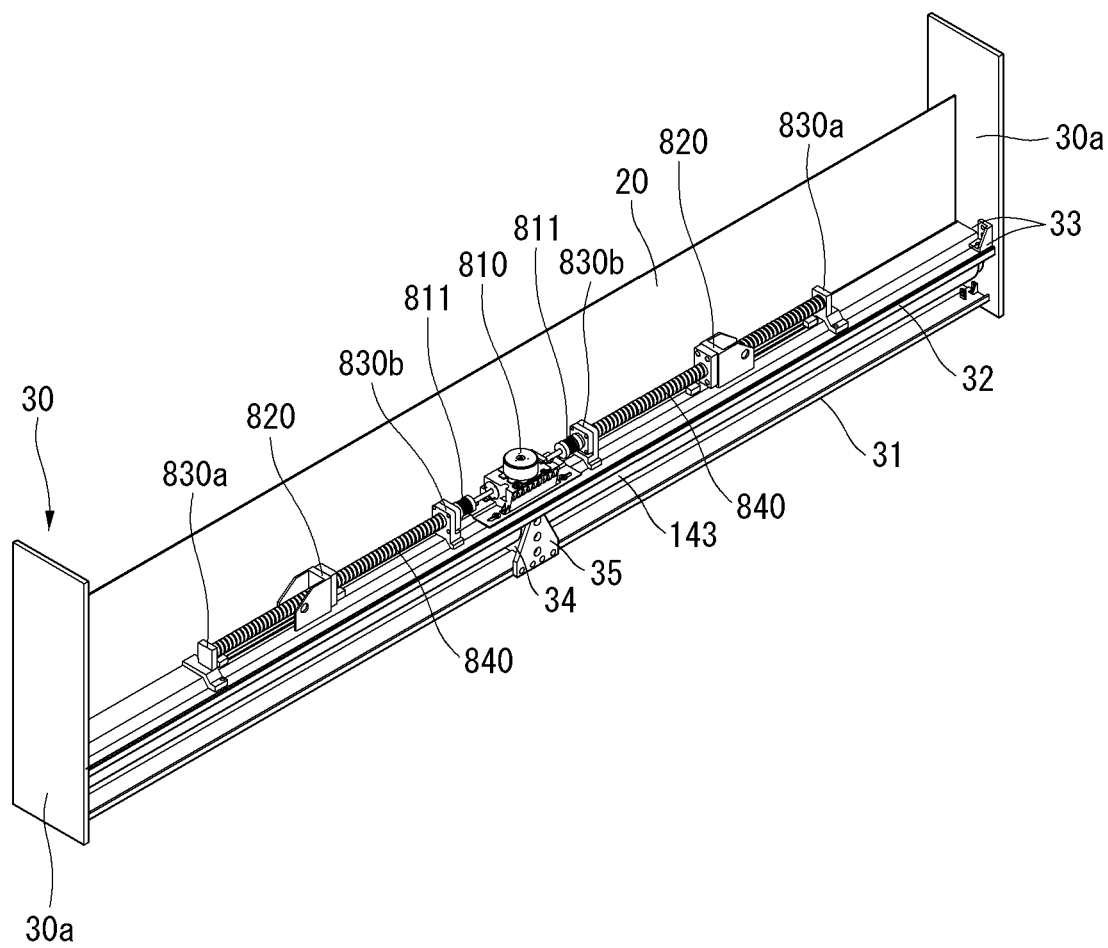
Figure 22:
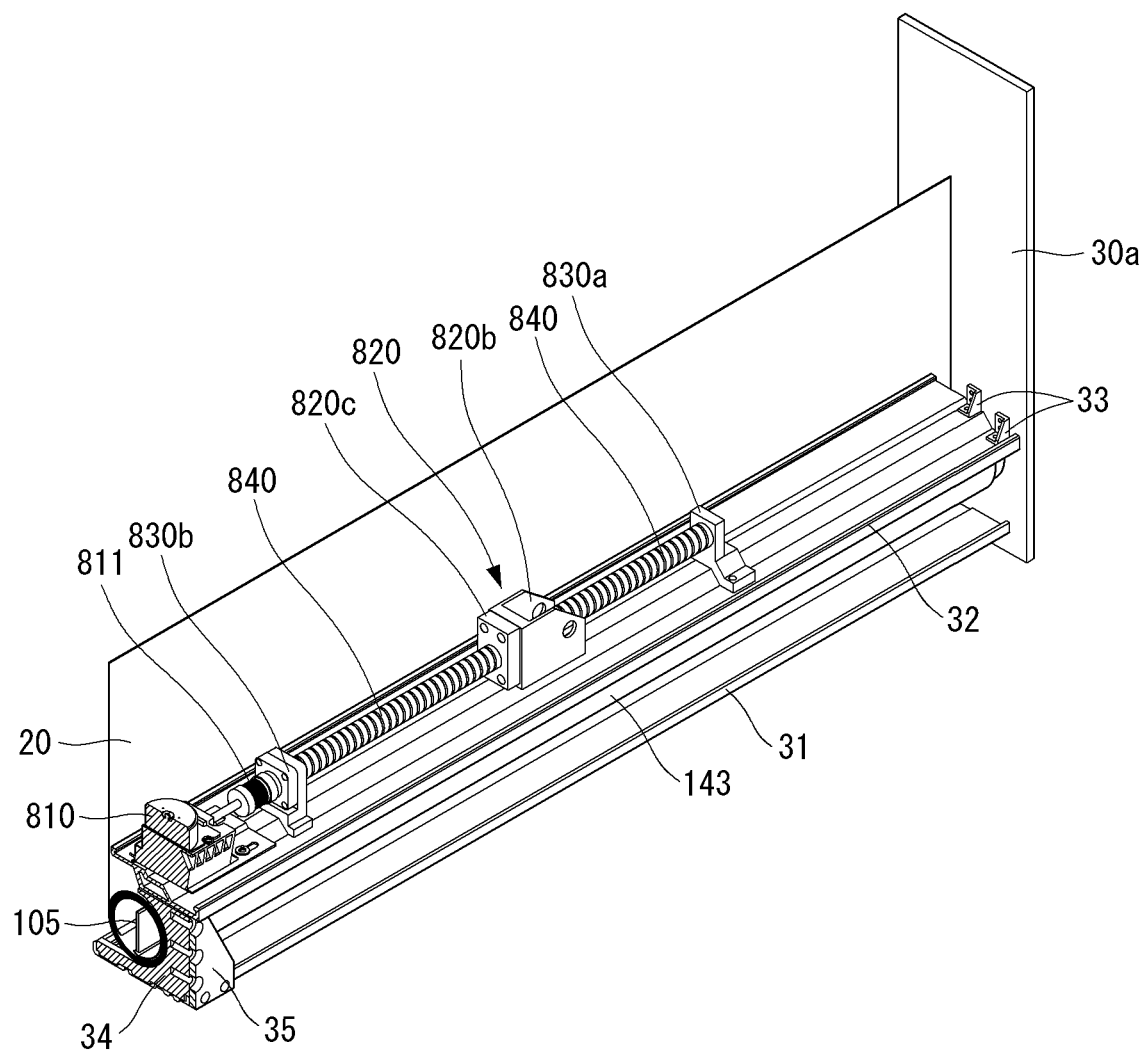

Referring to FIGS. 21 and 22, a motor assembly 810 may be installed in the second base 32. A driving shaft of the motor assembly 810 may be formed in both sides. A right driving shaft and a left driving shaft of the motor assembly 810 may rotate in the same direction. Alternatively, the right driving shaft and the left driving shaft of the motor assembly 810 may rotate in opposite directions.

The motor assembly 810 may include a plurality of motors. A plurality of motors may be connected in series with each other. The motor assembly 810 may output high torque by connecting a plurality of motors in series.

A lead screw 840 may be located in the left and right sides of the motor assembly 810, respectively. The motor assembly 810 may be connected to the lead screw 840. A coupling 811 may connect the lead screw 840 and the driving shaft of the motor assembly 810.

The lead screw 840 may be threaded along the longitudinal direction. The direction of the thread formed in the right lead screw 840 and the direction of the thread formed in the left lead screw 840 may be opposite to each other. The direction of the thread formed in the right lead screw 840 and the direction of the thread formed in the left lead screw 840 may be the same. Pitches of the left lead screw 840 and the right lead screw 840 may be the same.

The bearing 830a, 830b may be installed in the second base 32. The bearing 830a, 830b may support both sides of lead screw 840. The bearing 830a, 830b may include an inner bearing 830b located close to the motor assembly 810 and an outer bearing 830a located farther from the motor assembly 810. The lead screw 840 may stably rotate by the bearing 830a, 830b.

A slide 820 may be engaged with the lead screw 840. The slide 820 may move forward and rearward in the longitudinal direction of the lead screw 840 according to the rotation of the lead screw 840. The slide 820 may move between an outer bearing 830a and an inner bearing 830b. The slide 820 may be located in the left lead screw 840 and the right lead screw 840 respectively. The left slide 820 may be engaged with the left lead screw 840. The right slide 820 may be engaged with the right lead screw 840.

The left slide 820 and the right slide 820 may be located symmetrically with respect to the motor assembly 810. Due to the driving of the motor assembly 810, the left slide 820 and the right slide 820 may be moved farther away or closer by the same distance.

Figure 23:
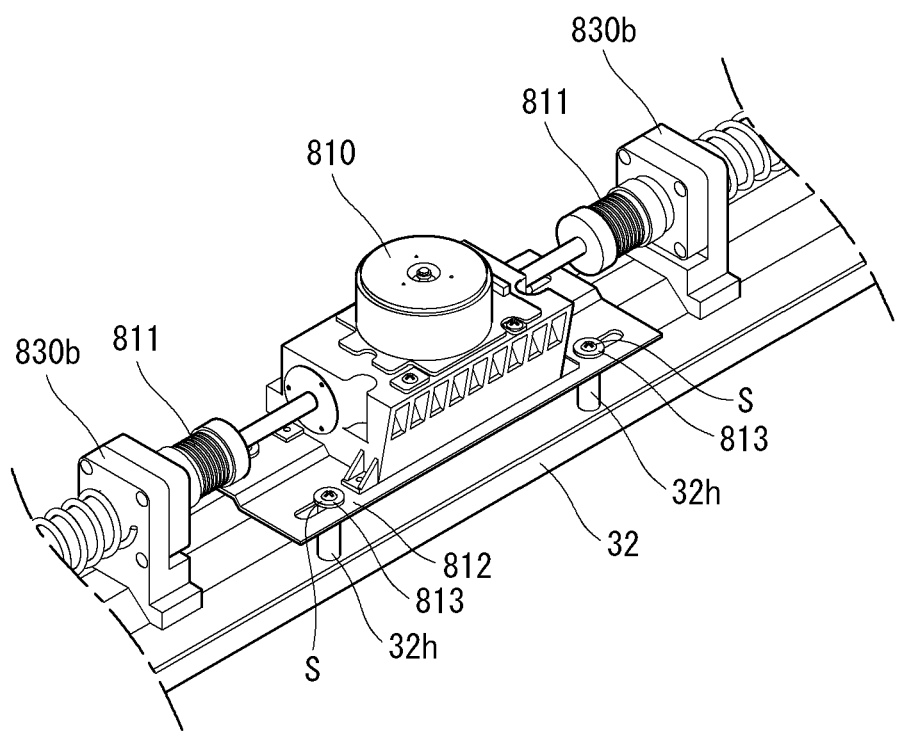

Referring to FIG. 23, the motor assembly 810 may include a plate 813. The plate 813 may be referred to as a mount plate 813 or a motor mount plate 813. A coupling portion 32h may be formed in the upper surface of the second base 32. The plate 813 may be fastened to the coupling portion 32h through a screw S. The motor assembly 810 may be spaced apart from the upper surface of the second base 32. A washer 813 may be located between the upper surface of the plate 813 and the screw S. The washer 813 may include a rubber material. The washer 813 may reduce vibration generated in the motor assembly 810. The washer 813 may improve driving stability of the display device 100.

Figure 24:
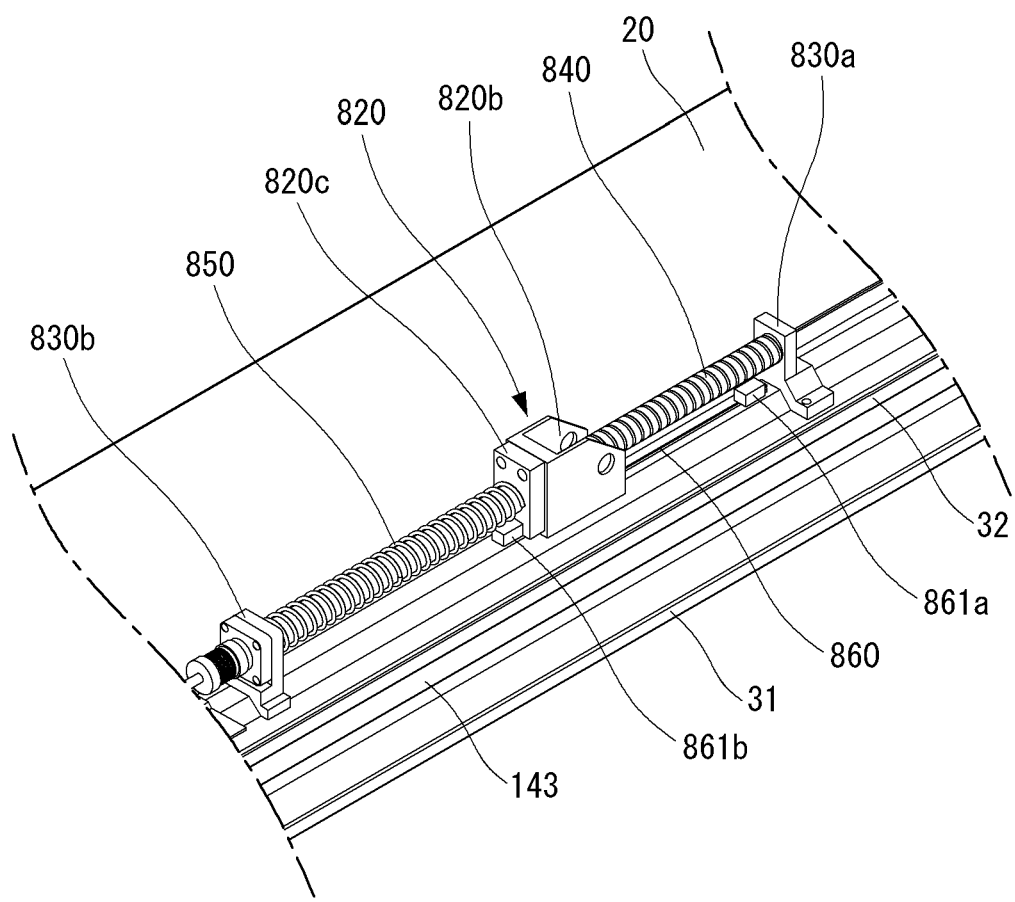

Referring to FIG. 24, a guide rail 860 may be installed in the second base 32. The guide rail 860 may be located parallel to the lead screw 840. The slide 820 may be engaged with the guide rail 860. A first stopper 861b may be located in one side of the guide rail 860, and the second stopper 861*a* may be located in the other side of the guide rail 860. The range in which the slide 820 can move may be restricted between the first stopper 861*b* and the second stopper 861*a*.

A spring 850 may surround the lead screw 840. The lead screw 840 may penetrate the spring 850. The spring 850 may be located between inner bearing 830*b* and the slide 820. One side of the spring 850 may come into contact with the inner bearing 830*b*, and the other side of the spring 850 may come into contact with the slide 820. The spring 850 may provide an elastic force to the slide 820.

When the slide 820 is caught by the first stopper 861*b*, the spring 850 may be maximally compressed. When the slide 820 is caught by the first stopper 861*b*, the length of the spring 850 may be minimal. When the slide 820 is caught by the first stopper 861*b*, the distance between the slide 820 and the inner bearing 830*b* may be minimal.

Figure 25:
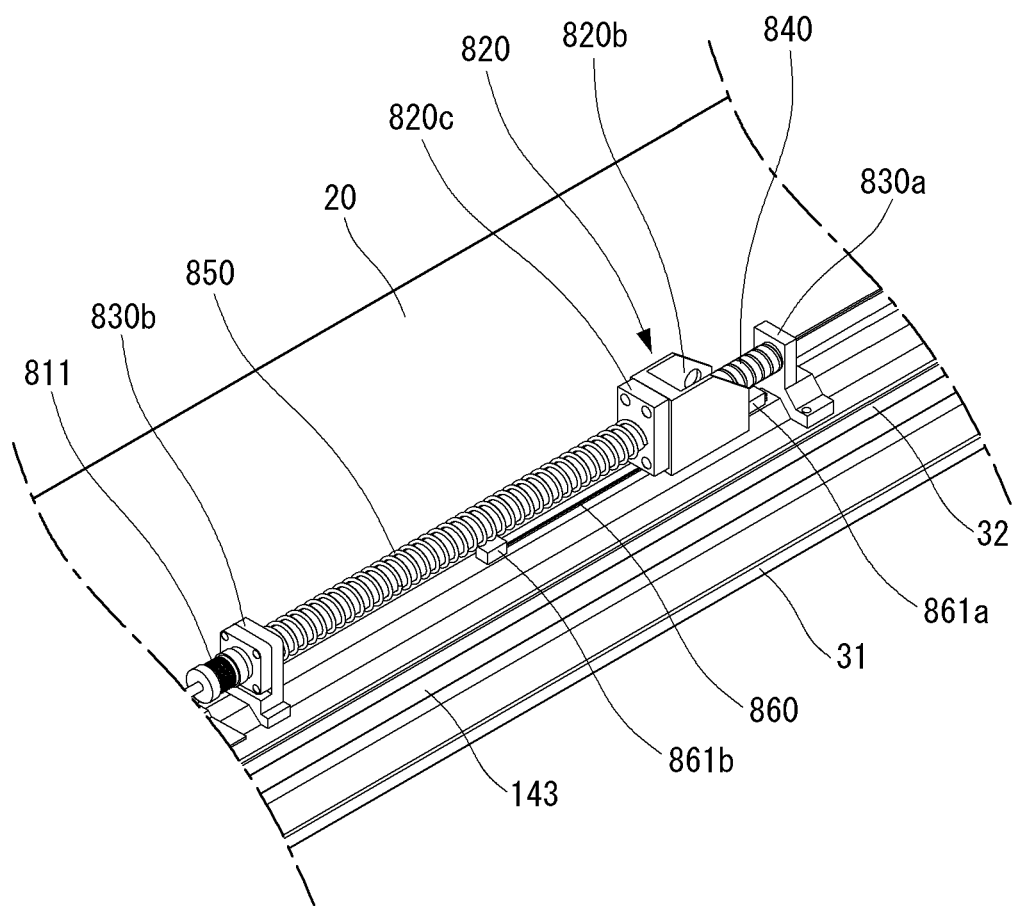

Referring to FIG. 25, when the slide 820 is caught by the second stopper 861*a*, the spring 850 may be maximally tensioned. When the slide 820 is caught by the second stopper 861*b*, the length of the spring 850 may be maximum. When the slide 820 is caught by the second stopper 861*a*, the distance between the slide 820 and the inner bearing 830*b* may be maximum.

Figure 26:
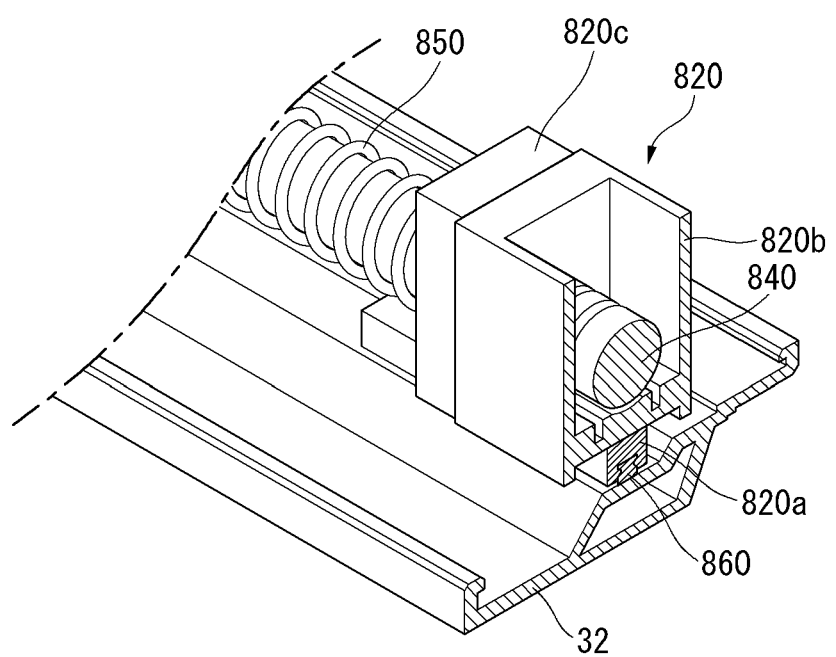

Referring to FIG. 26, the first part 820*a* may be engaged with the guide rail 860. The first part 820*a* may move along the guide rail 860. The movement of the first part 820*a* in the longitudinal direction of the guide rail 860 may be restricted. The second part 820*b* may be located in the upper side of the first part 820*a*. The first part 820*a* and the second part 820*b* may be fastened through a screw. The second part 820*b* may be spaced apart from the guide rail 860. The lead screw 840 may penetrate the second part 820*b*. For example, the second part 820*b* may include a male thread engaged with a female thread of the lead screw 840. Accordingly, even if the lead screw 840 rotates, the slide 820 can stably move forward and rearward along the guide rail 860 without rotating.

The third part 820*c* may be coupled to one side of the second part 820*b*. The third part 820*c* may come into contact with the spring 850. The third part 820*c* may receive elastic force from the spring 850.

Figure 27:
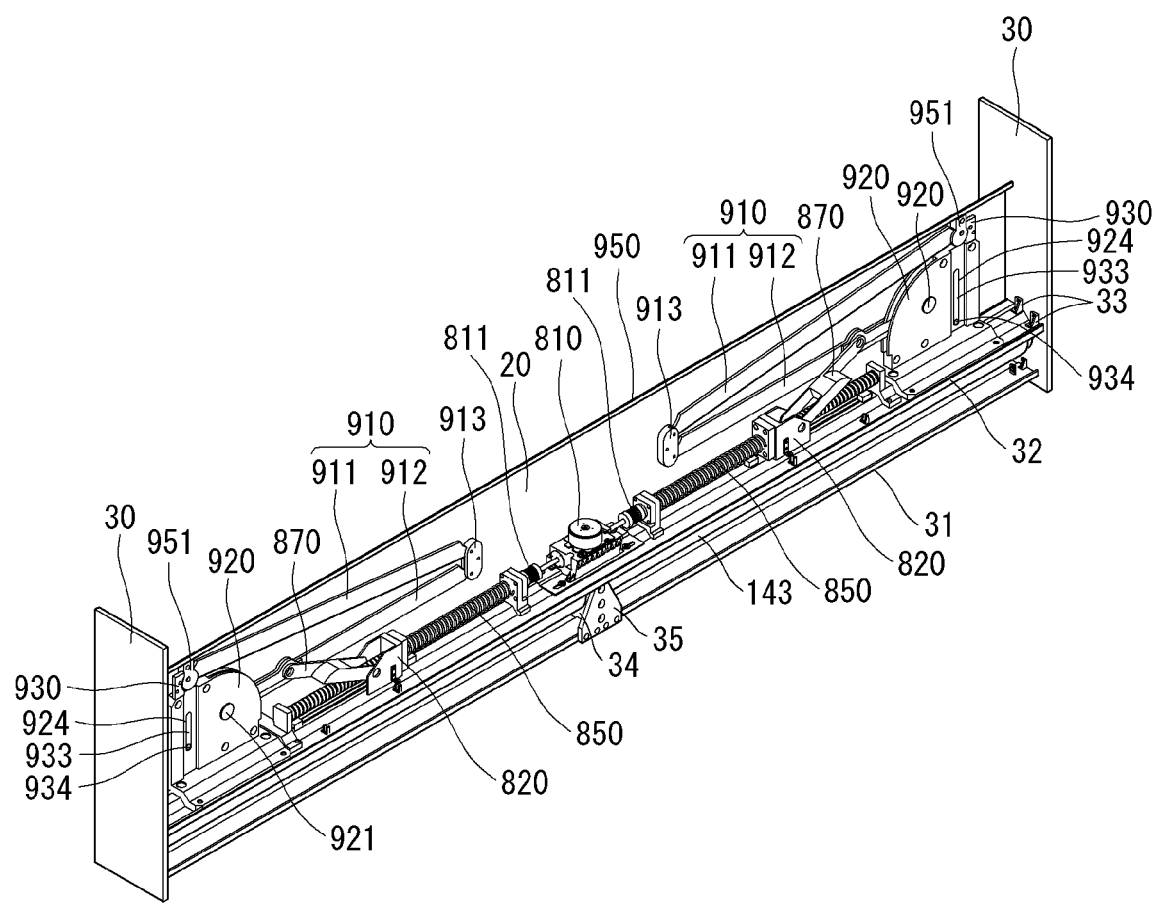
Figure 28:
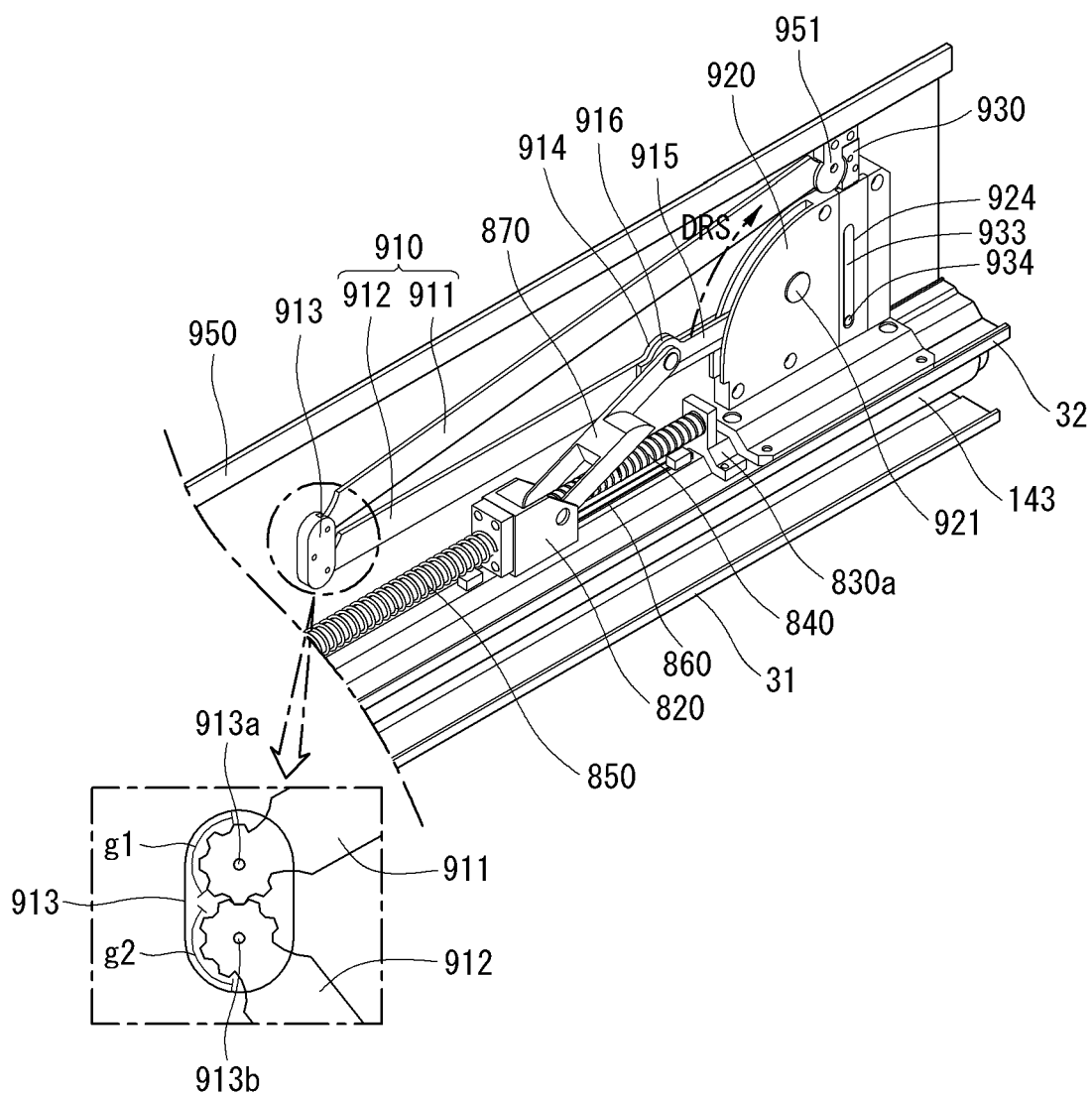

Referring to FIGS. 27 and 28, a link mount 920 may be installed in the second base 32. One side of the second arm 912 may be pivotably connected to the link mount 920. The other side of the second arm 912 may be pivotally connected to a joint 913. The other side of the second arm 912 may be pivotably connected to a second shaft 913*b*. One side of a rod 870 may be pivotably connected to the slide 820. The other side of the rod 870 may be pivotably connected to the second arm 912 or a third arm 915. One side of the third arm 915 may be pivotably connected to the link mount 920. The other side of the third arm 915 may be pivotably connected to the other side of the rod 870. The link mount 920 may include a shaft 921. The second arm 912 or a third arm 911 may be pivotally connected to the shaft 921.

The link bracket 951 may be referred to as a link cap 951. The link bracket 951 may be coupled to a top case 950. The top case 950 may be referred to as a case top 950, an upper bar 950, a top 950, or a bar 950. The top case 950 may be located in the upper side of the display unit 20. The display unit 20 may be fixed to the top case 950.

One side of the first arm 911 may be pivotably connected to the joint 913. One side of the first arm 911 may be pivotally connected to a first shaft 913*a*. The other side of the first arm 911 may be pivotally connected to the link bracket 951 or the top case 950.

A gear g1 may be formed in one side of the first arm 911. A gear g2 may be formed in the other side of a second arm 912. The gear g1 of the first arm 911 and the gear g2 of the second arm 912 may be engaged with each other.

When the slide 820 moves closer to the outer bearing 830*a*, the second arm 912 or the third arm 915 may stand up. At this time, the direction in which the second arm 912 or the third arm 915 stands up may be referred to as a standing direction DRS.

The second arm 912 may include a protrusion 914 protruding in the standing direction DRS. The protrusion 914 may be referred to as a connecting portion 914. The third arm 915 may include a protrusion 916 protruding in the standing direction DRS. The protrusion 916 may be referred to as a connecting portion 916. The protrusion 914 of the second arm 912 and the protrusion 916 of the third arm 915 may face or contact each other. The other side of the rod 870 may be fastened to the protrusion 914 of the second arm 912 or the protrusion 916 of the third arm 915.

The link 910 may include a first arm 911, a second arm 912, a third arm 915, and/or a joint 913.

Figure 29:
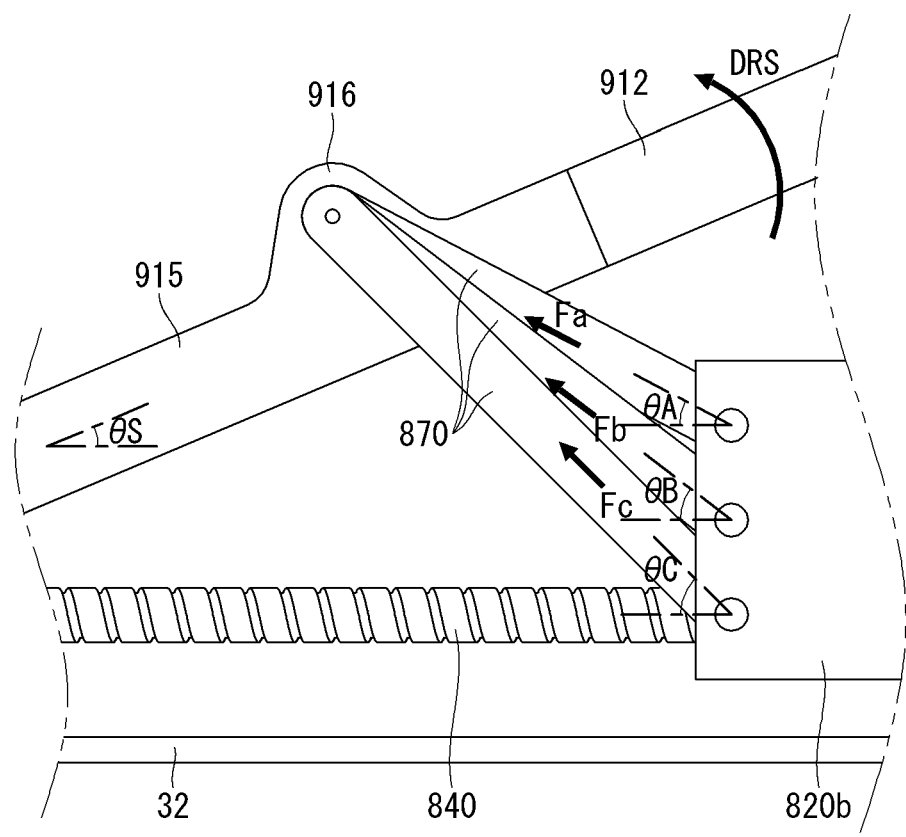
Figure 30:
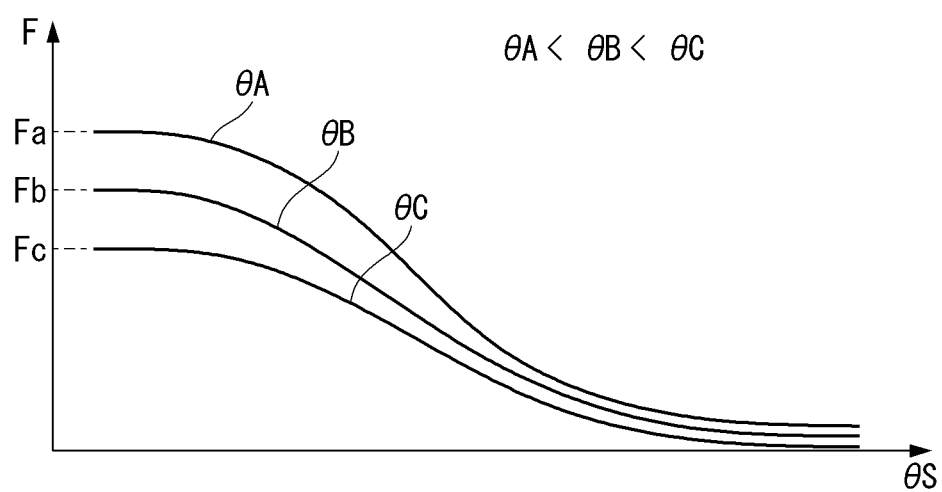

Referring to FIGS. 29 and 30, an angle formed between the second arm 912 or the third arm 915 and the second base 32 may be referred to as theta S. When the rod 870 is connected to the upper side of the second part 820*b*, the angle between the rod 870 and the second base 32 may be referred to as theta A, and the minimum force for the rod 870 to stand the second arm 912 or the third arm 915 may be referred to as Fa. When the rod 870 is connected to the middle of the second part 820*b*, the angle between the rod 870 and the second base 32 may be referred to as theta B, and the minimum force for the rod 870 to stand the second arm 912 or the third arm 915 may be referred to as Fb.

When the rod 870 is connected to the lower side of the second part 820*b*, the angle between the rod 870 and the second base 32 may be referred to as theta C, and the minimum force for the rod 870 to stand the second arm 912 or the third arm 915 may be referred to as Fc.

A relationship of theta A<theta B<theta C may be established for the same theta S. In addition, for the same theta S, a relationship of Fc<Fb<Fa may be established. If the angle between the second arm 912 or the third arm 915 and the second base 32 is the same, as the angle between the rod 870 and the second base 32 increases, a force required to stand the second arm 912 or the third arm 915 may be reduced. Since the rod 870 is connected to the lower side of the second part 820*b*, a load applied to the motor assembly 810 may be reduced.

Figure 31:
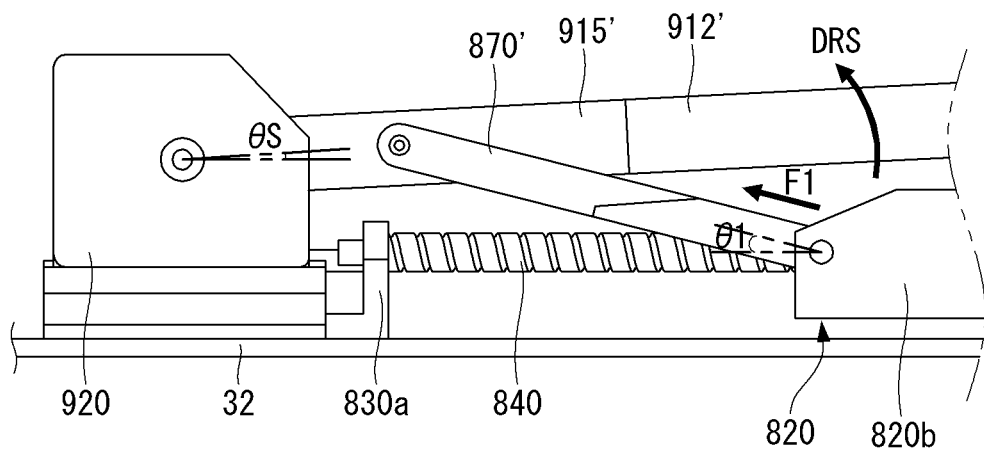

Referring to FIG. 31, a rod 870' may not be connected to the protrusion of a second arm 912' or the protrusion of a third arm 915'. When the angle formed between the second arm 912' or the third arm 915' and the second base 32 is theta S, the angle formed between the rod 870' and the second base 32 may be referred to as theta 1, and the minimum force for the rod 870' to stand the second arm 912' or the third arm 915' may be referred to as F1.

Figure 32:
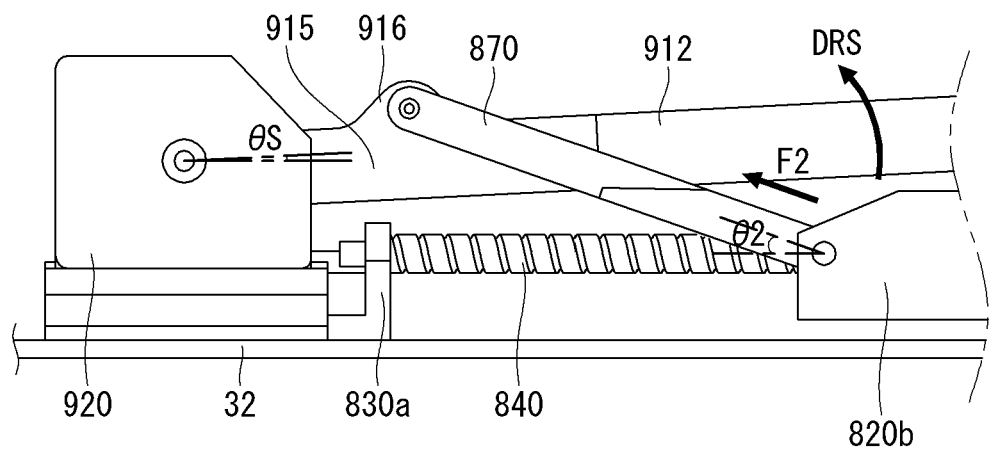

Referring to FIG. 32, the rod 870 may be connected to the protrusion 914 of the second arm 912 or the protrusion 916 of the third arm 915. When the angle formed by the second arm 912 or the third arm 915 and the second base 32 is theta S, the angle formed by the rod 870 and the second base 32 may be referred to as theta 2, and the minimum force for the rod 870 to stand the second arm 912 or the third arm 915 may be referred to as F2.

Figure 33:
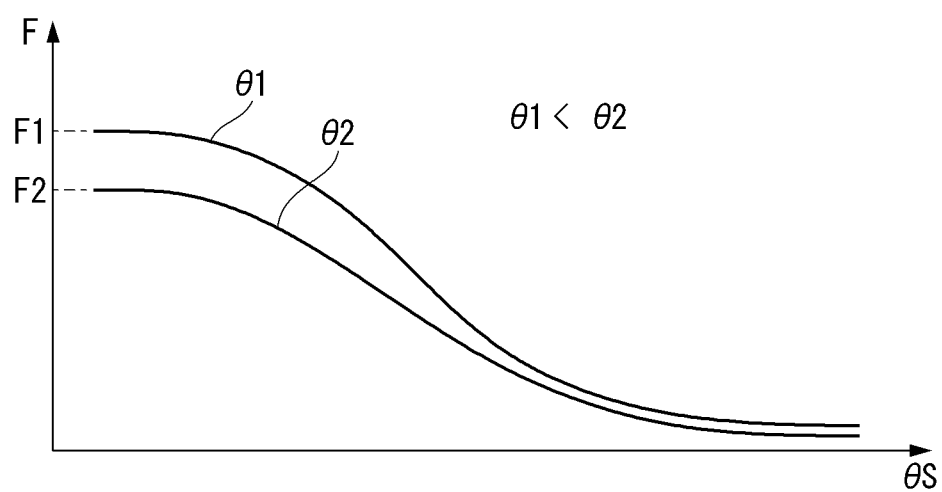

Referring to FIG. 33, when theta S is the same, theta 2 may be larger than theta 1. When Theta S is the same, F1 may be larger than F2. If the angle between the second arm 912, 912' and the second base 32 is the same, as the angle between the rod 870, 870' and the second base 32 increases, the force required to stand the second arm 912, 912' may be reduced. Since the rod 870 is connected to the protrusion 914, 916, the second arm 912 can be stood by a smaller force than a case where the rod 870' is not connected to the protrusion. Since the rod 870 is connected to the protrusion 914, 916, a load applied to the motor assembly 810 may be reduced.

Figure 34:
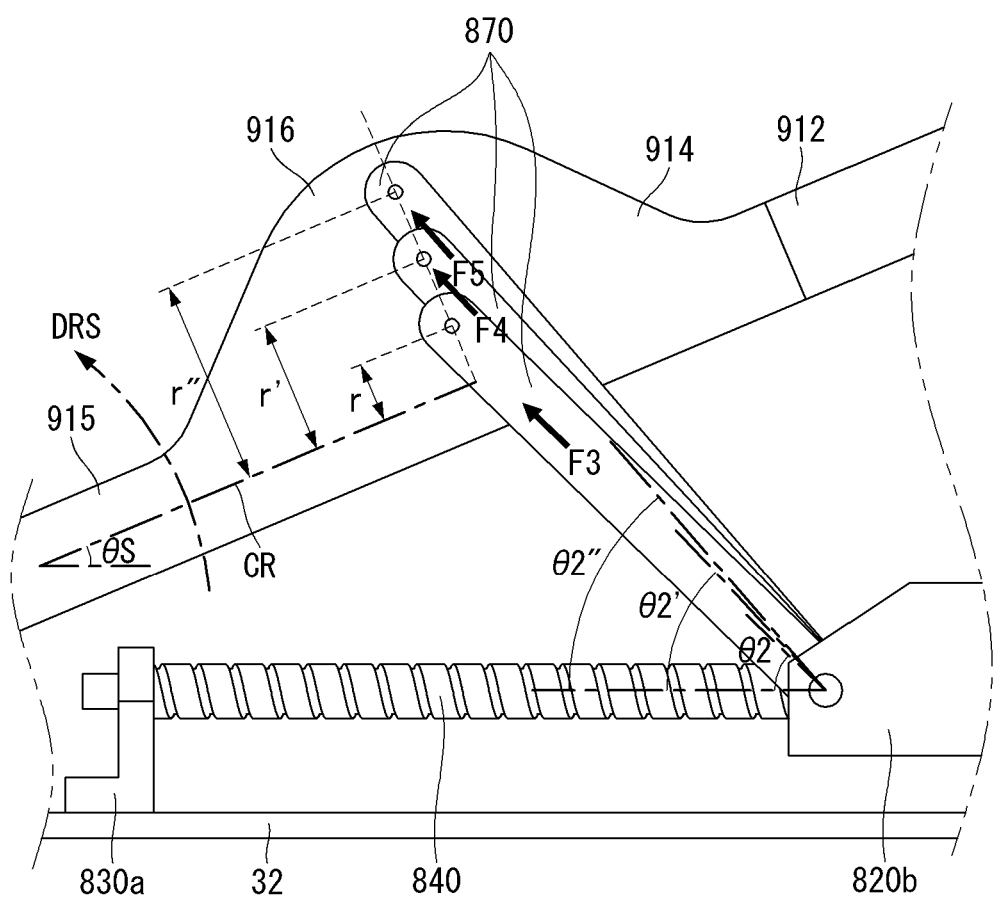

Referring to FIG. 34, the second arm 912 or the third arm 915 may have a central axis CR. When the rod 870 is fastened to the second arm 912 at a distance r from the central axis CR, an angle formed between the rod 870 and the second base 32 may be referred to as theta 2, and the minimum force for the rod 870 to stand the second arm 912 or the third arm 915 may be referred to as F3. When the rod 870 is fastened to the second arm 912 at a distance r' from the central axis CR, the angle formed by the rod 870 and the second base 32 may be referred to as theta 2', and the minimum force for the rod 870 to stand the second arm 912 or the third arm 915 may be referred to as F4. When the rod 870 is fastened to the second arm 912 at a distance r" from the central axis CR, the angle formed by the rod 870 and the second base 32 may be referred to as theta 2", and the minimum force for the rod 870 to stand the second arm 912 or the third arm 915 may be referred to as F5.

Figure 35:
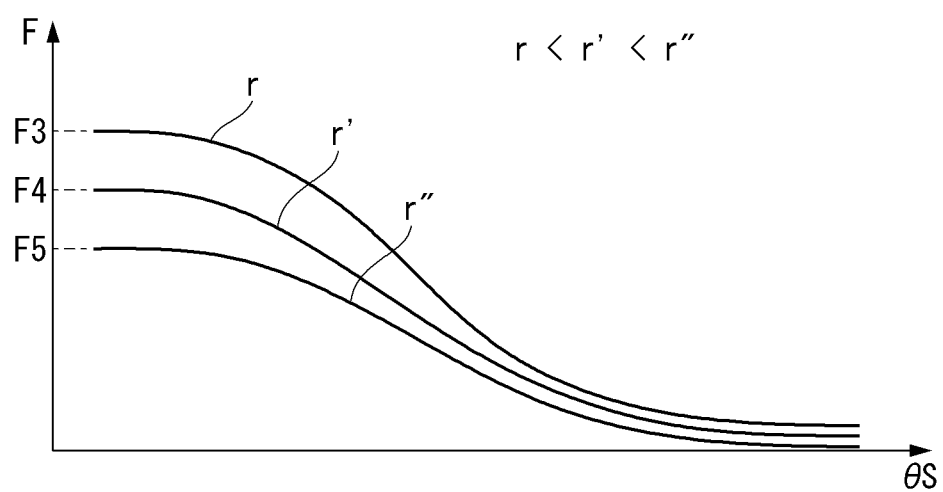

Referring to FIG. 35, when theta S is the same, theta 2" may be larger than theta 2', and theta 2' may be larger than theta 2. When Theta S is the same, F3 may be larger than F4, and F4 may be larger than F5. As the rod 870 is fastened farther away from the central axis CR, the force required to stand the second arm 912 may be reduced. Since the rod 870 is fastened farther away from the central axis CR, the load applied to the motor assembly 810 may be reduced.

Figure 36:
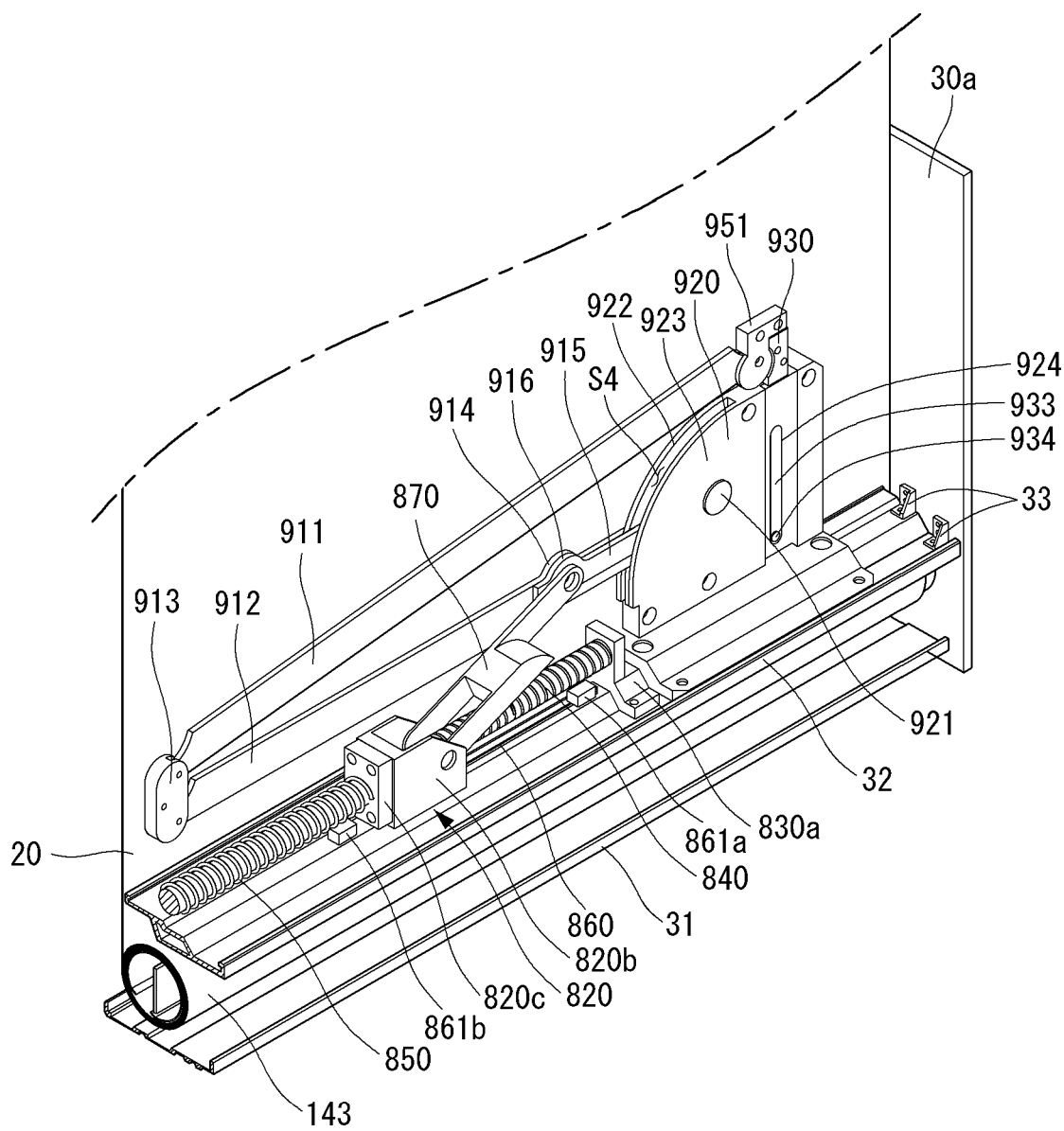

Referring to FIG. 36, the first arm 911 and the second arm 912 may be in contact with or located close to the rear surface of the display unit 20. When the first arm 911 and the second arm 912 come into contact with or are located close to the rear surface of the display unit 20, the display unit 20 may be stably wound around or unwound from the roller. The link mount 920 may include a first part 922 and a second part 923. The first part 922 and the second part 923 may face each other. A space S4 may be formed between the first part 922 and the second part 923. The first part 922 may face the display unit 20. The first part 922 may be located closer to the display unit 20 than the second part 923. The second arm 912 may be pivotably connected to the front surface of the first part 922. A part of the third arm 915 may be accommodated in the space S4 and pivotally connected to the first part 922 or the second part 923.

Figure 37:
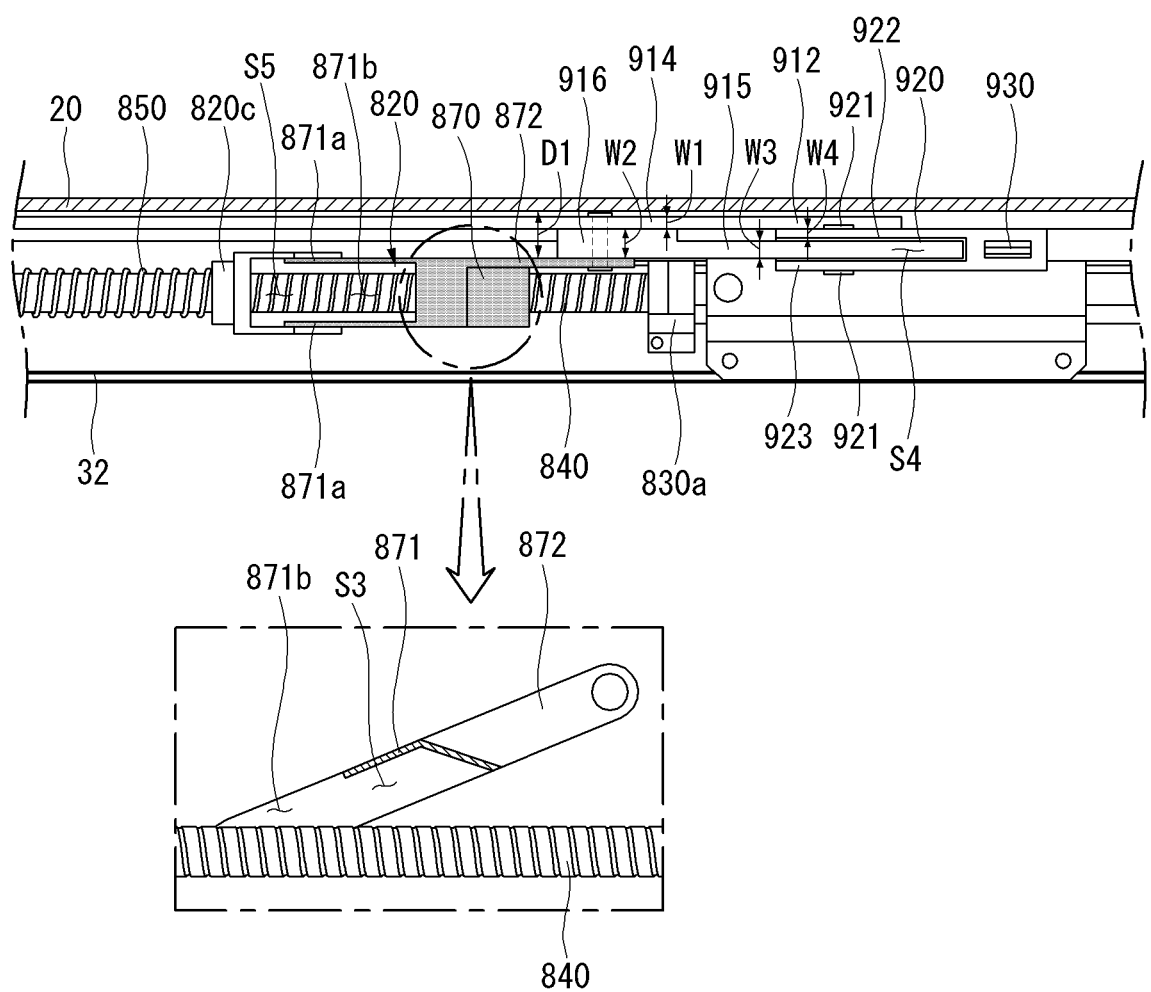

Referring to FIG. 37, the rod 870 may include a first part 871 and a second part 872. The first part 871 may include a connecting portion 871a at one side. The second part 872 of the slide 820 may form a space S5 therein. The connecting portion 871a may be inserted into the space S5. The connecting portion 871a may be pivotally connected to the second part 820b (see FIG. 36) of the slide 820. The other side of the first part 871 may be connected to one side of the second part 872. The other side of the second part 872 may be pivotably connected to the second arm 912 or the third arm 915. The first part 871 may form a space S3 therein. The first part 871 may include a hole 871b. The lead screw 840 may be accommodated in the hole 871b or the space S3.

A distance between the second part 872 and the display unit 20 may be D1. The second arm 912 may have a thickness W1. A portion of the third arm 915 accommodated in the space S4 may have a thickness W3. The thickness W3 may be equal to the distance between the first part 922 and the second part 923. A portion of the third arm 915 not accommodated in the space S4 may have a thickness W2. The first part 922 may have a thickness W4. The thickness W2 may be larger than the thickness W3. The thickness W2 may be equal to the sum of the thicknesses W3 and the thickness W4. D1 may be the sum of the thickness W1 and the thickness W2.

The second arm 912 may come into contact with or be located close to the rear surface of the display unit 20, and the third arm 915 may be located between the second arm 912 and the second part 872. The second part 872 may stably transmit power for standing the second arm 912 due to the third arm 915. The second part 872 may move forward with respect to the rotation shaft of the lead screw 840 and be connected to the first part 871 in order to stably stand the second arm 912 or the third arm 915. Accordingly, the gap between the second arm 912 and the second part 872 may be minimized.

Figure 38:
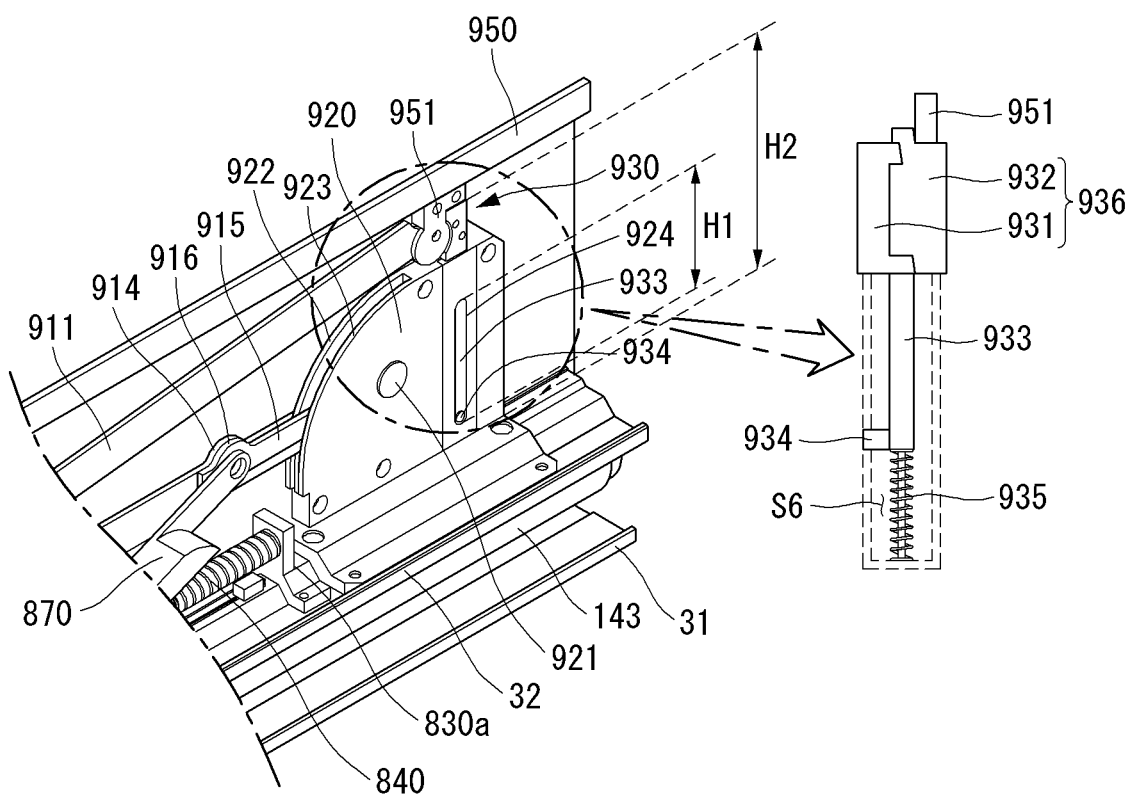

Referring to FIG. 38, a pusher 930 may be mounted on the link mount 920. The pusher 930 may be referred to as a lifter 930. The second part 932 may be fastened to the first part 931. The second part 932 may be in contact with or separated from the link bracket 951. The second part 932 may be made of a highly elastic material. The first part 931 may be made of a material having lower elasticity than the second part 932. The first part 931 may be made of a material having higher rigidity than the second part 932. The first part 931 and the second part 932 may be collectively referred to as a head 936. The head 936 may be located in the upper side of the link mount 920.

The third part 933 may be connected to the first part 931. Alternatively, the third part 933 may extend downward from the first part 931. The third part 933 may be referred to as a tail 933. The fourth part 934 may protrude from the third part 933. The link mount 920 may form a space S6, and the third part 933 may be accommodated in the space S6. The space S6 may be opened upward. The space S6 accommodating the third part 933 may be adjacent to the space S4 (see FIG. 37) accommodating the third arm 915. The second part 932 of the link mount 920 may include a hole 924. The hole 924 may be a long hole formed long in the vertical direction. The length of the hole 924 may be H1. The fourth part 934 may be inserted into the hole 924. The spring 935 may be accommodated in the space S6. The spring 935 may be located in the lower side of the third part 933. The spring 935 may provide elastic force to the third part 933 in the vertical direction.

The head 936 may be larger than the diameter of the space S6. When the head 936 is caught by the upper end of the space S6, the height of the head 936 from the second base 32 may be minimal. The minimum height of the head 936 may be referred to as H2. When the height of the head 936 is the minimum, the fourth part 934 may be caught by the lower end of the space S6. When the height of the head 936 is minimal, the spring 935 may be maximally compressed. When the height of the head 936 is minimum, the elastic force provided by the spring 935 may be maximum. When the head 936 has a minimum height, the top case 950 may have a minimum height.

The pusher 930 may provide elastic force to the link bracket 951 while being in contact with the link bracket 951. Thus, the load applied to the motor assembly 810 to stand the link 910 may be reduced.

Figure 39:
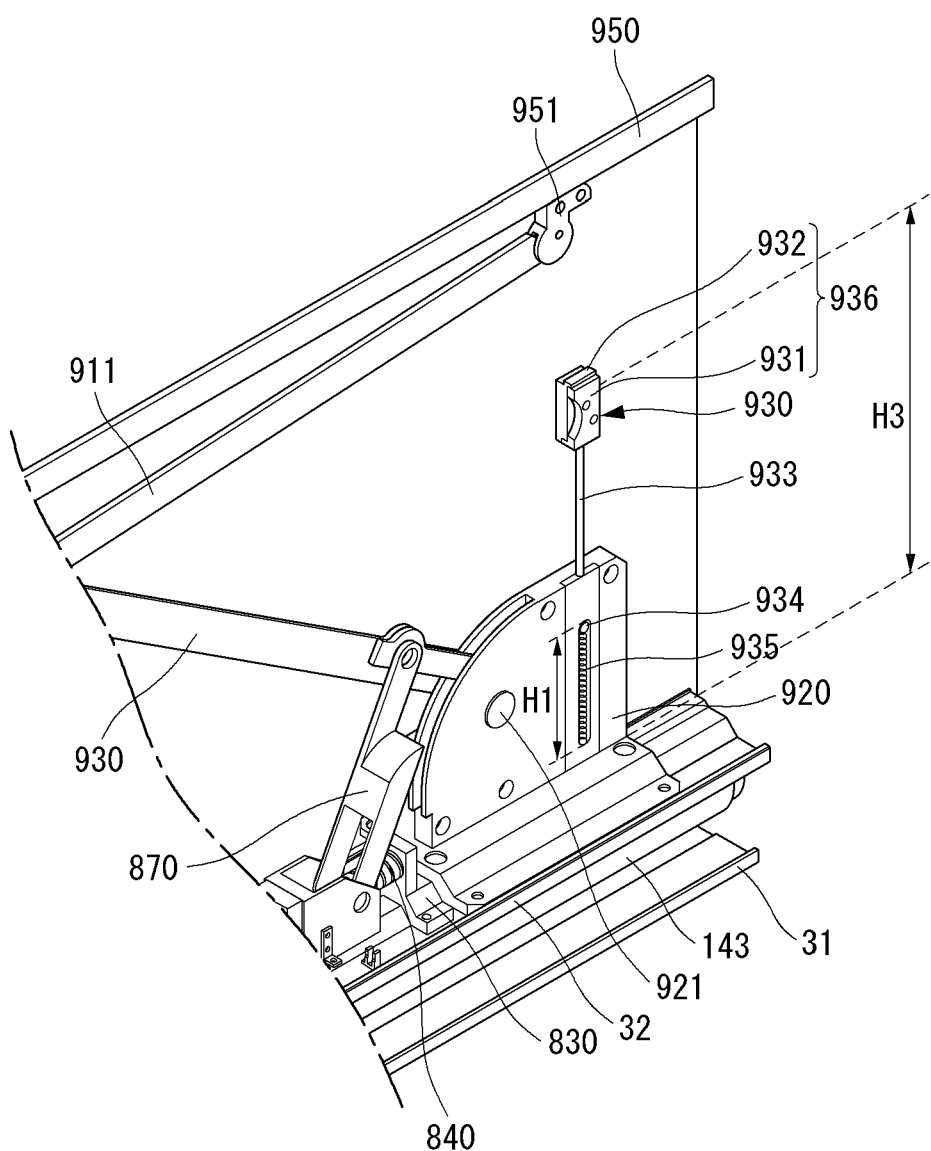

Referring to FIG. 39, when the link 910 stands up sufficiently, the pusher 930 may be separated from the link bracket 951. When the pusher 930 is separated from the link bracket 951, the height of the head 936 from the second base 32 may be maximum. The maximum height of the head 936 may be referred to as H3. When the height of the head 936 is maximum, the fourth part 934 may be caught by the upper end of the hole 924 (see FIG. 38). When the height of the head 936 is maximum, the spring 935 may be maximally tensioned. When the height of the head 936 is maximum, the elastic force provided by the spring 935 may be minimal. The maximum height H3 of the head 936 may be substantially equal to the sum of the minimum height H2 of the head 936 and the length H1 of the hole.

Figure 40:
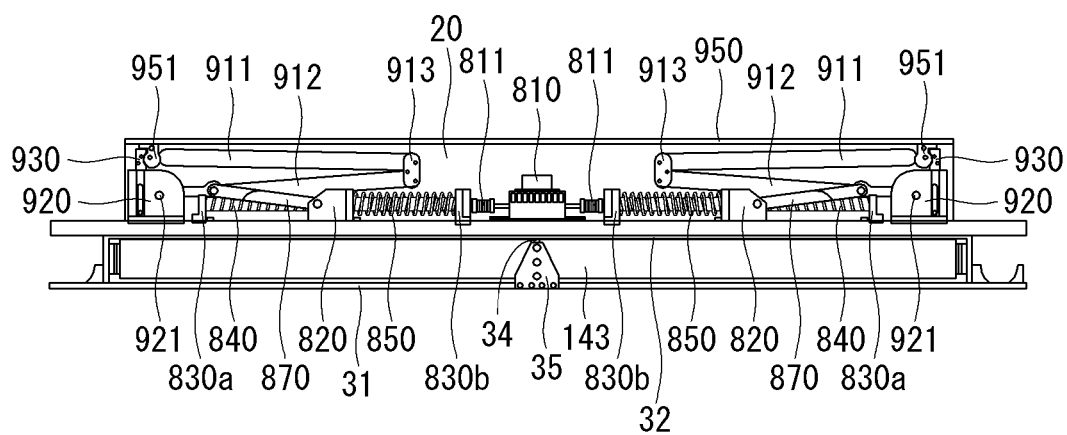

Referring to FIG. 40, the display unit 20 may be in a state of being maximally wound around the roller 143. The display device 100 may be left-right symmetric based on the motor assembly 810. The height of the top case 950 may be minimal. The slide 820 may be at a location closest to the inner bearing 830b. The slide 820 may be caught by the first stopper 861b. The spring 850 may be in a maximum compressed state. The pusher 930 may contact the link bracket 951. The height of the pusher 930 may be minimal.

Figure 41:
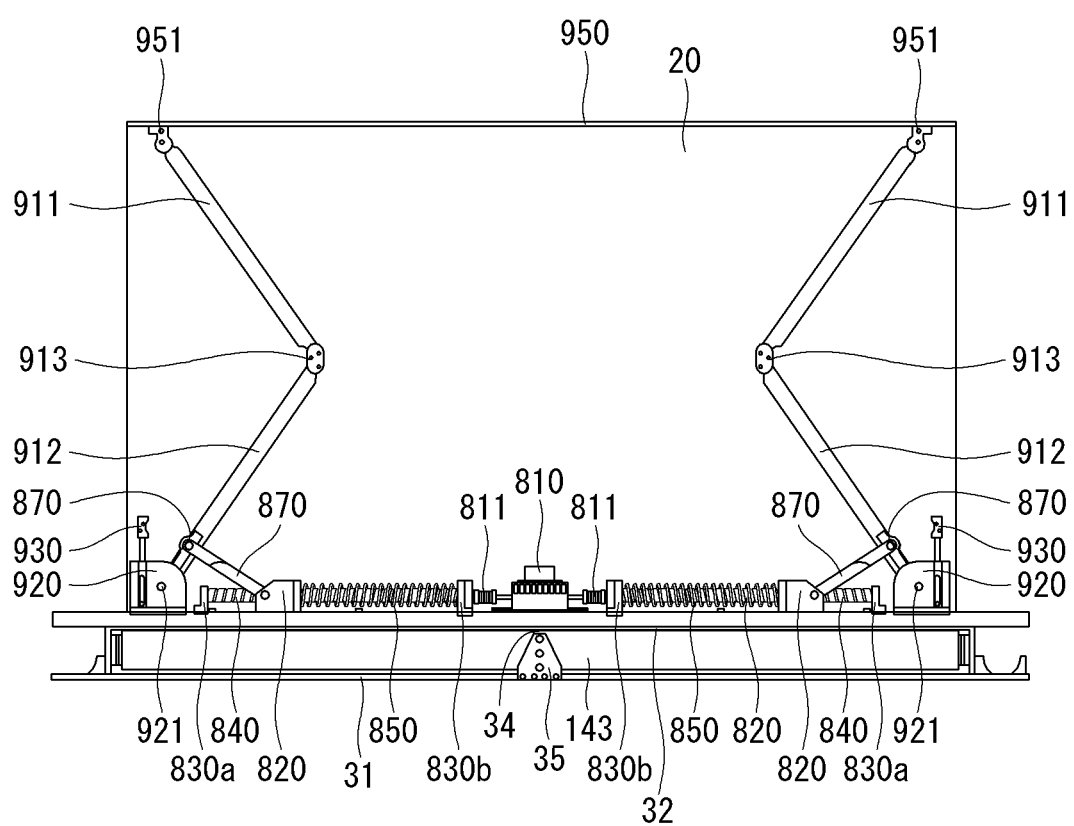

Referring to FIG. 41, about half of the display unit may be wound around the roller 143. The display device 100 may be left-right symmetric based on the motor assembly 810. About half of the display unit 20 may be unwound from the roller 143. The slide 820 may be located between the first stopper 861b and the second stopper 861a. The pusher 930 may be separated from the link bracket 951. The height of the pusher 930 may be maximum.

Figure 42:
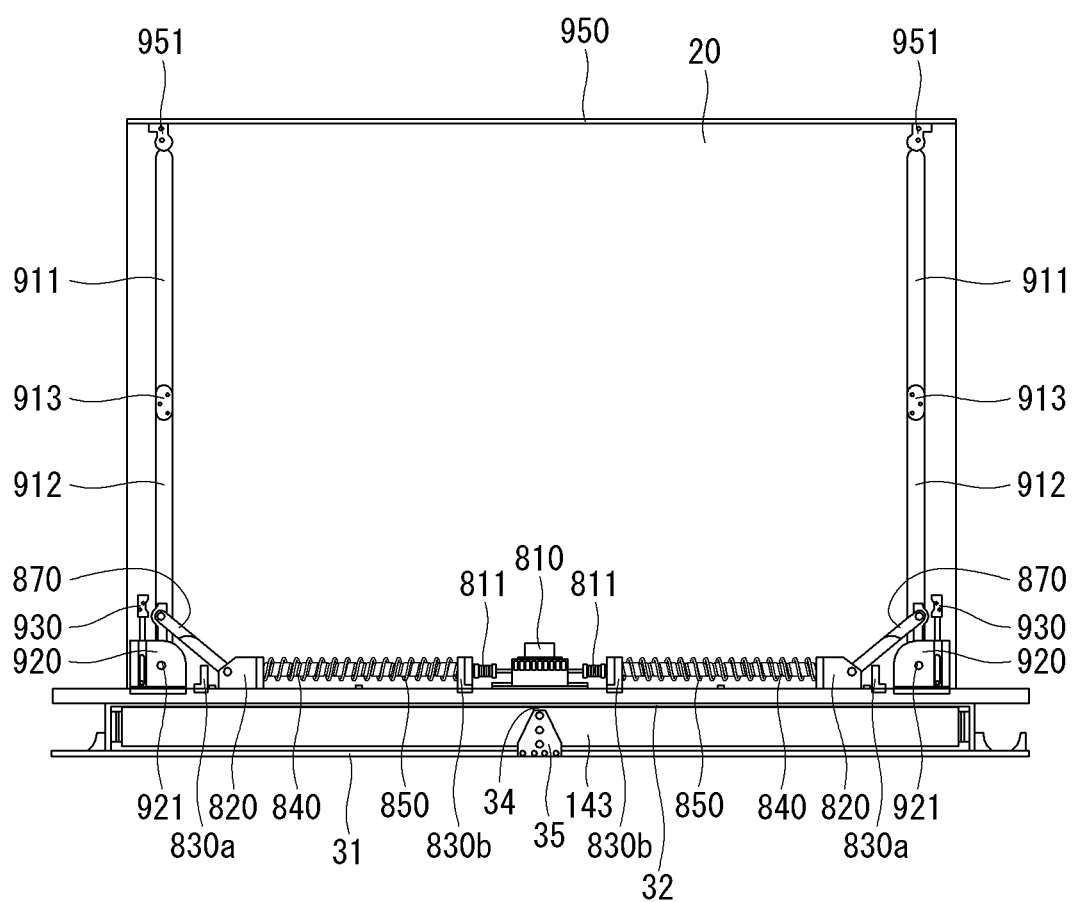
Figure 43:
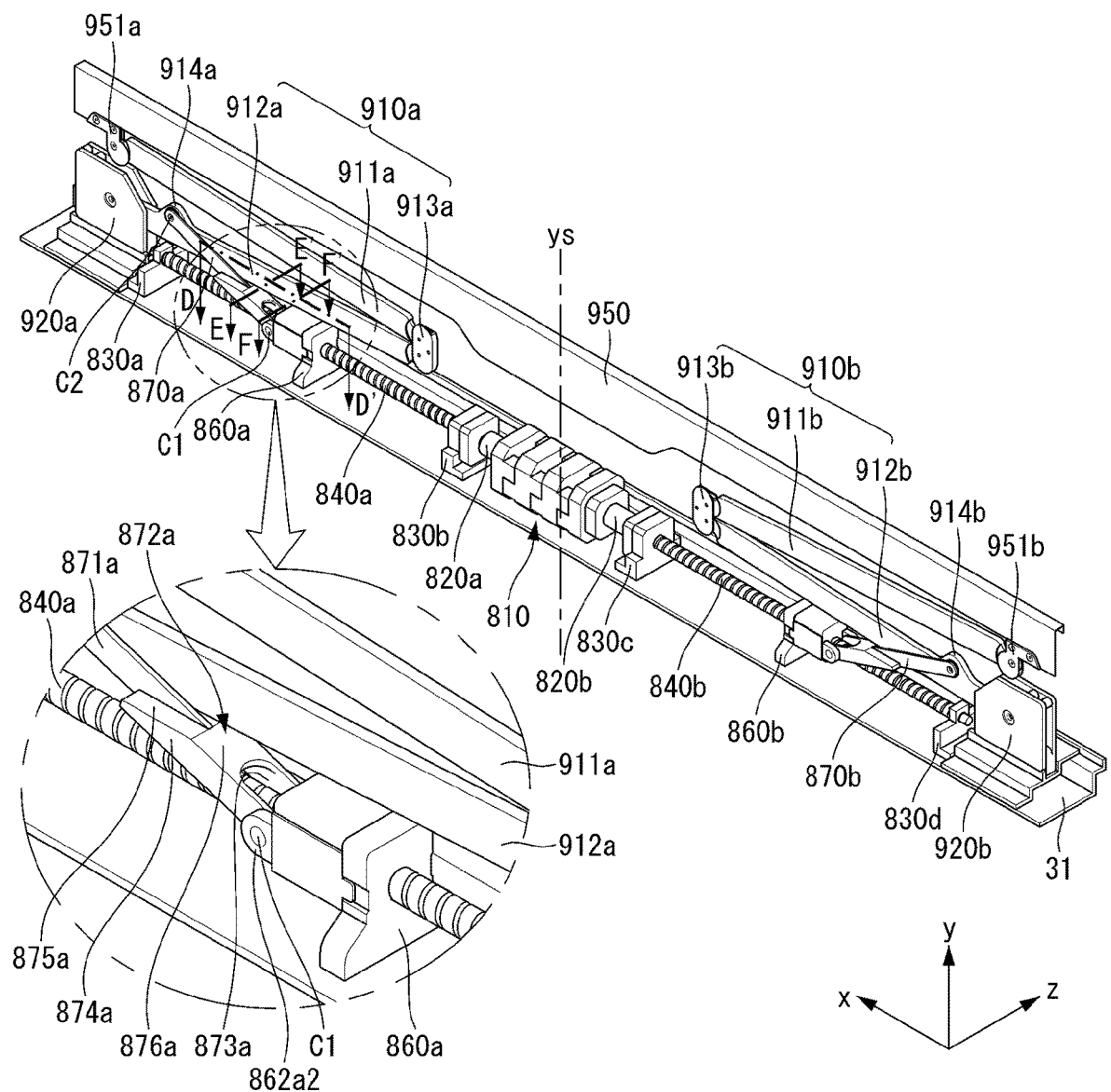
Figure 44:
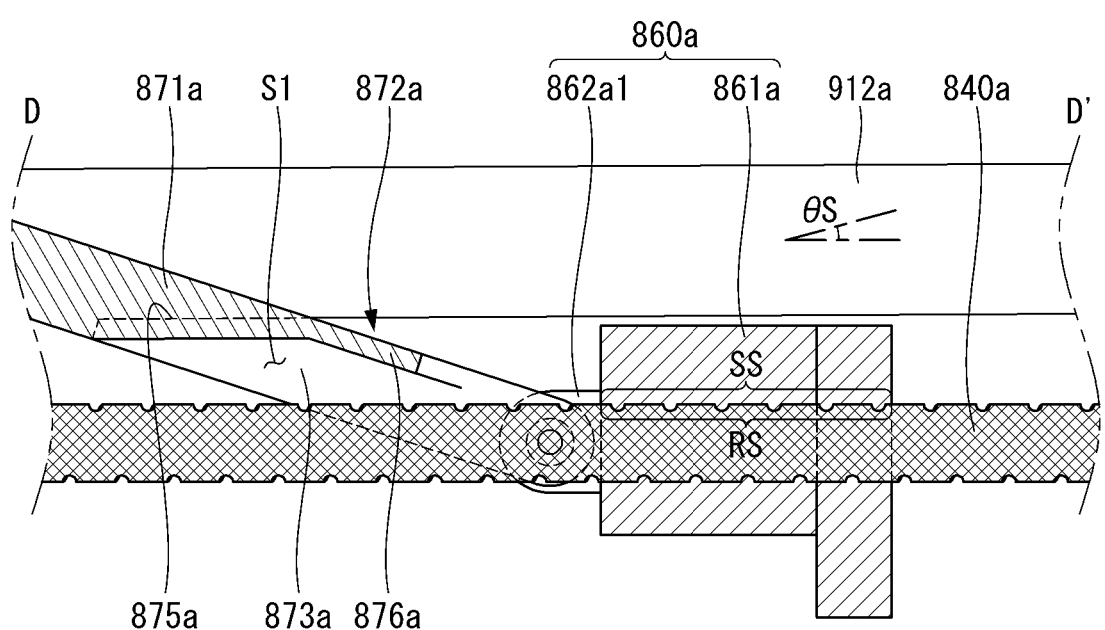
Figure 45:
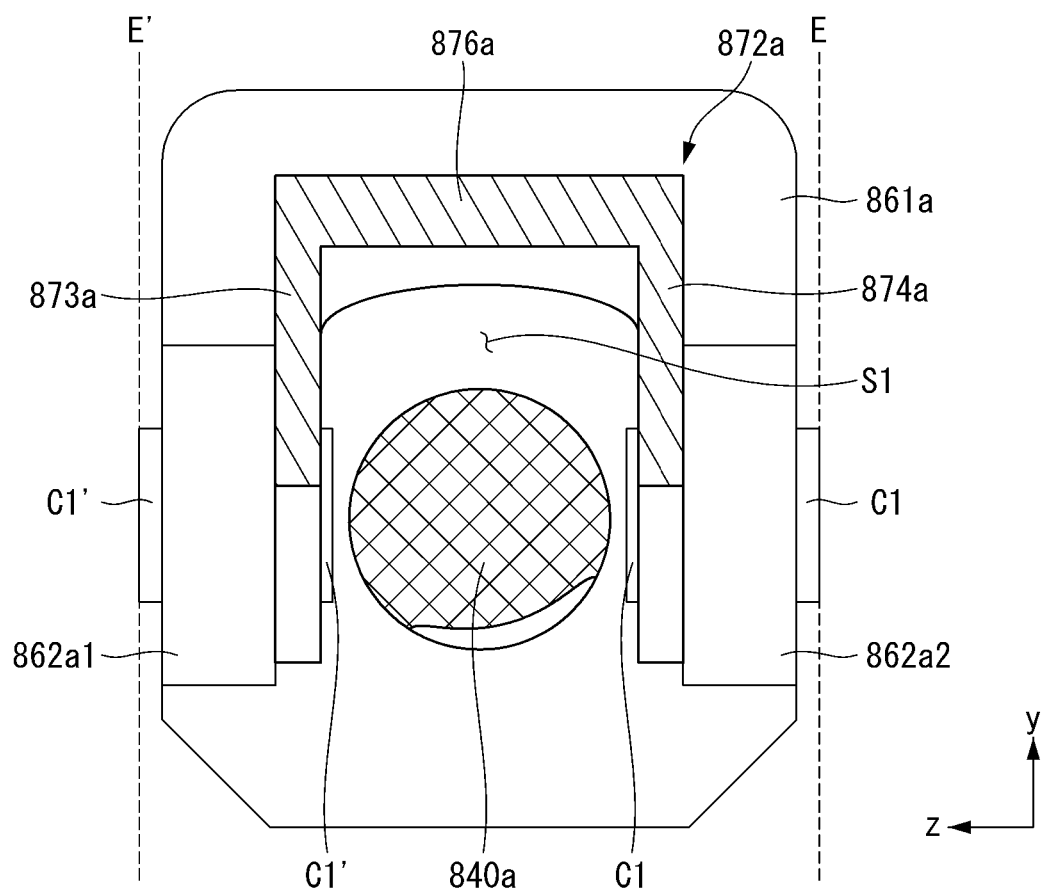
Figure 46:
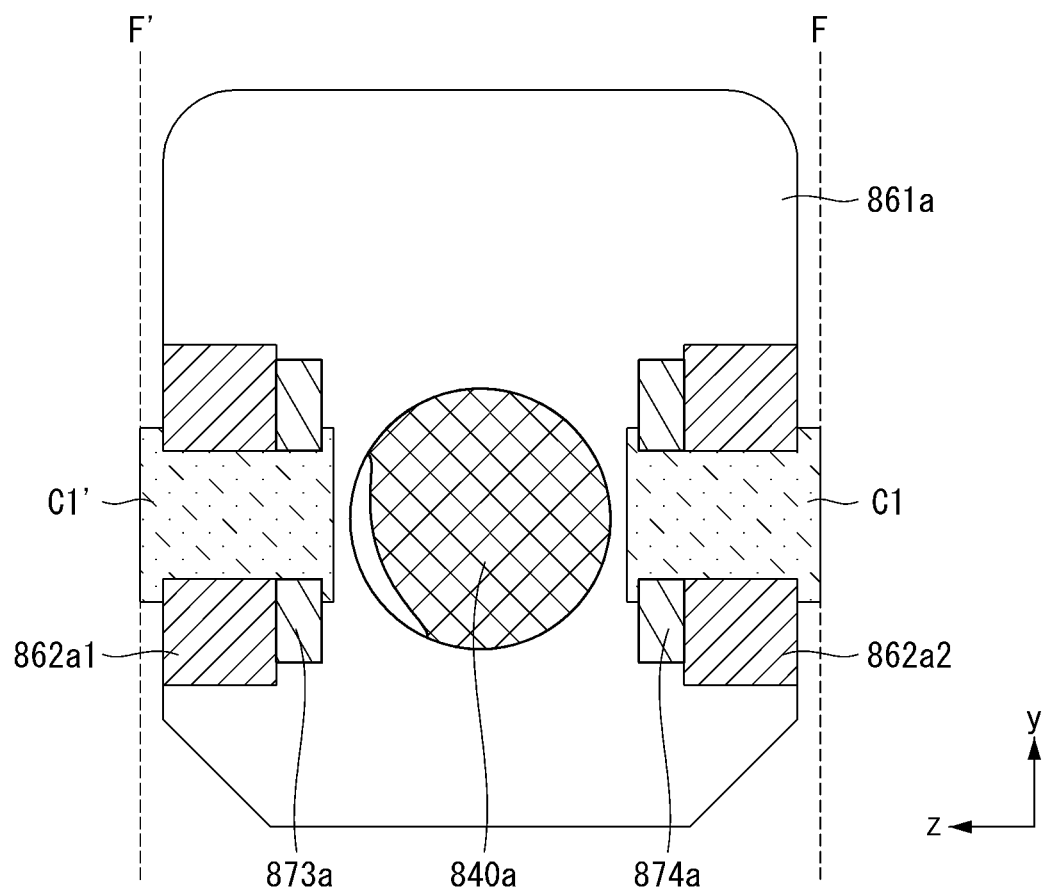

Referring to FIG. 42, the display unit 20 may be in a state in which the roller 143 is unwound to the maximum. The display device 100 may be left-right symmetric with respect to the motor assembly 810. The height of the top case 950 may be maximum. The slide 820 may be at a location closest to the outer bearing 830a. The slide 820 may be caught by the second stopper 861a. The spring 850 may be in a maximum tensioned state. The pusher 930 may be separated from the link bracket 951. The height of the pusher 930 may be maximum.

Referring to FIGS. 43 to 46, a link mount 920a, 920b may be installed in the base 31. The link mount 920a, 920b may include a right link mount 920a spaced right from a first right bearing 830a and a left link mount 920b spaced left from a second left bearing 830d.

A link 910a, 910b may be connected to the link mount 920a, 920b. The link 910a, 910b may include a right link 910a connected to the right link mount 920a and a left link 910b connected to the left link mount 920b.

The right link 910a may also be referred to as a first link. The left link 910b may also be referred to as a second link. The right link mount 920a may also be referred to as a first link mount 920a. The left link mount 920b may also be referred to as a second link mount 920b.

The link 910a, 910b may include a first arm 911a, 911b, a second arm 912a, 912b, and an arm joint 913a, 913b. One side of the second arm 912a, 912b may be rotatably connected to the link mount 920a, 920b. The other side of the second arm 912a, 912b may be rotatably connected to the arm joint 913a, 913b. One side of the first arm 911a, 911b may be rotatably connected to the arm joint 913a, 913b. The other side of the first arm 911a, 911b may be rotatably connected to a link bracket 951a, 951b.

The link bracket 951a, 951b may include a right link bracket 951a connected to the first arm 911a of the right link 910a and a left link bracket 951b connected to the first arm 911b of the left link 910b. The link bracket 951a, 951b may be connected to the upper bar 950. The upper bar 950 may connect the right link bracket 951a and the left link bracket 951b.

The rod 870a, 870b may connect the slider 860a, 860b and the link 910a, 910b. One side of the rod 870a, 870b may be rotatably connected to the slider 860a, 860b. The other side of the rod 870a, 870b may be rotatably connected to the second arm 912a, 912b. The rod 870a, 870b may include a right rod 870a connecting a right slider 860a and the second arm 912a of the right link 910a and a left rod 870b connecting a left slider 860b and the second arm 912b of the left link 910b. The right rod 870a may also be referred to as a first rod 870a. The left rod 870b may also be referred to as a second rod 870b.

Specifically, The structure formed by the right lead screw 840a, the right slider 860a, the right rod 870a, and the right link 910a will be described. The right slider 860a may include a body 861a and a rod mount 862a. A thread SS may be formed on an inner circumferential surface of the body 861a. A screw thread formed in the body 861a may be engaged with a screw thread RS of the right lead screw 840a. The right lead screw 840a may penetrate the body 861a.

The rod mount 862a may be formed in the right side of the body 861a. The rod mount 862a may be rotatably connected to one side of the right rod 870a. The rod mount 862a may include a first rod mount 862a1 and a second rod mount 862a2. The first rod mount 862a1 may be disposed in front of the right lead screw 840a. The second rod mount 862a2 may be disposed in a rear of the right lead screw 840a. The first rod mount 862a1 and the second rod mount 862a2 may be spaced apart from each other. The second rod mount 862a2 may be spaced apart from the first rod mount 862a1 in the −z-axis direction. The right lead screw 840a may be located between the first rod mount 862a1 and the second rod mount 862a2.

The rod mount 862a may be rotatably connected to one side of the rod 870a through a connecting member C1. The connecting member C1 may penetrate the rod mount 862a and the right rod 870a.

The right rod 870a may be rotatably connected to the second arm 912a through the connecting member C2. The connection member C2 may penetrate the second arm 912a and the right rod 870a.

The right rod 870a may include a transfer portion 871a connected to the second arm 912a of the right link 910a and a cover 872a connected to the rod mount 862a of the right slider 860a. The transfer portion 871a may transfer a force generated when the right slider 860a moves forward and rearward along the right lead screw 840a to the right link 910a.

The cover 872a may include a first plate 873a disposed in front of the right lead screw 840a. The first plate 873a may be disposed perpendicular to the base 31. Alternatively, the first plate 873a may face the right lead screw 840a.

The cover 872a may include a second plate 874a disposed in a rear of the right lead screw 840a. The second plate 874a may be disposed perpendicular to the base 31.

Alternatively, the second plate 874a may face the right lead screw 840a. Alternatively, the second plate 874a may be spaced apart from the first plate 873a. The right lead screw 840a may be located between the first plate 873a and the second plate 874a.

The cover 872a may include a third plate 875a connecting the first plate 873a and the second plate 874a. The third plate 875a may be connected to the transfer portion. The third plate 875a may be located in the upper side of the right lead screw 840a.

The cover 872a may include a fourth plate 876a connecting the first plate 873a and the second plate 874a. The fourth plate 876a may be connected to the third plate 875a. The fourth plate 876a may be located in the upper side of the right lead screw 840a.

One side of the first plate 873a may be connected to the first rod mount 862a1. The first plate 873a and the first rod mount 862a1 may be connected through a connecting member C1'. The other side of the first plate 873a may be connected to the third plate 875a.

One side of the second plate 874a may be connected to the second rod mount 862a2. The second plate 874a and the second rod mount 862a2 may be connected through a connecting member C1. The other side of the second plate 874a may be connected to the third plate 875a.

When the right slider 860a moves closer to the motor assembly 810, the right lead screw 840a and the right rod 870a may come into contact with each other. When the right lead screw 840a and the right rod 870a come into contact with each other, mutual interference may occur and the movement of the right slider 860a may be restricted.

The cover 872a may provide a space S1 therein. The first plate 873a, the second plate 874a, the third plate 875a, and the fourth plate 876a may form a space S1. When the right slider 860a moves closer to the motor assembly 810, the right lead screw 840a may be accommodated or escaped into the space S1 provided by the cover 872a. The right slider 860a may move closer to the motor assembly 810 than when there is no cover 872a due to the space S1 provided by the cover 872a. That is, the cover 872a may provide a space S1 therein so that the movable range of the right slider 860a may be widen. In addition, since the right lead screw 840a is accommodated in the cover 872a, the size of the housing 30 (see FIG. 2) can be reduced.

In addition, the cover 872a may restrict the minimum value of the angle theta S formed between the second arm 912a and the base 31. The third plate 875a of the cover 872a may contact the second arm 912a and support the second arm 912a when theta S becomes sufficiently small. The third plate 875a supports the second arm 912a, thereby restricting the minimum value of theta S and preventing the second arm 912a from sagging. That is, the cover 872a may serve as a stopper to prevent sagging of the second arm 912a. In addition, the third plate 875a may reduce an initial load for standing the second arm 912a by restricting the minimum value of theta S.

The lead screw 840a, 840b may be driven by a single motor assembly 810. The lead screw 840a, 840b is driven by a single motor assembly 810, so that the second arm 912a, 912b can stand symmetrically. However, when the lead screw 840a, 840b is driven by a single motor assembly 810, a load applied to the motor assembly 810 to stand the second arm 912a, 912b may be excessively increased. At this time, the third plate 875a may restrict the minimum value of theta S, thereby reducing the load applied to the motor assembly 810 to stand the second arm 912a, 912b.

The structure formed by the left lead screw 840b, the left slider 860b, the left rod 870b, and the left link 910b may be symmetrical with The structure formed by the above-described right lead screw 840a, right slider 860a, right rod 870a, and right link 910a. In this case, the axis of symmetry may be the axis of symmetry of the motor assembly 810.

Figure 47:
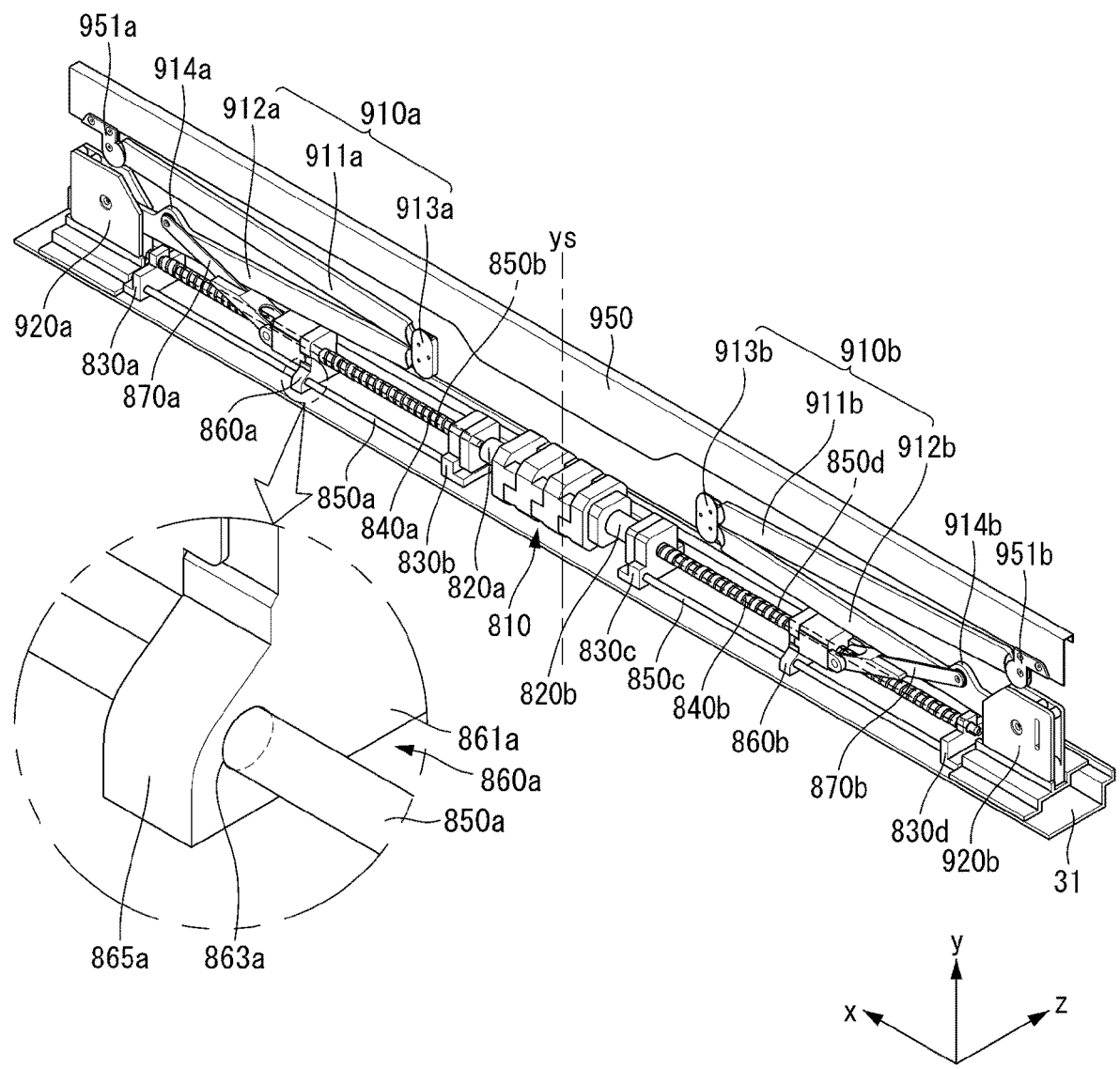

Referring to FIG. 47, a guide 850a, 850b, 850c, 850d may be connected to the bearing 830a, 830b, 830c, 830d. The guide 850a, 850b, 850c, 850d may include a right guide 850a, 850b disposed in the right side of the motor assembly 810 and a left guide 850c, 850d disposed in the left side of the motor assembly 810.

One side of the right guide 850a, 850b may be connected to the first right bearing 830a and the other side may be connected to a second right bearing 830b. The right guide 850a, 850b may be located parallel to the right lead screw 840a. Alternatively, the right guide 850a, 850b may be spaced apart from the right lead screw 840a.

The right guide 850a, 850b may include a first right guide 850a and a second right guide 850b. The first right guide 850a and the second right guide 850b may be spaced apart from each other. The right lead screw 840a may be located between the first right guide 850a and the second right guide 850b.

The right slider 860a may include a protrusion. Alternatively, the display device may include a protrusion formed in the right slider 860a. The protrusion may be formed in the body of the slider. The protrusion may include a front protrusion (not shown) protruding in the +z-axis direction from the body 861a of the right slider 860a and a rear protrusion 865a protruding in the −z-axis direction from the body of the slider.

The first right guide 850a may penetrate the rear protrusion 865a. Alternatively, a first hole 863a formed in the rear protrusion may be included, and the first right guide 850a may penetrate the first hole 863a. The first hole 863a may be formed in the x-axis direction. The first hole 863a may also be referred to as a hole 863a.

The second right guide (not shown) may penetrate a front protrusion (not shown). Alternatively, a second hole (not shown) formed in the front protrusion may be included, and the second right guide may penetrate the second hole. The second hole may be formed in the x-axis direction.

The right guide 850a, 850b may guide the right slider 860a to move more stably, when the right slider 860a moves forward and rearward along the right lead screw 840a. Since the right guide 850a, 850b stably guides the right slider 860a, the right slider 860a may move forward and rearward along the right lead screw 840a without rotating with respect to the right lead screw 840a.

The structure formed by the left guides 850c, 850d, the left bearing 830a, 830b, 830c, 830d, the left slider 860b, and the left lead screw 840b may be symmetrical with the structure formed by the above-described right guide 850a, 850b, right bearing 830a, 830b, 830c, 830d, right slider 860a, and right lead screw 840a. In this case, the axis of symmetry may be the axis of symmetry ys of the motor assembly 810.

Figure 48:
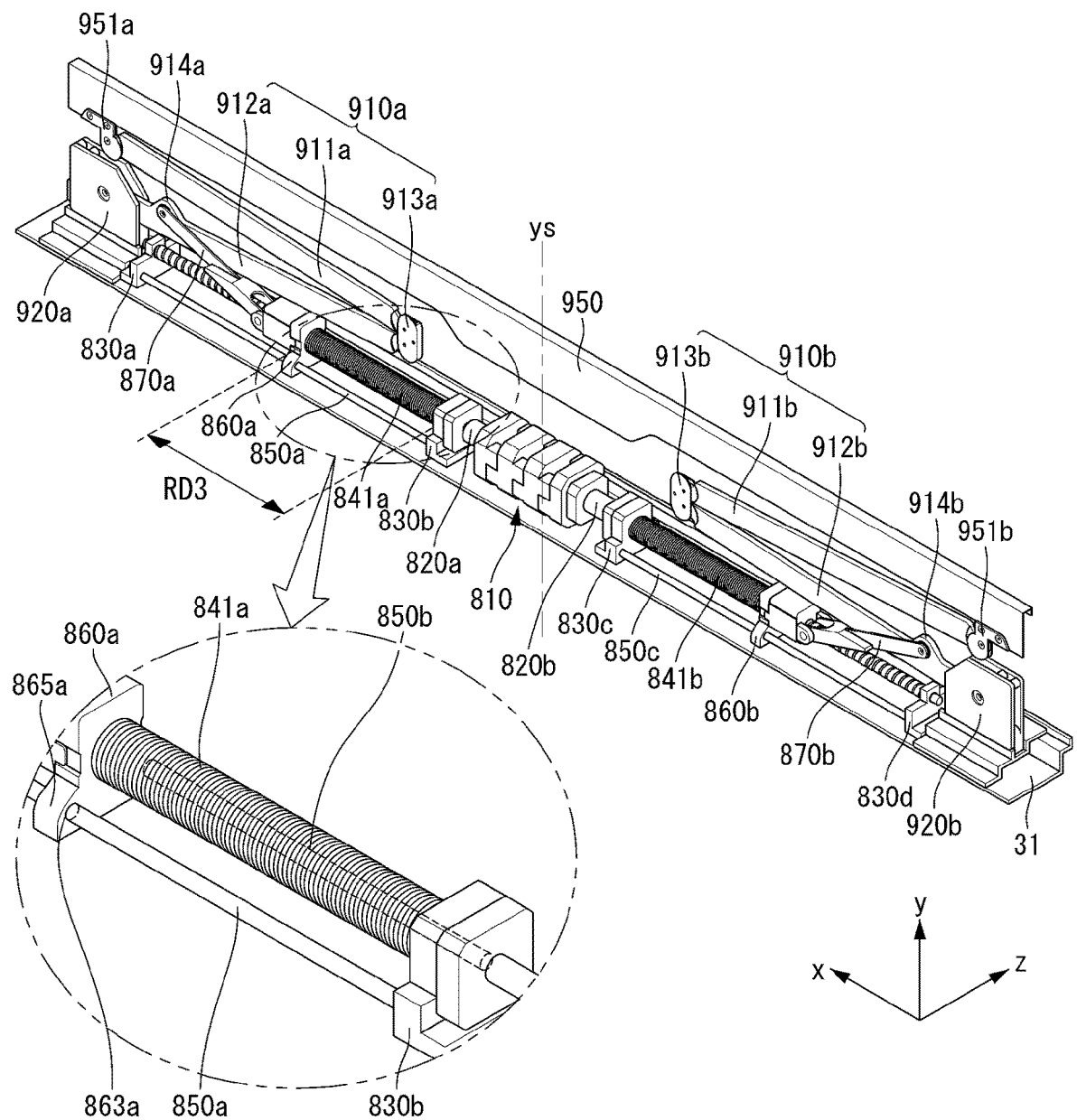

Referring to FIG. 48, a first spring 841a, 841b may be inserted into the lead screw 840a, 840b. Alternatively, the lead screw 840a, 840b may penetrate the first spring 841a, 841b. The first spring 841a, 841b may include a first right spring 841a disposed in the right side of the motor assembly 810 and a first left spring 841b disposed in the left side of the motor assembly 810.

The first right spring 841a may be disposed between the right slider 860a and the second right bearing 830b. One end of the first right spring 841a may contact or be separated from the right slider 860a. The other end of the first right spring 841a may contact or be separated from the second right bearing 830b.

When the second arm 912a lies completely with respect to the base 31, the distance between the right slider 860a and the second right bearing 830b may be a distance RD3. The first right spring 841a may have a length larger than the distance RD3 in a compressed or untensioned state. Thus, when the second arm 912a lies completely with respect to the base 31, the first right spring 841a can be compressed between the right slider 860a and the second right bearing 830b. In addition, the first right spring 841a may provide restoring force to the right slider 860a in the +x-axis direction.

When the second arm 912a changes from a completely lying state to a standing state with respect to the base 31, the restoring force provided by the first right spring 841a may assist the second arm 912a to stand up. As the first right spring 841a assists the second arm 912a to stand up, the load on the motor assembly 810 may be reduced.

The lead screw 840a, 840b may be driven by a single motor assembly 810. The lead screw 840a, 840b is driven by a single motor assembly 810, so that the second arm 912a, 912b can stand symmetrically. However, when the lead screw 840a, 840b is driven by a single motor assembly 810, a load applied to the motor assembly 810 to stand the second arm 912a, 912b may be excessively increased. At this time, the first right spring 841a assists the second arm 912a to stand, so that the load on the motor assembly 810 may be reduced, and the load applied to the motor assembly 810 to stand the second arm 912a, 912b may be reduced.

Alternatively, when the second arm 912a changes from a standing state to a completely lying state with respect to the base 31, the restoring force provided by the first right spring 841a can alleviate an impact generated when the second arm 912a lies on the base 31. That is, the first right spring 841a may serve as a damper when the second arm 912a lies on the base 31. As the first right spring 841a serves as a damper, the load on the motor assembly 810 may be reduced.

The structure formed by the first left spring 841b, the left bearing 830a, 830b, 830c, 830d, the left slider 860b, the left lead screw 840b, and the second arm 912a may be symmetrical with The structure formed by the above-described first right spring 841a, right bearing 830a, 830b, 830c, 830d, right slider 860a, right lead screw 840a, and second arm 912a. In this case, the axis of symmetry may be the axis of symmetry ys of the motor assembly 810.

Figure 49:
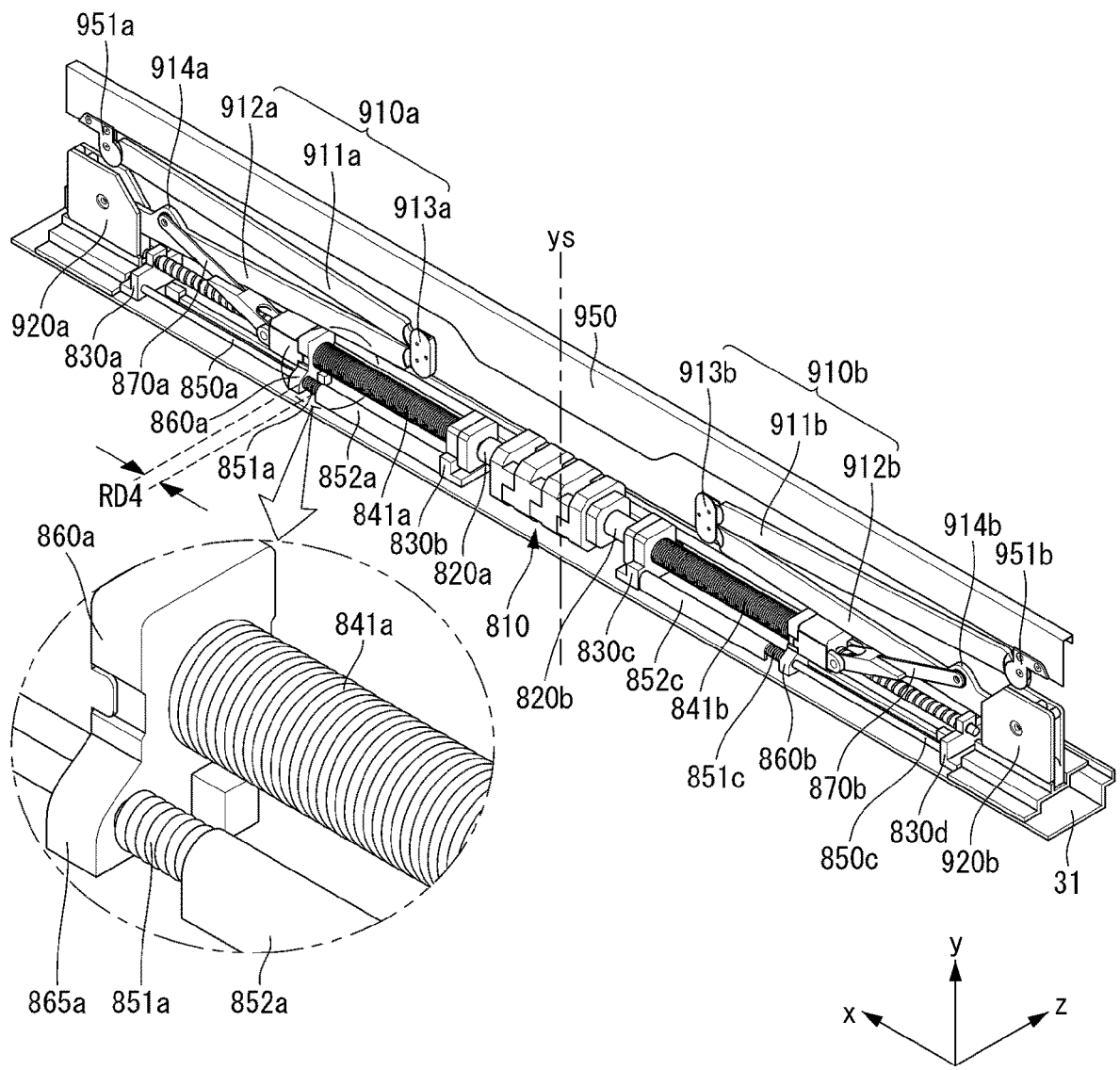

Referring to FIG. 49, a second spring 851a, 851b may be inserted into the guide 850a, 850b, 850c, 850d. Alternatively, the guide 850a, 850b, 850c, 850d may penetrate the second spring 851a, 851b. The second spring 851a, 851b may include a second right spring 851a disposed in the right side of the motor assembly 810 and a second left spring 851b disposed in the left side of the motor assembly 810.

There may be a plurality of second right springs 851a. The second right spring 851a may include a spring 940a, 940b inserted into the first right guide 850a and a spring 940a, 940b inserted into the second right guide 850b. Alternatively, the second right spring 851a may include a spring 940a, 940b through which the first right guide 850a passes and a spring 940a, 940b through which the second right guide 850b passes.

The guide 850a, 850b, 850c, 850d may include a locking jaw 852a, 852b. The locking jaw 852a, 852b may include a right locking jaw 852a disposed in the right side of the motor assembly 810 and a left locking jaw 852b disposed in the left side of the motor assembly 810.

The right locking jaw 852a may be disposed between the right slider 860a and the second right bearing 830b. In addition, the second right spring 851a may be disposed between the right slider 860a and the second right bearing 830b. One end of the second right spring 851a may contact or be separated from the right slider 860a. The other end of the second right spring 851a may contact or be separated from the right locking jaw 852a.

When the second arm 912a lies completely with respect to the base 31, the distance between the right slider 860a and the right locking jaw 852a may be a distance RD4. The second right spring 851a may have a length larger than the distance RD4 in a compressed or non-tensioned state. Accordingly, when the second arm 912a lies completely with respect to the base 31, the second right spring 851a may be compressed between the right slider 860a and the right locking jaw 852a. In addition, the second right spring 851a may provide restoring force to the right slider 860a in the +x-axis direction.

When the second arm 912a changes from a completely lying state to a standing state with respect to the base 31, the restoring force provided by the second right spring 851a may assist the second arm 912a to stand up. As the second right spring 851a assists the second arm 912a to stand, the load on the motor assembly 810 may be reduced.

The lead screw 840a, 840b may be driven by a single motor assembly 810. The lead screw 840a, 840b may be driven by a single motor assembly 810, so that the second arm 912a, 912b can stand symmetrically. However, when the lead screw 840a, 840b is driven by a single motor assembly 810, the load applied to the motor assembly 810 in order to stand the second arm 912a, 912b may be excessively increased. At this time, the second right spring 851a assists the second arm 912a to stand, so that the load on the motor assembly 810 can be reduced, and the load applied to the motor assembly 810 in order to stand the second arm 912a, 912b may be reduced.

Alternatively, when the second arm 912a changes from a standing state to a completely lying state with respect to the base 31, the restoring force provided by the second right spring 851a may alleviate an impact generated when the second arm 912a lies on the base 31. That is, the second right spring 851a may serve as a damper when the second arm 912a lies on the base 31. As the second right spring 851a serves as a damper, the load on the motor assembly 810 may be reduced.

The structure formed by the second left spring 851b, the left locking jaw 852b, the left slider 860b, the left guide 850c, 850d, and the second arm 912a may be symmetrical with the structure formed by the above-described second right spring 851a, right locking jaw 852a, right slider 860a, right guide 850a, 850b, and second arm 912a. In this case, the axis of symmetry may be the axis of symmetry ys of the motor assembly 810.

Figure 50:
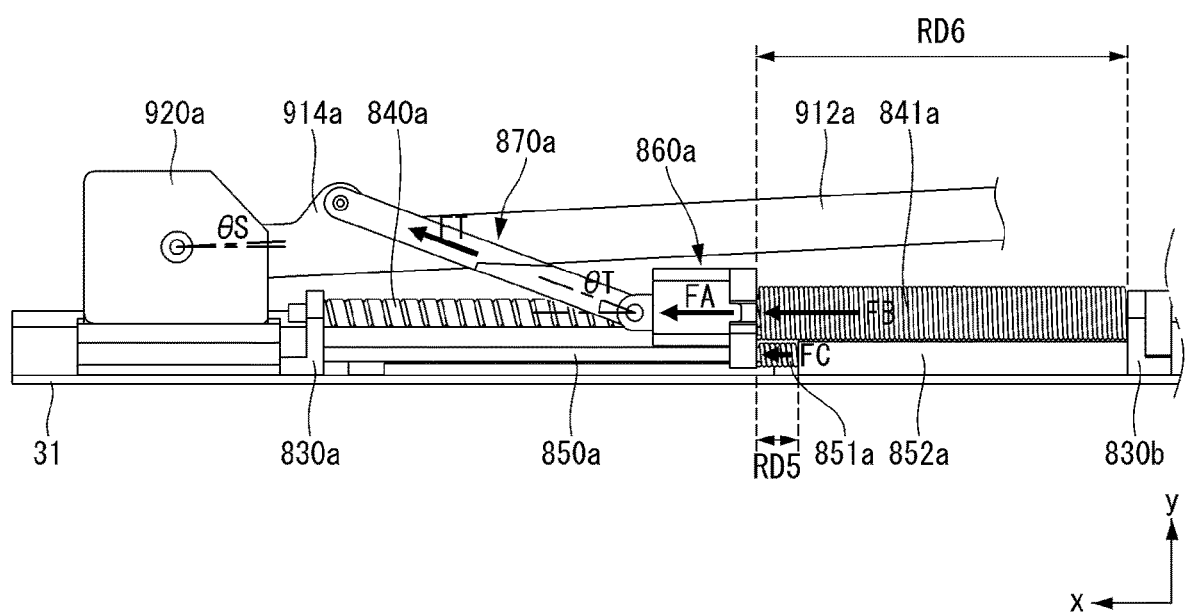
Figure 51:
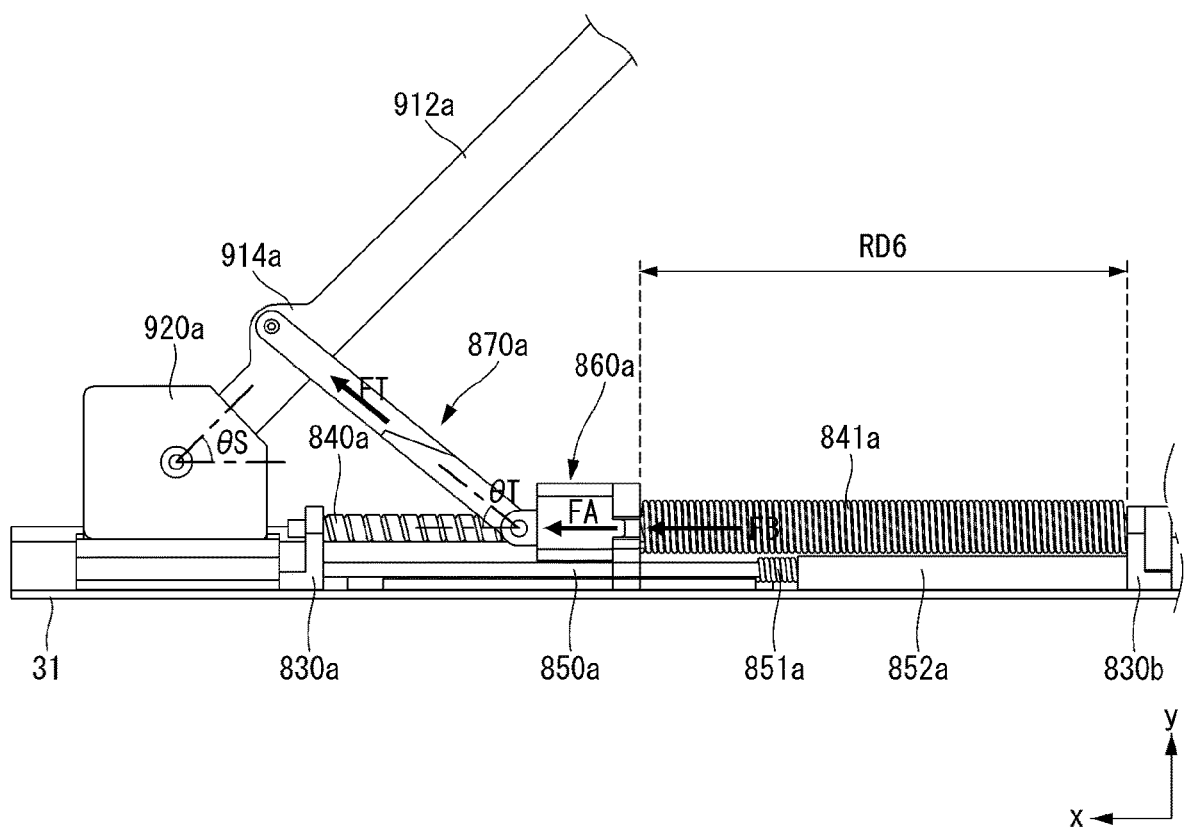
Figure 52:
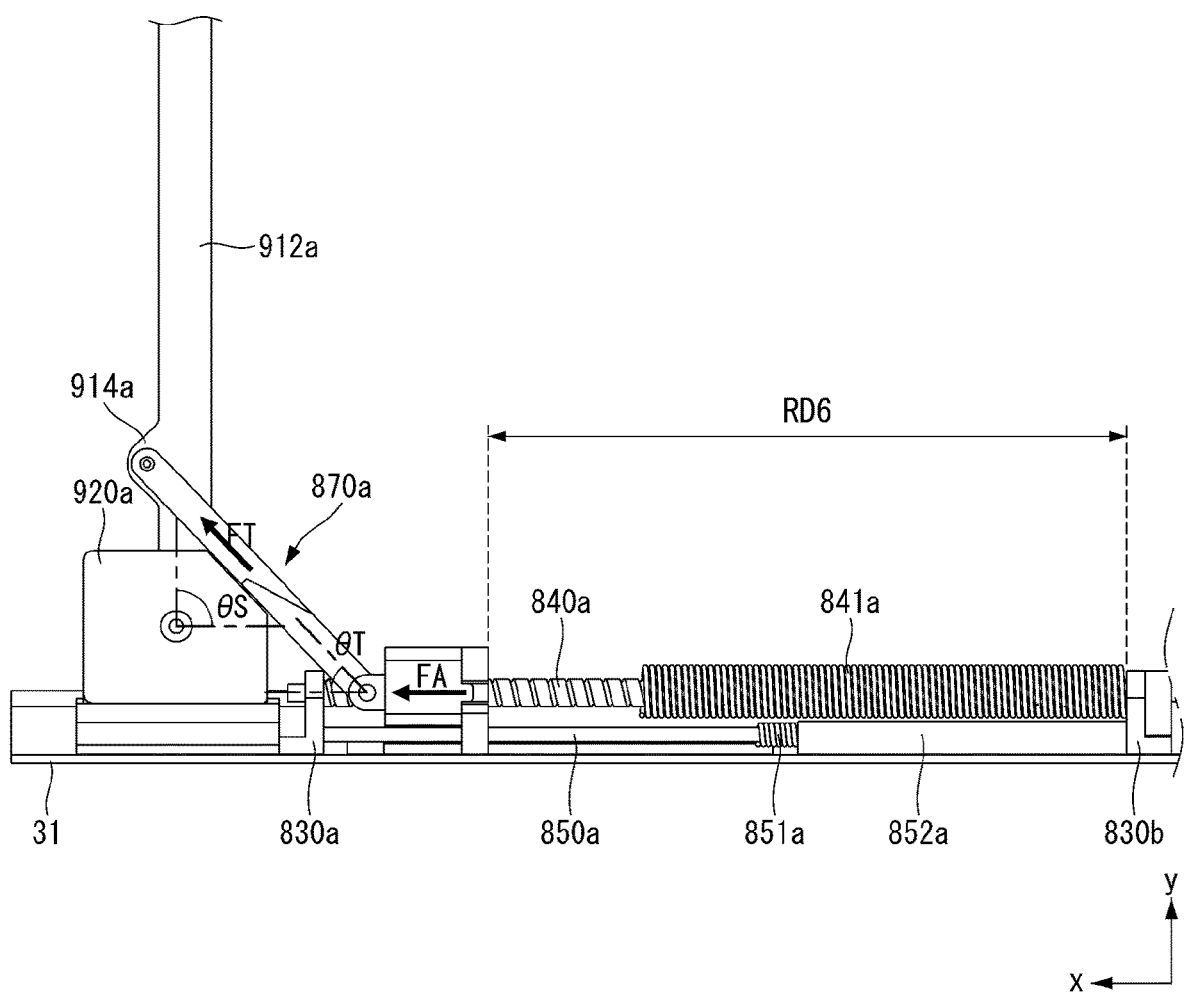

Referring to FIGS. 50 to 52, the second arm 912a may stand up by receiving restoring force from the first right spring 841a and the second right spring 851a.

An angle between the second arm 912a and the base 31 may be referred to as an angle theta S. An angle between the right rod 870a and the base 31 may be referred to as an angle theta T. A force by which the motor assembly 810 moves the right slider 860a in the +x-axis direction may be referred to as FA. A force applied by the first right spring 841a to the right slider 860a may be referred to as FB. A force applied by the second right spring 851a to the right slider 860a may be referred to as FC. A force transmitted by the right rod 870a to the second arm 912a may be referred to as FT.

When the second arm 912a lies completely with respect to the base 31, the angle theta S and the angle theta T may have a minimum value. When the second arm 912a changes from a completely lying state to a standing state with respect to the second base 31, the angle theta S and the angle theta T may gradually increase.

When the second arm 912a lies completely with respect to the base 31, the first right spring 841a may be compressed. The compressed first right spring 841*a* may provide restoring force FB to the right slider 860*a*. The restoring force FB may act in the +x direction. When the second arm 912*a* lies completely with respect to the base 31, the compression displacement of the first right spring 841*a* may be maximum, and the magnitude of the restoring force FB may have a maximum value. When the second arm 912*a* changes from a completely lying state to a standing state with respect to the base 31, the compression displacement of the first right spring 841*a* may gradually decrease, and the magnitude of the restoring force FB may gradually decrease.

When the second arm 912*a* lies completely with respect to the base 31, the second right spring 851*a* may be compressed. The compressed second right spring 851*a* may provide restoring force FC to the right slider 860*a*. The restoring force FC may act in the +x direction. When the second arm 912*a* lies completely with respect to the base 31, the compression displacement of the second right spring 851*a* may be maximum, and the magnitude of the restoring force FC may have a maximum value. When the second arm 912*a* changes from a completely lying state to a standing state with respect to the base 31, the compression displacement of the second right spring 851*a* may gradually decrease, and the magnitude of the restoring force FC may gradually decrease.

The force FT transmitted by the right rod 870*a* to the second arm 912*a* may be the resultant force of the force FA by which the motor assembly 810 moves the right slider 860*a* in the +x axis, the restoring force FB of the first right spring 841*a*, and the restoring force FC of the second right spring 851*a*.

When the second arm 912*a* starts to stand up in a state where the second arm 912*a* lies completely with respect to the base 31, the load on the motor assembly 810 may be maximum. At this time, the magnitude of the restoring force FB provided by the first right spring 841*a* may be maximum. In addition, the magnitude of the restoring force FC provided by the second spring 851*a*, 851*b* may be maximum.

When the second arm 912*a* changes from a completely lying state to a standing state with respect to the base 31, the restoring force provided by the first right spring 841*a* and the second right spring 851*a* may assist the second arm 912*a* to stand up. As the first right spring 841*a* and the second right spring 851*a* assist the second arm 912*a* to stand up, the load on the motor assembly 810 may be reduced.

The first right spring 841*a* and the second right spring 851*a* may simultaneously provide a restoring force (the resultant force of the restoring force FB and the restoring force FC) to the right slider 860*a*. The restoring force (the resultant force of the restoring force FB and the restoring force FC) may be provided to the right slider 860*a* until the distance RD5 between the right slider 860*a* and the right locking jaw 852*a* becomes equal to the length of the second right spring 851*a*.

When the distance RD5 between the right slider 860*a* and the right locking jaw 852*a* becomes equal to the length of the second right spring 851*a*, the compression displacement of the second right spring 851*a* may be zero. When the compression displacement of the second right spring 851*a* becomes zero, the restoring force FC provided by the second right spring 851*a* to the right slider 860*a* may become zero.

When the distance RD5 between the right slider 860*a* and the right locking jaw 852*a* is larger than the length of the second right spring 851*a*, only the first right spring 841*a* may provide the restoring force FB to the right slider 860*a*. The restoring force FB may be applied to the right slider 860*a* until the distance RD6 between the right slider 860*a* and the second right bearing 830*b* becomes equal to the length of the first right spring 841*a*.

When the distance RD6 between the right slider 860*a* and the second right bearing 830*b* is equal to the length of the first right spring 841*a*, the compression displacement of the first right spring 841*a* may be zero. When the compression displacement of the first right spring 841*a* becomes zero, the restoring force FB provided by the first right spring 841*a* to the right slider 860*a* may become zero.

When the distance RD6 between the right slider 860*a* and the second right bearing 830*b* is larger than the length of the first right spring 841*a*, the motor assembly 810 may stand the second arm 912*a* without receiving a restoring force from the first right spring 841*a* or the second right spring 851*a*.

The structure formed by the first left spring 841*b*, the second left spring 851*b*, the left locking jaw 852*b*, the left slider 860*b*, the left guide 850*c*, 850*d*, the left lead screw 840*b*, the left rod 870*b*, and the second arm 912*a* may be symmetrical with the structure formed by the above described first right spring 841*a*, second right spring 851*a*, right locking jaw 852*a*, right slider 860*a*, right guide 850*a*, 850*b*, right lead screw 840*a*, right rod 870*a*, and the second arm 912*a*. In this case, the axis of symmetry may be the axis of symmetry ys of the motor assembly 810.

Figure 53:
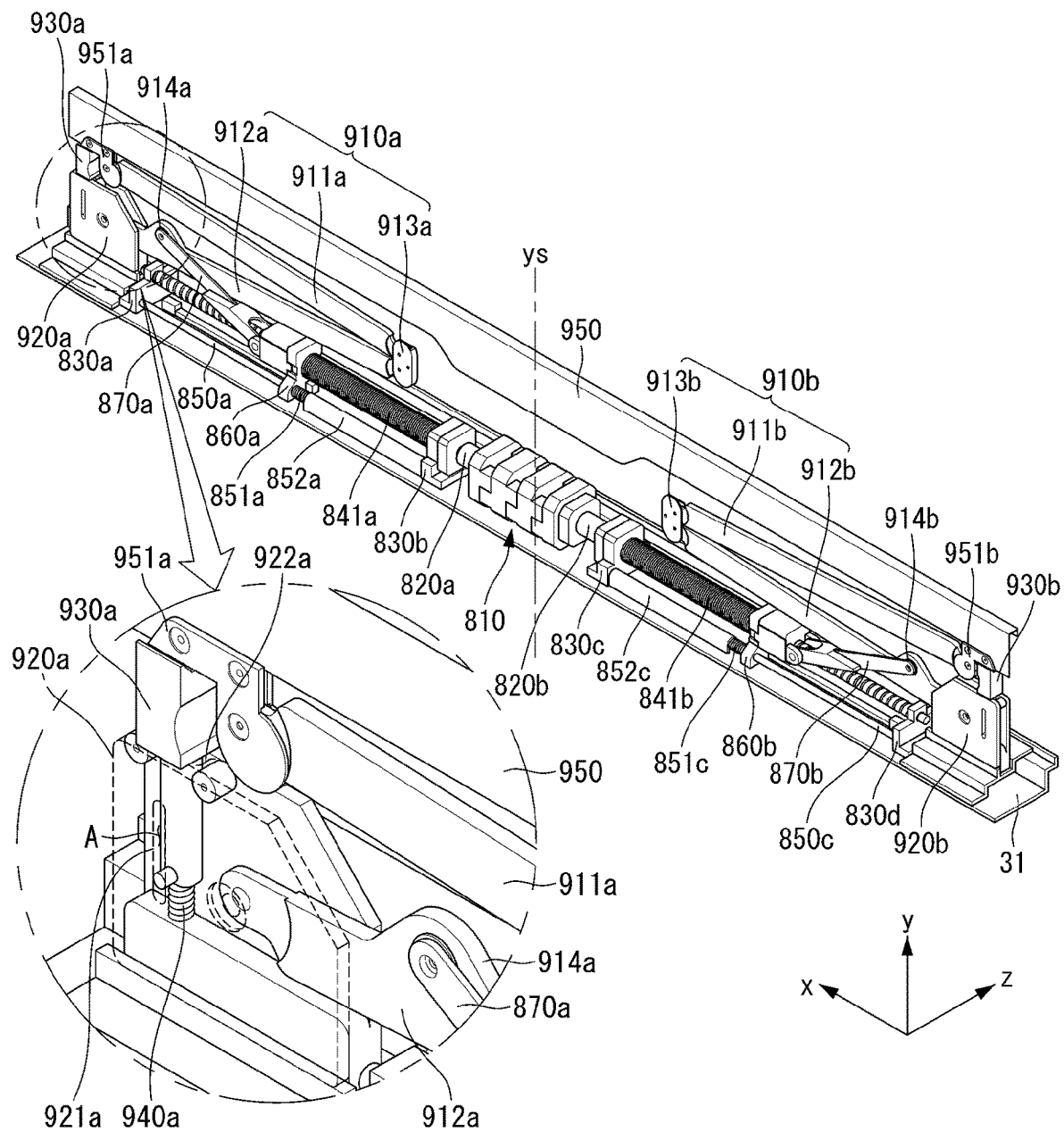

Referring to FIG. 53, a pusher 930*a*, 930*b* may be connected to the link mount 920*a*, 920*b*. The pusher 930*a*, 930*b* may include a right pusher 930*a* disposed in the right side of the motor assembly 810 and a left pusher 930*b* disposed in the left side of the motor assembly 810.

The link mount 920*a*, 920*b* may form an accommodation space A. The accommodation space A may accommodate the spring 940*a*, 940*b* and the pusher 930*a*, 930*b*. The spring 940*a*, 940*b* may include a right spring 940*a* disposed in the right side of the motor assembly 810 and a left spring 940*b* disposed in the left side of the motor assembly 810. The accommodation space A may also be referred to as an inner space A.

The link mount 920*a*, 920*b* may include a first hole 922*a* connecting the accommodation space A and an external space (the first hole corresponding to 920*b* is not shown). The first hole 922*a* may be formed on upper surfaces of the link mount 920*a*, 920*b*. The first hole 922*a* may also be referred to as a hole 922*a*.

The pusher 930*a*, 930*b* may be located perpendicular to the base 31. Alternatively, the pusher 930*a*, 930*b* may be disposed parallel to the y-axis. The spring 940*a*, 940*b* may be located perpendicular to the base 31. Alternatively, the spring 940*a*, 940*b* may be disposed parallel to the y-axis.

The pusher 930*a*, 930*b* may include a first part 931*a* and 931*b* and a second part 932*a*, 932*b*. The second part 932*a*, 932*b* may be connected to the lower side of the first part 931*a*, 931*b*. The lower end of the second part 932*a*, 932*b* may be connected to the spring 940*a*, 940*b*. All or part of the second part 932*a*, 932*b* may be accommodated in the accommodation space A formed by the link mount 920*a*, 920*b*. The second part 932*a*, 932*b* may have the same diameter as the first hole 922*a* or a smaller diameter than the first hole 922*a*. The second part 932*a*, 932*b* may penetrate the first hole 922*a*.

The first part 931*a*, 931*b* may be located outside the link mount 920*a*, 920*b*. Alternatively, the first part 931*a*, 931*b* may be located outside the accommodation space A of the link mount 920*a*, 920*b*. The first part 931*a*, 931*b* may have a larger diameter than the diameter of the first hole 922*a*.

The first part 931*a*, 931*b* may contact or be separated from the link bracket 951*a*, 951*b*. For example, when the second arm 912a, 912b lies completely on the base 31, the first part 931a, 931b may come into contact with the link bracket 951a, 951b. Alternatively, when the second arm 912a, 912b stands completely on the base 31, the first part 931a, 931b may be spaced apart from the link bracket 951a, 951b.

When the first part 931a, 931b contacts the link bracket 951a, 951b, the pusher 930a, 930b may receive force from the link bracket 951a, 951b. The force received by the pusher 930a, 930b may be in a downward direction. Alternatively, the force received by the pusher 930a, 930b may be in the −y axis direction. Alternatively, the link bracket 951a, 951b may press the pusher 930a, 930b. A direction in which the link bracket 951a, 951b presses the pusher 930a, 930b may be in a downward direction. Alternatively, the direction in which the link bracket 951a, 951b presses the pusher 930a, 930b may be in the −y axis direction.

When the first part 931a, 931b receives a force, the spring 940a, 940b may be compressed. The compressed spring 940a, 940b may provide restoring force to the pusher 930a, 930b. The restoring force may be opposite to the direction of the force applied to the first part 931a, 931b. Alternatively, the restoring force may act in the +y-axis direction.

The link mount 920a, 920b may include a second hole 921a (the second hole corresponding to 920b is not shown). The second hole 921a may connect the accommodation space A and the external space. All or part of the spring 940a, 940b may be exposed to the outside through the second hole 921a. All or part of the pusher 930a, 930b may be exposed to the outside through the second hole 921a. When maintaining or repairing the display device, the service provider may check the operating state of the pusher 930a, 930b through the second hole 921a. The second hole 921a may provide a service provider with convenience in maintenance or repair.

Figure 54:
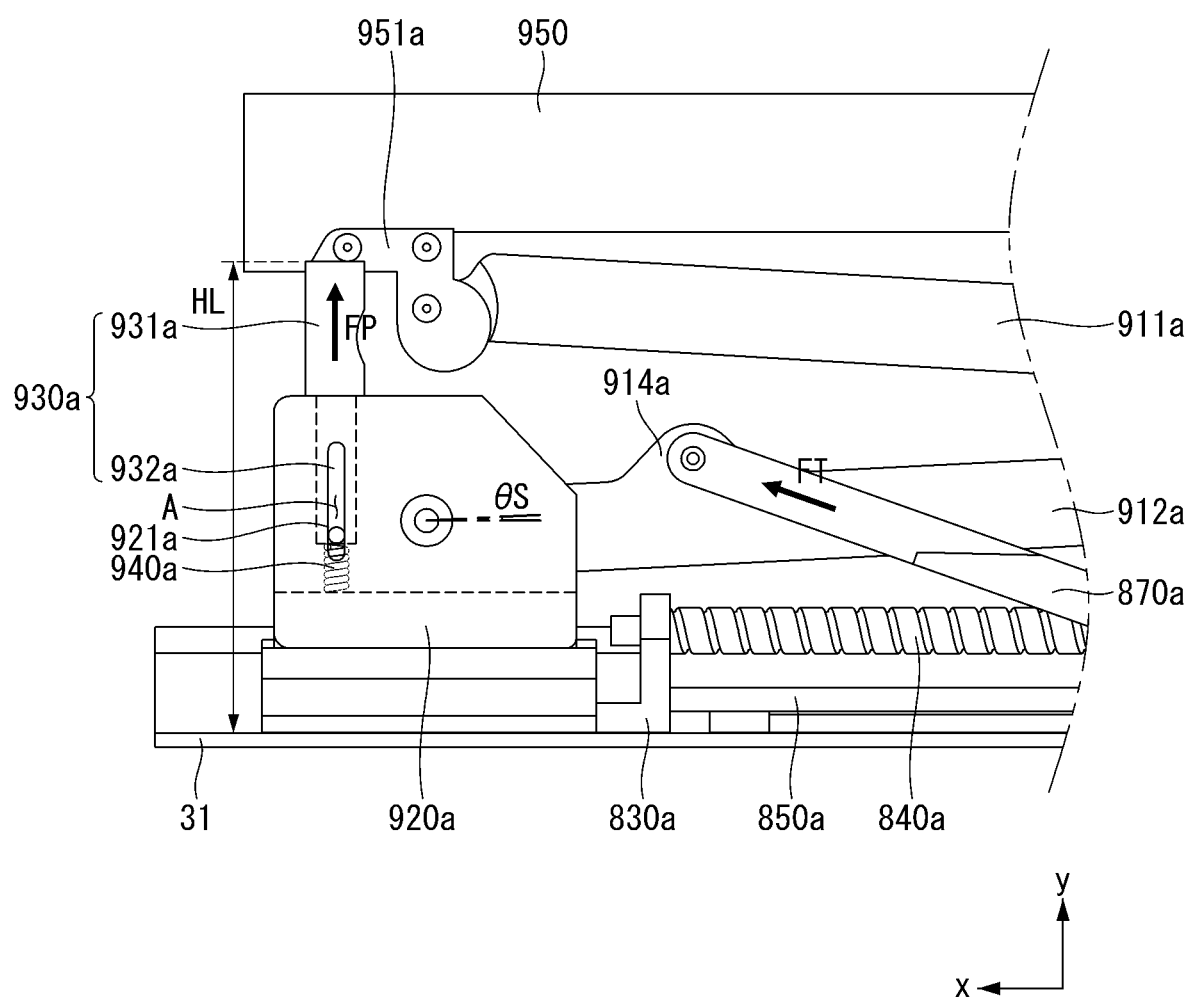
Figure 55:
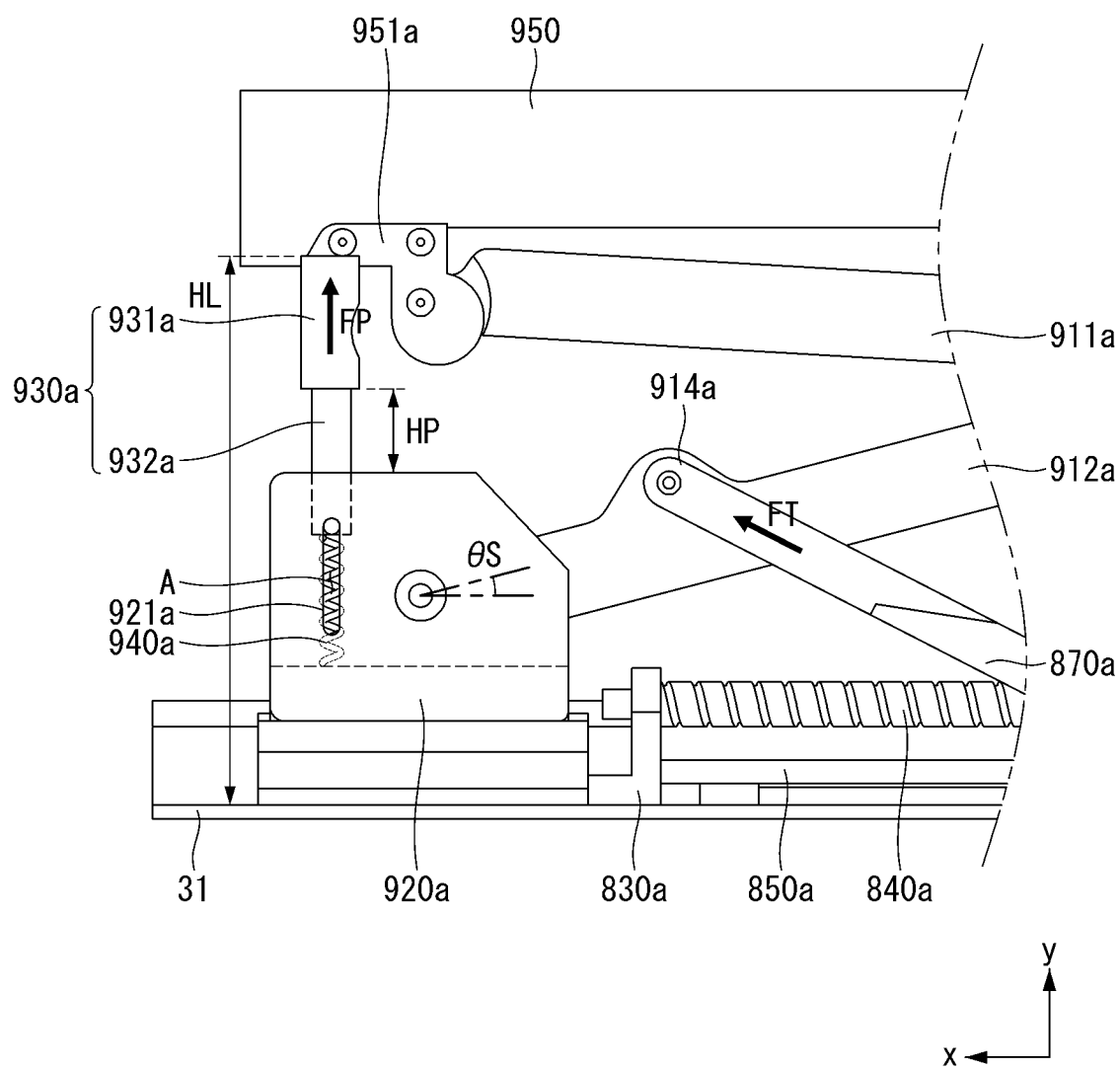
Figure 56:
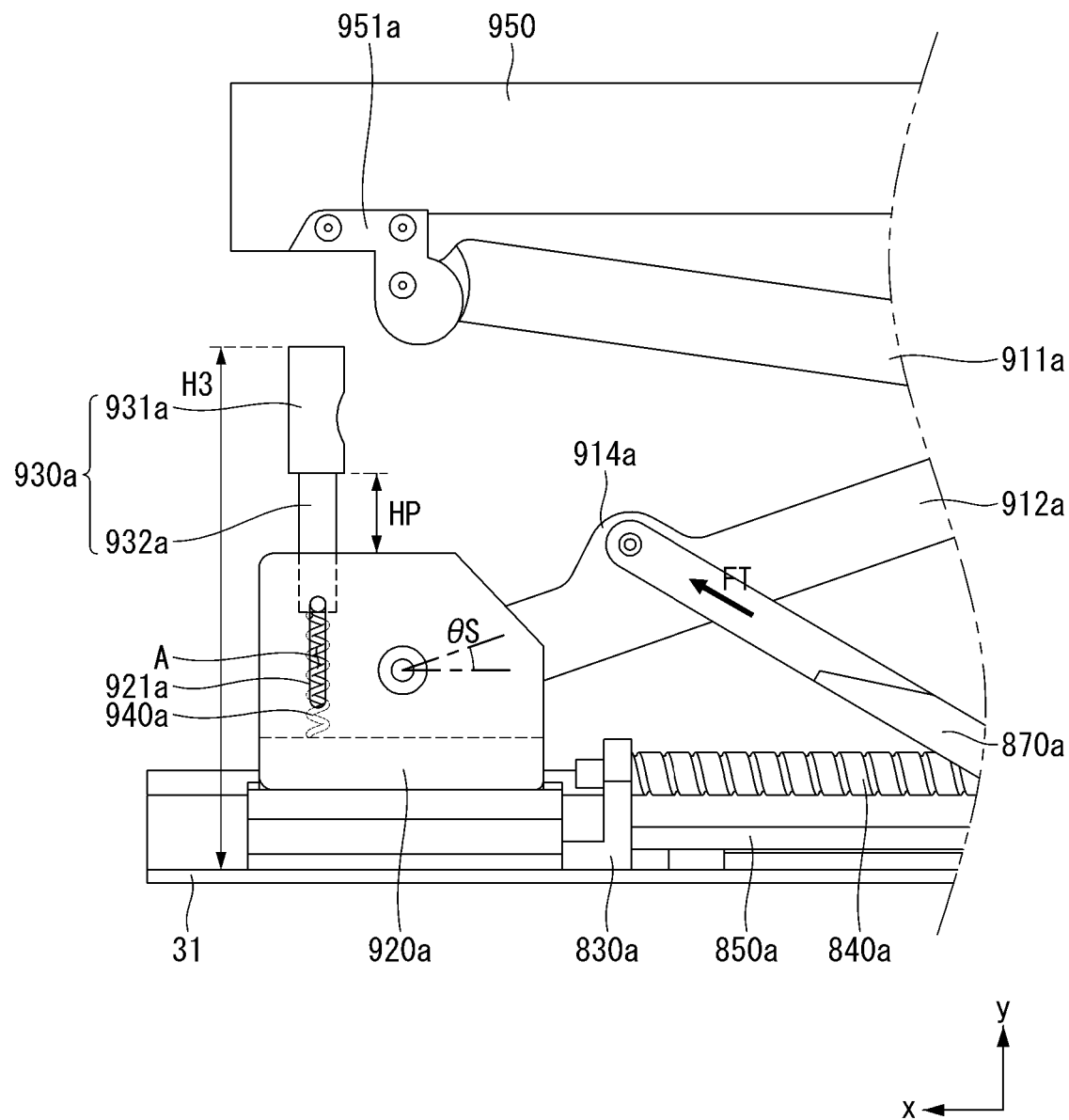

Referring to FIGS. 54 to 56, the right link 910a may stand up by receiving the restoring force from the right pusher 930a. It will be described based on the right link 910a.

An angle between the second arm 912a and the base 31 may be referred to as an angle theta S. A force transmitted by the right rod 870a to the second arm 912a may be referred to as FT. A force transmitted by the right pusher 930a to the right link bracket 951a may be referred to as FP.

Referring to FIG. 54, when the second arm 912a lies completely with respect to the base 31, the angle theta S may have a minimum value. The right spring 940a connected to the right pusher 930a may be maximally compressed, and the restoring force FP may have a maximum value. The compressed right spring 940a may provide restoring force FP to the right pusher 930a. The right pusher 930a may transfer the restoring force FP to the right link bracket 951a. The restoring force FP may act in the +y-axis direction.

When the second arm 912a lies completely with respect to the base 31, the distance HL from the base 31 to the upper end of the right pusher 930a may have a minimum value. The first part 931a of the right pusher 930a may protrude to the outside of the right link mount 920a, and all the second part 932a of the right pusher 930a may be accommodated in an accommodation space 923a of the right link mount 920a.

Referring to FIG. 55, when the second arm 912a changes from a completely lying state to a standing state with respect to the base 31, the angle theta S may gradually increase. The compression displacement of the right spring 940a may gradually decrease, and the magnitude of the restoring force FP may gradually decrease.

As the angle theta S gradually increases, at least a part of the second part 932a of the right pusher 930a may protrude to the outside of the right link mount 920a. The length of the second part 932a of the right pusher 930a protruding to the outside of the right link mount 920a may be referred to as a length HP. The distance HL from the base 31 to the upper end of the right pusher 930a may increase by HP compared to a case where the second arm 912a lies completely with respect to the base 31.

Referring to FIG. 56, when the second arm 912a stands up with respect to the base 31, the right pusher 930a and the right link bracket 951a may be separated from each other. The compression displacement of the right spring 940a may be zero. When the compression displacement of the right spring 940a becomes zero, the restoring force FP provided by the right pusher 930a to the right link bracket 951a may become zero.

In addition, the length HP of the second part 932a of the right pusher 930a protruding to the outside of the right link mount 920a may have a maximum value. Further, the distance HL from the base 31 to the upper end of the right pusher 930a may have a maximum value.

That is, the right pusher 930a may apply a restoring force to the right link bracket 951a while the right pusher 930a and the right link bracket 951a contact each other, thereby assisting the second arm 912a to stand up, and reducing the load of the motor assembly 810.

The lead screw 840a, 840b may be driven by a single motor assembly 810. As the lead screw 840a, 840b is driven by a single motor assembly 810, the second arm 912a, 912b can stand symmetrically. However, when the lead screw 840a, 840b is driven by a single motor assembly 810, the load applied to the motor assembly 810 in order to stand the second arm 912a, 912b may be excessively increased. At this time, the right pusher 930a applies a restoring force to the right link bracket 951a, thereby assisting the second arm 912a to stand up and reducing the load on the motor assembly 810.

Alternatively, when the second arm 912a changes from a standing state to a completely lying state with respect to the base 31, the restoring force provided by the right pusher 930a to the right link bracket 951a may alleviate an impact generated when the link 910a lies with respect to the base 31. That is, the restoring force provided by the right pusher 930a to the right link bracket 951a may serve as a damper when the link 910a lies with respect to the base 31. As the right pusher 930a serves as a damper, the load on the motor assembly 810 may be reduced.

The structure formed by the left pusher 930b, the left spring 940b, the left link bracket 951b, the left link mount 920b, and the left rod 870b may be symmetrical with the structure formed by the above-described right pusher 930a, right spring 940a, right link bracket 951a, right link 910a mount, and right rod 870a. In this case, the axis of symmetry may be the axis of symmetry of the motor assembly 810.

Figure 57:
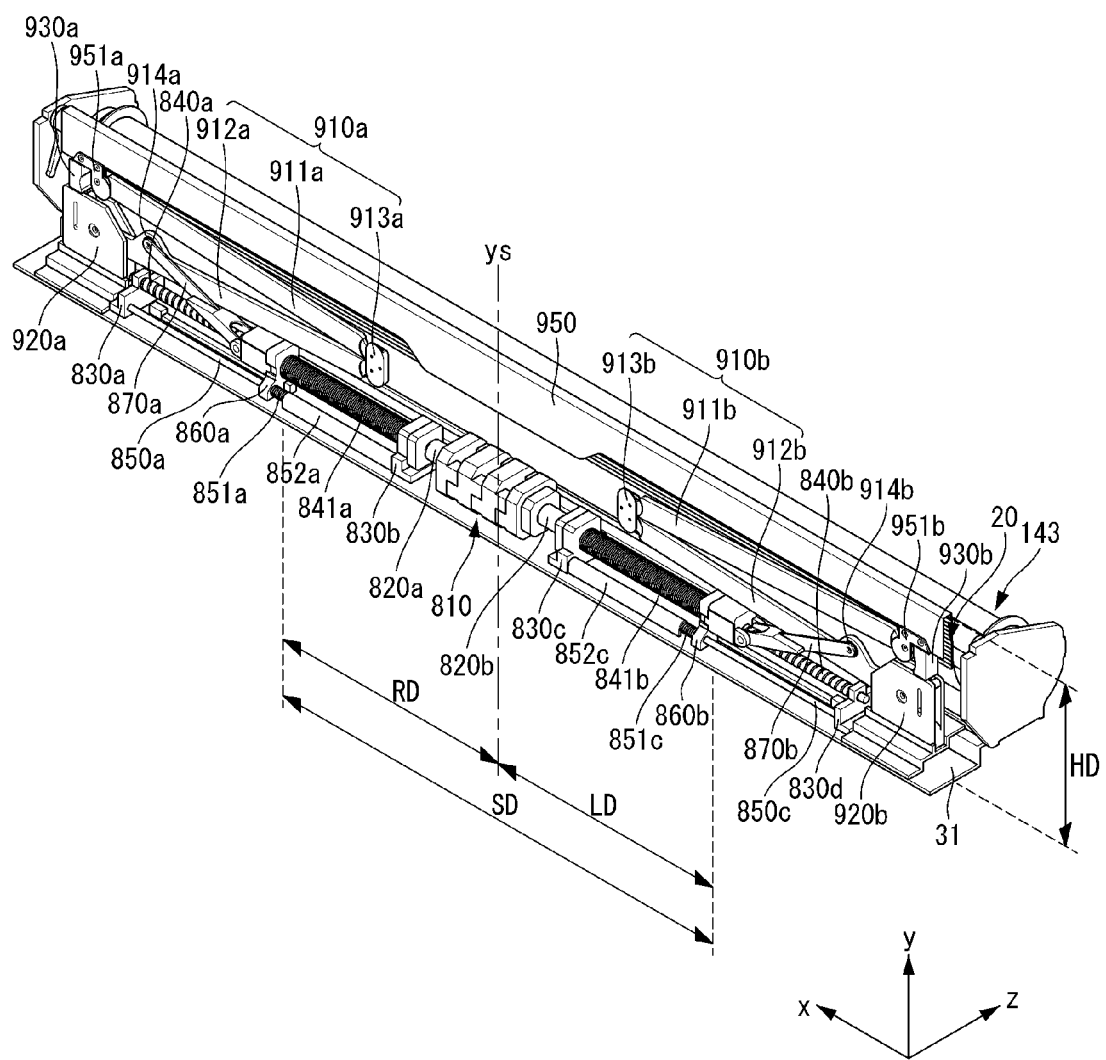
Figure 58:
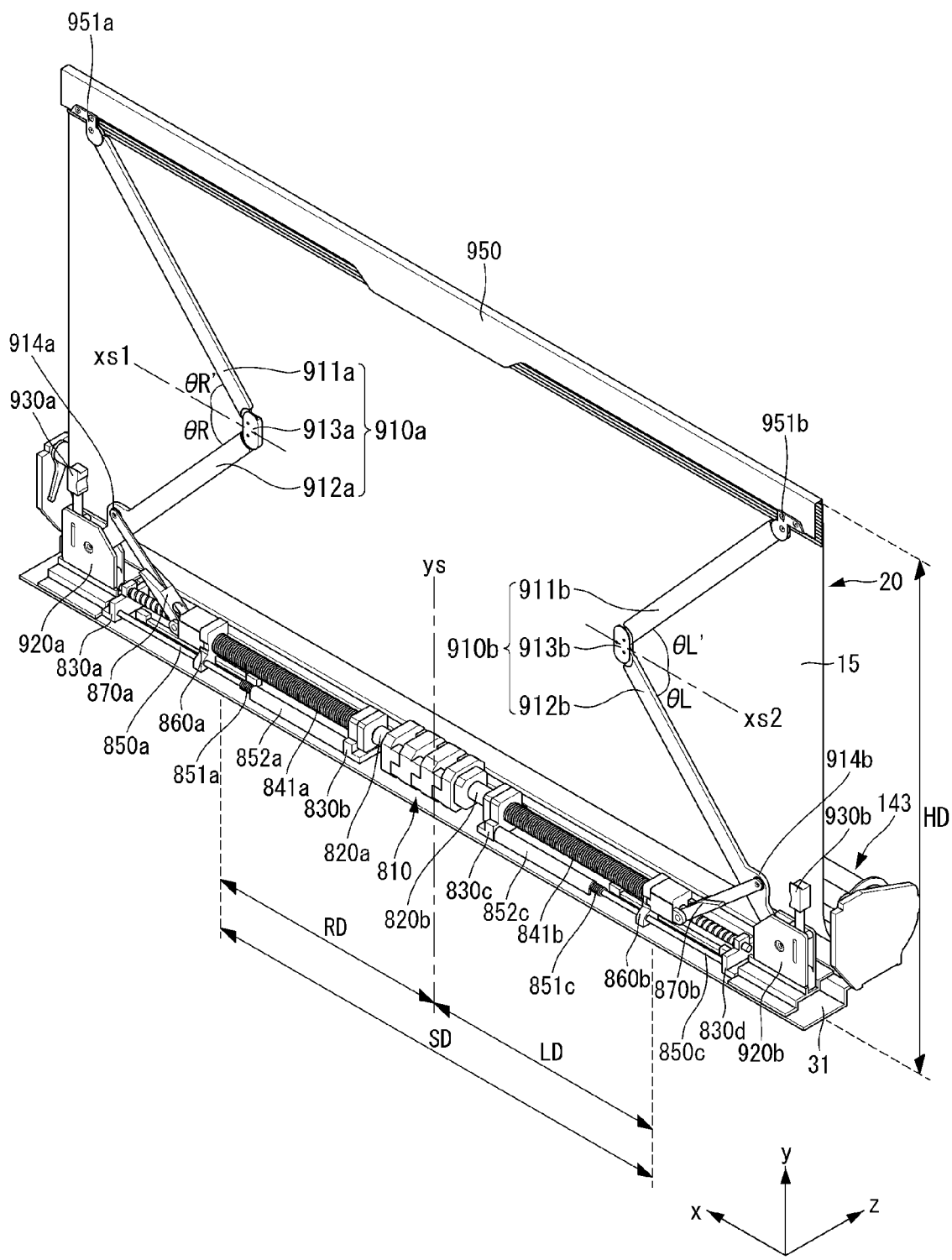
Figure 59:
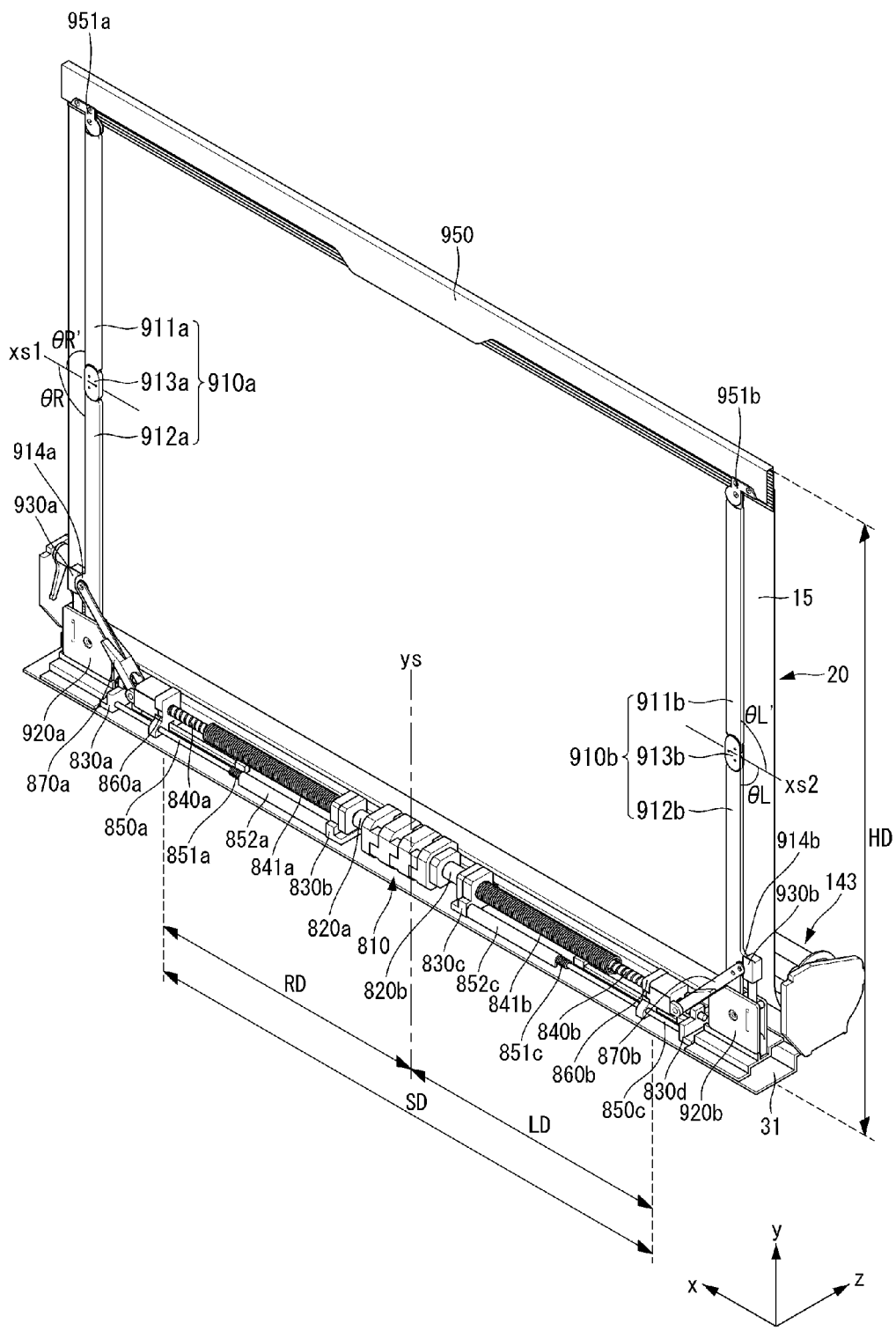

Referring to FIGS. 57 to 59, the panel roller 143 may be installed in the base 31. The panel roller 143 may be installed in front of the lead screw 840a, 840b. Alternatively, the panel roller 143 may be disposed parallel to the longitudinal direction of the lead screw 840a, 840b. Alternatively, the panel roller 143 may be spaced apart from the lead screw 840a, 840b.

The display unit 20 may include a display panel 10 and a module cover 15. The lower side of the display unit may be connected to the panel roller 143, and the upper side of the display unit 20 may be connected to the upper bar 75. The display unit 20 may be wound around or unwound from the panel roller 143.

The distance from the symmetry axis ys of the motor assembly 810 to the right slider 860*a* may be referred to as a distance RD. The distance from the symmetry axis ys of the motor assembly 810 to the left slider 860*b* may be referred to as a distance LD. The distance between the right slider 860*a* and the left slider 860*b* may be referred to as a distance SD. The distance SD may be the sum of the distance RD and the distance LD. The distance from the base 31 to the upper end of the display unit 20 may be referred to as a distance HD.

Referring to FIG. 57, when the second arm 912*a*, 912*b* lies completely with respect to the base 31, the distance SD between the right slider 860*a* and the left slider 860*b* may have a minimum value. The distance RD from the axis of symmetry ys of the motor assembly 810 to the right slider 860*a* may be equal to the distance LD from the axis of symmetry ys of the motor assembly 810 to the left slider 860*b*.

When the second arm 912*a*, 912*b* lies completely with respect to the base 31, the distance HD from the base 31 to the upper end of the display unit 20 may have a minimum value.

When the second arm 912*a*, 912*b* lies completely with respect to the base 31, the first spring 841*a*, 841*b* may contact the slider 860*a*, 860*b*. In addition, the second spring 851*a*, 851*b* may contact the slider 860*a*, 860*b*. In addition, the pusher 930*a*, 930*b* may contact the link bracket 951*a*, 951*b*.

When the second arm 912*a*, 912*b* lies completely with respect to the base 31, the compression amount of the first spring 841*a*, 841*b* may have a maximum value, and the magnitude of restoring force provided to the slider 860*a*, 860*b* by the first spring 841*a*, 841*b* may have a maximum value.

When the second arm 912*a*, 912*b* lies completely with respect to the base 31, the compression amount of the second spring 851*a*, 851*b* may have a maximum value, and the restoring force provided by the second spring 851*a*, 851*b* to the slider 860*a*, 860*b* may have a maximum value.

When the second arm 912*a*, 912*b* lies completely with respect to the base 31, the compression amount of the spring 940*a*, 940*b* may have a maximum value, and the magnitude of restoring force provided by the spring 940*a*, 940*b* to the pusher 930*a*, 930*b* may have a maximum value.

When the second arm 912*a*, 912*b* start to stand up with respect to the base 31, the second arm 912*a*, 912*b* may stand up by receiving restoring force from the first spring 841*a*, 841*b*, the second spring 851*a*, 851*b*, and the spring 940*a*, 940*b*. Thus, a load applied to the motor assembly 810 may be reduced.

Referring to FIG. 58, as the standing of the second arm 912*a*, 912*b* with respect to the base 31 progresses, the distance SD between the right slider 860*a* and the left slider 860*b* may gradually increase. Even if the distance SD increases, the distance LD and the distance RD may be equal to each other. That is, the right slider 860*a* and the left slider 860*b* may be located symmetrically based on the symmetry axis ys of the motor assembly 810.

In addition, the degree to which the second arm 912*a*, 912*b* of the right link 910*a* stands with respect to the base 31 and the degree to which the second arm 912*a*, 912*b* of the left link 910*b* stands with respect to the base 31 may be equal to each other.

As the standing of the second arm 912*a*, 912*b* with respect to the base 31 progresses, the distance HD from the base 31 to the upper end of the display unit 20 may gradually increase. The display unit 20 may be unwound from the panel roller 143. Alternatively, the display unit may be deployed from the panel roller 143.

When the second arm 912*a*, 912*b* stands up sufficiently with respect to the base 31, the first spring 841*a*, 841*b* may be separated from the slider 860*a*, 860*b*. In addition, when the second arm 912*a*, 912*b* stands up with respect to the base 31, the second spring 851*a*, 851*b* may be separated from the slider 860*a*, 860*b*. In addition, when the second arm 912*a*, 912*b* stands up with respect to the base 31, the pusher 930*a*, 930*b* may be separated from the link bracket 951*a*, 951*b*.

The separation of the first spring 841*a*, 841*b* from the slider 860*a*, 860*b*, the separation of the second spring 851*a*, 851*b* from the slider 860*a*, 860*b*, and the separation of the pusher 930*a*, 930*b* from the link bracket 951*a*, 951*b* may progress independently of each other. That is, the order of the separation of the first spring 841*a*, 841*b* from the slider 860*a*, 860*b*, the separation of the second spring 851*a*, 851*b* from the slider 860*a*, 860*b*, and the separation of the pusher 930*a*, 930*b* from the link bracket 951*a*, 951*b* may be mutually variable.

An angle formed between an axis xs1 parallel to the base 31 and the second arm 912*a* may be referred to as theta R. In addition, an angle formed between an axis xs1 parallel to the base 31 and the first arm 911*a* may be referred to as theta R'. The axis xs1 and the x-axis may be parallel.

When the second arm 912*a* lies completely with respect to the base 31, or while the second arm 912*a* is standing up with respect to the base 31, or when the second arm 912*a* completes a standing with respect to the base 31, theta R and theta R' may be maintained the same.

An angle formed by an axis xs2 parallel to the base 31 and the second arm 912*b* may be referred to as theta L. In addition, an angle formed between an axis xs2 parallel to the base 31 and the first arm 911*b* may be referred to as theta L'. The axis xs2 and the x-axis may be parallel.

When the second arm 912*b* lies completely with respect to the base 31, or while the second arm 912*b* is standing up with respect to the base 31, or when the second arm 912*a* completes a standing with respect to the base 31, theta L and theta L' may be maintained the same.

The axis xs1 and the axis xs2 may be the same axis.

Referring to FIG. 59, when the second arm 912*a*, 912*b* stands completely with respect to the base 31, the distance SD between the right slider 860*a* and the left slider 860*b* may have a maximum value. Even when the distance SD is maximum, the distance LD and the distance RD may be equal to each other. When the second arm 912*a*, 912*b* stands completely with respect to the base 31, the distance HD from the base 31 to the upper end of the display unit 20 may have a maximum value.

Figure 60:
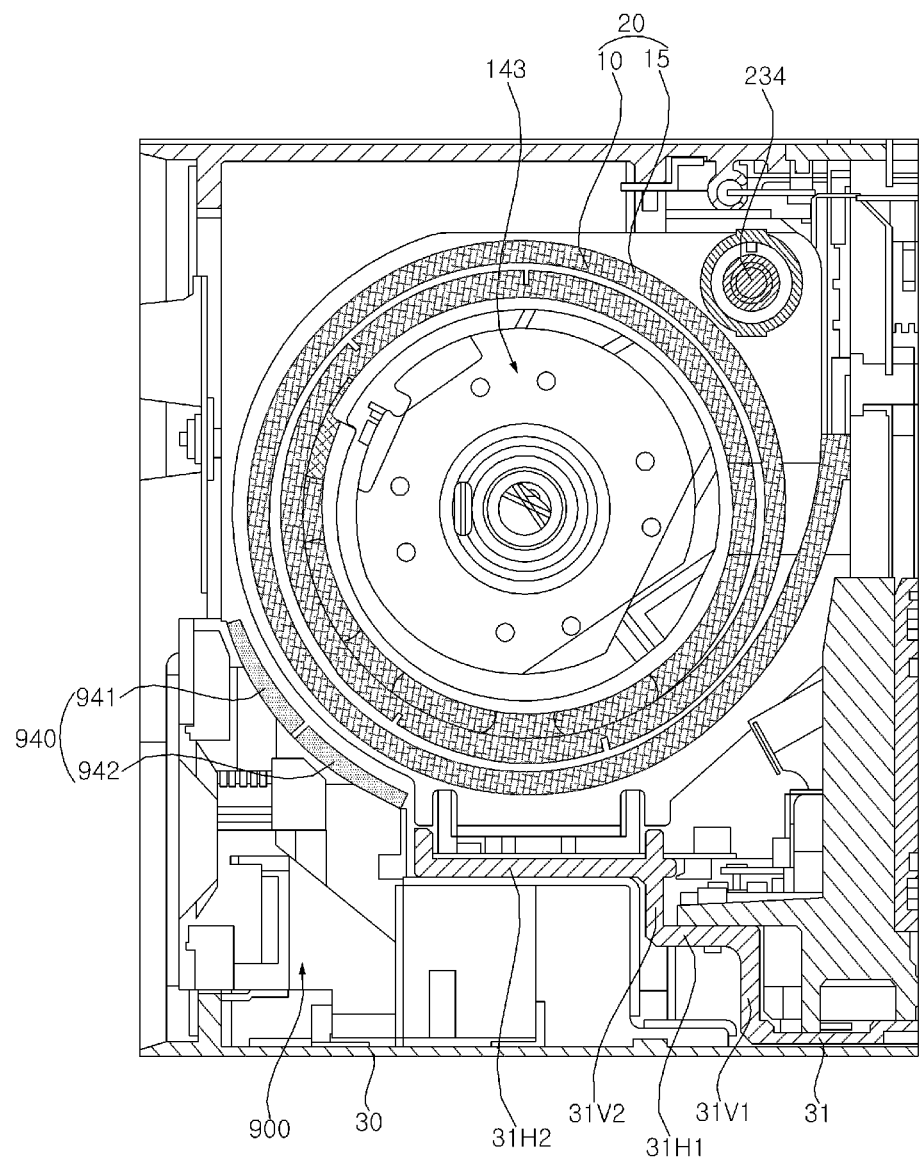

Referring to FIG. 60, the panel roller 143 may be rotatably installed inside the housing 30. The module cover 15 and the display panel 10 may be wound around the panel roller 143 inside the housing 30. The module cover and the display panel 10 wound around the panel roller 143 may be unwound from the panel roller 143 or be sagging due to vibration or external impact.

The base 31 may include a first vertical portion 31V1, a first horizontal portion 31H1, a second vertical portion 31V2, and a second horizontal portion 31H2. The base 31 may be referred to as a first base 31. The first vertical portion 31V1, the first horizontal portion 31H1, the second vertical portion 31V2, and the second horizontal portion 31H2 may form a stair shape as a whole while forming a step. The second horizontal portion 31H2 may be located in a vertical downward of the panel roller 143.

The speaker assembly 900 may be installed in the front lower side of the panel roller 143. The speaker assembly 900 may be located in front of the second horizontal portion 31H2. The sound provided by the speaker assembly 900 may be directed toward the front of the housing 30.

Figure 61:
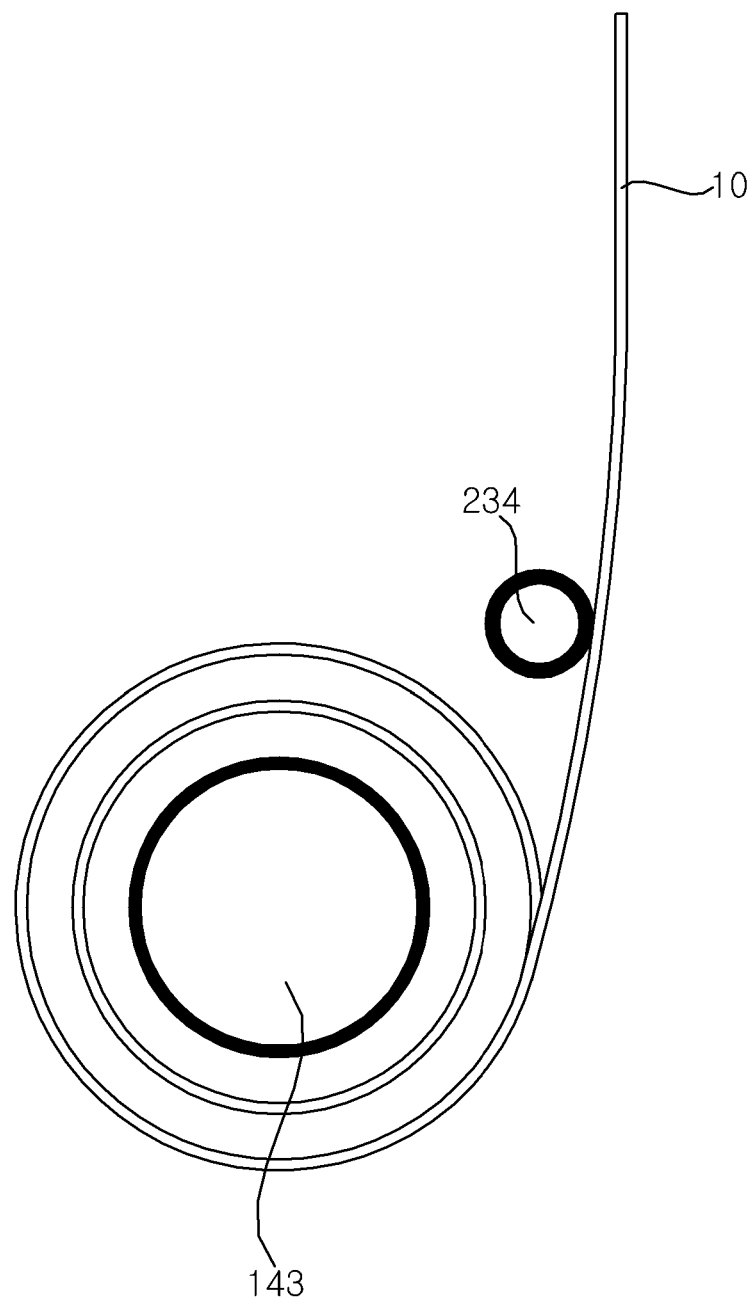
Figure 62:
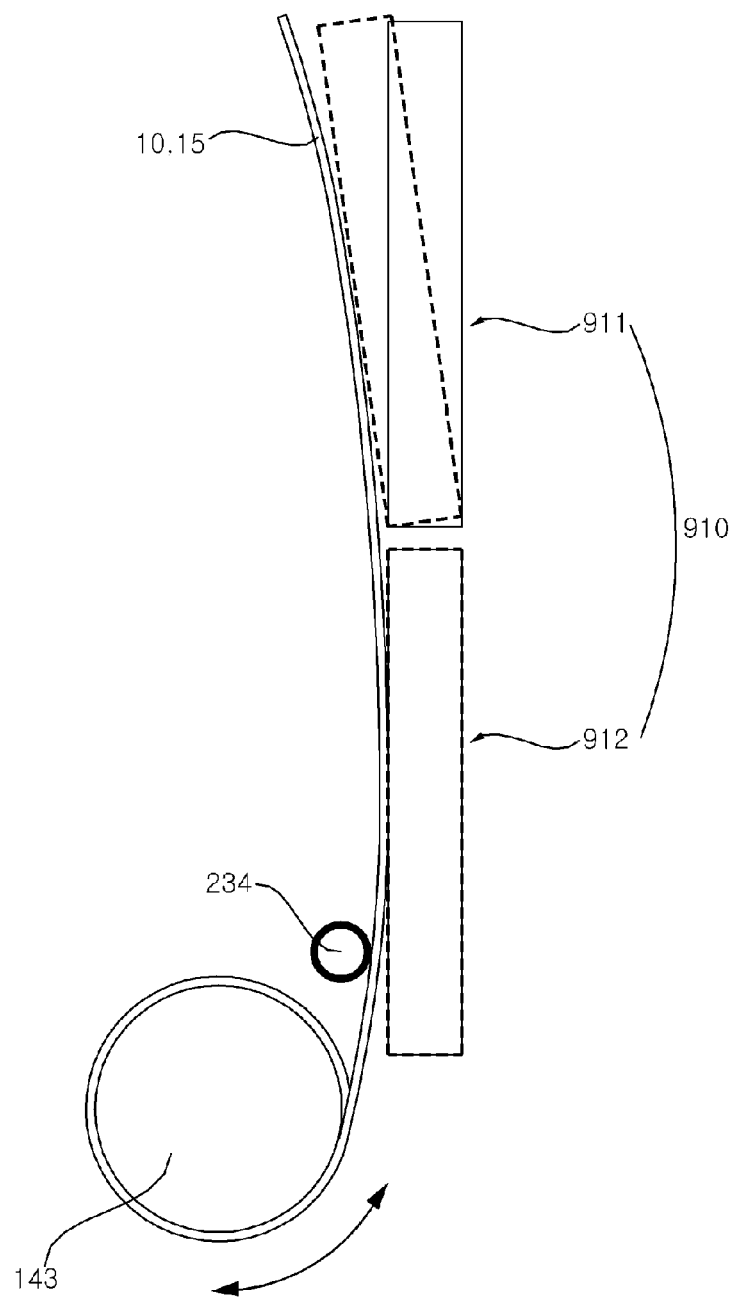

Referring to FIGS. 61 and 62, the display panel 10 may be wound around the panel roller 143. The display panel 10 may be wound around the outer circumferential surface of the panel roller 143, and the display panels 10 wound around the panel roller 143 may be stacked on a plurality of sides. The display panel 10 may be unwound from the panel roller 143. The display panel 10 unwound from the panel roller 143 may be unfolded while drawing a certain curve.

The first arm 911 may be pivotably connected to the second arm 912. The display panel 10 and/or the module cover 15 may be located in front of the first arm 911 and/or the second arm 912. The display panel 10 and/or the module cover 15 may be coupled to the first arm 911 or the second arm 912, and may be coupled to the first arm 911 and the second arm 912. The display panel 10 unwound from the panel roller 143 has a force to maintain a certain curve, and accordingly, the first arm 911 may be bent with respect to the second arm 912.

Figure 63:
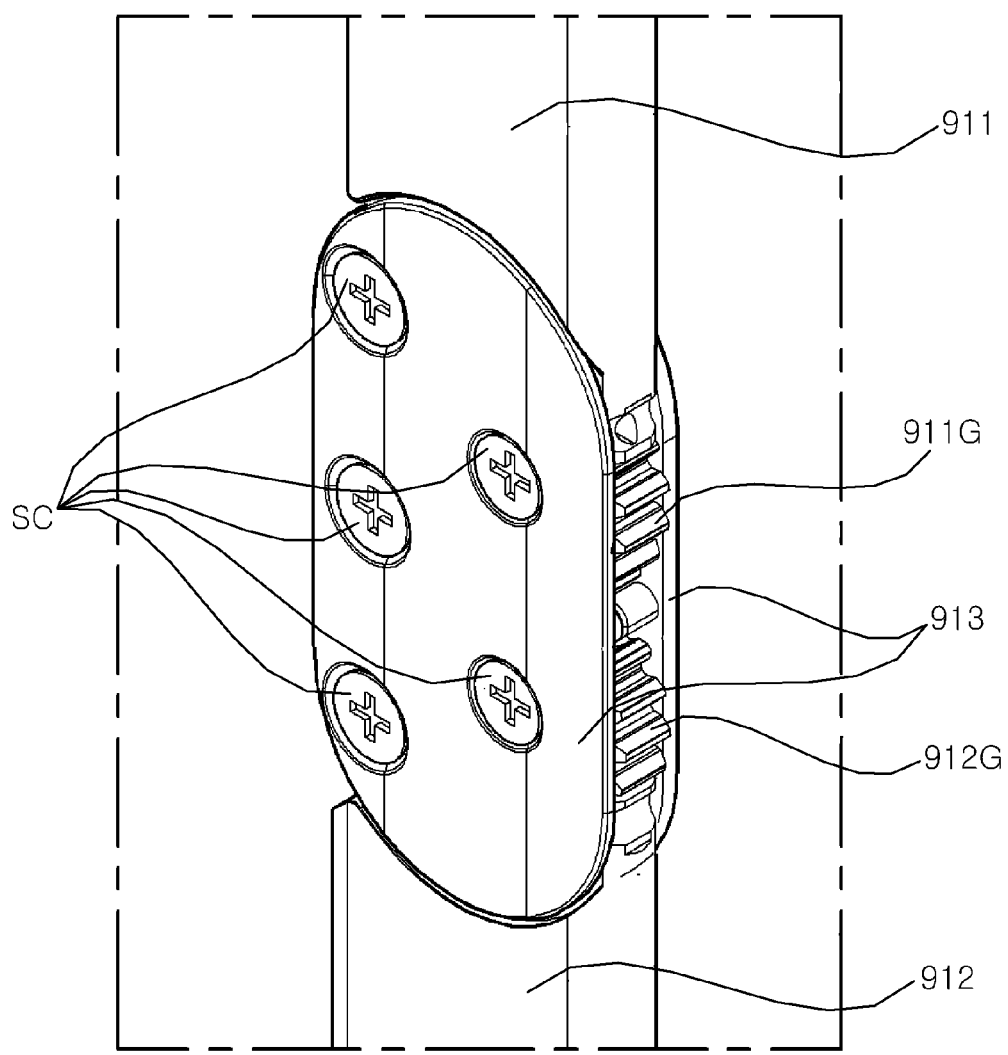
Figure 64:
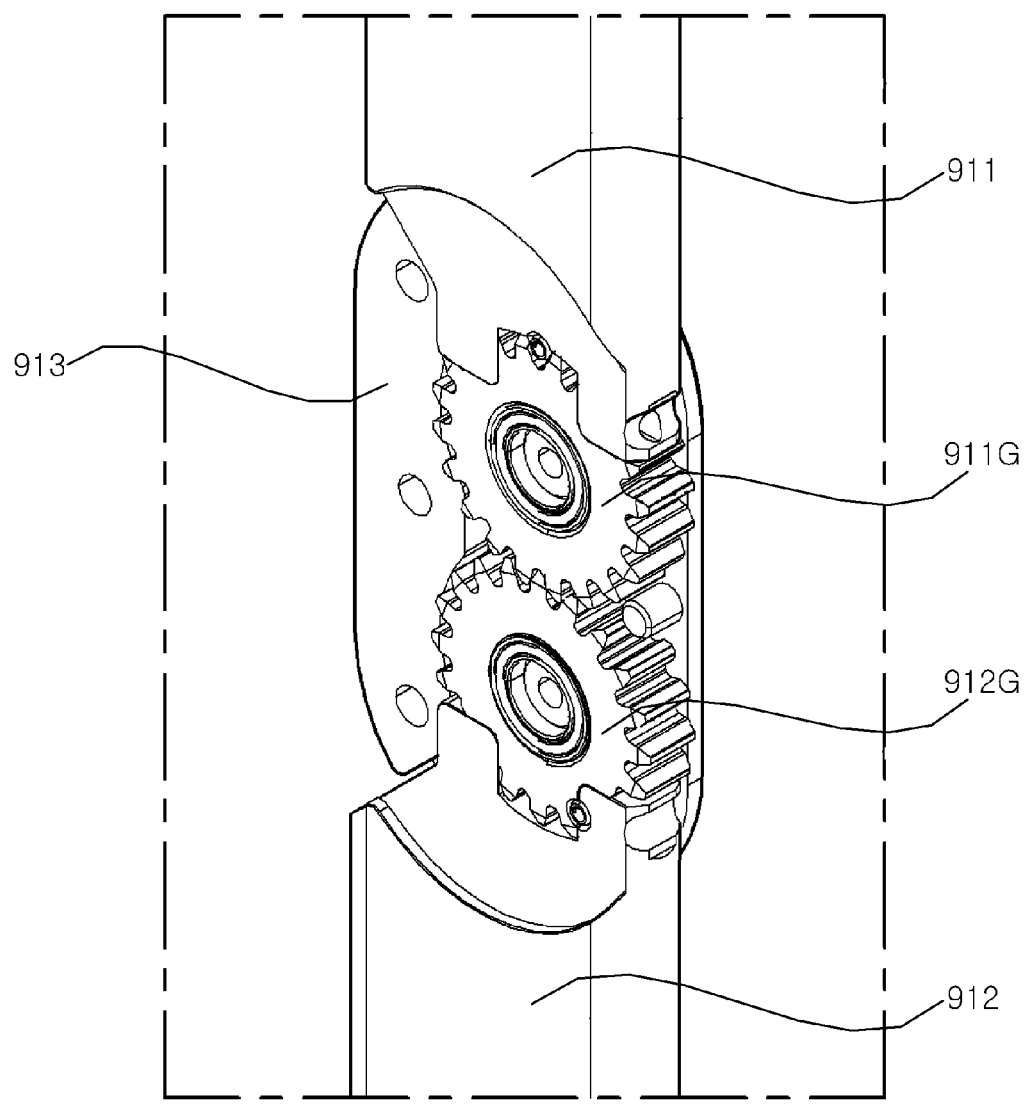

Referring to FIGS. 63 and 64, a gear 912G may be formed in an upper end of the second arm 912. Alternatively, the gear 912G may be coupled to the upper end of the second arm 912. Alternatively, the gear 912G may be fixed to the upper end of the second arm 912. Alternatively, the gear 912G may be formed as one body with the second arm 912.

The gear 911G may be formed in the lower end of the first arm 911. Alternatively, the gear 911G may be coupled to the lower end of the first arm 911. Alternatively, the gear 911G may be fixed to the lower end of the first arm 911. Alternatively, the gear 911G may be formed as one body with the first arm 911. The gear 911G, 912G may be engaged. The gear 911G, 912G may rotate with respect to the joint 913.

The joint 913 may be a plurality of plate members, and the plurality of plate members may be coupled to each other by a fastening member SC. The gear 911G, 912G may rotate with respect to the joint 913.

When the first arm 911 is bent with respect to the second arm 912 due to a curve of the display panel 10, a wear or uneven wear occurs between the gears 911G and 912G while the first arm 911 pivots with respect to the second arm 912, thereby reducing durability and generating noise and vibration.

Figure 65:
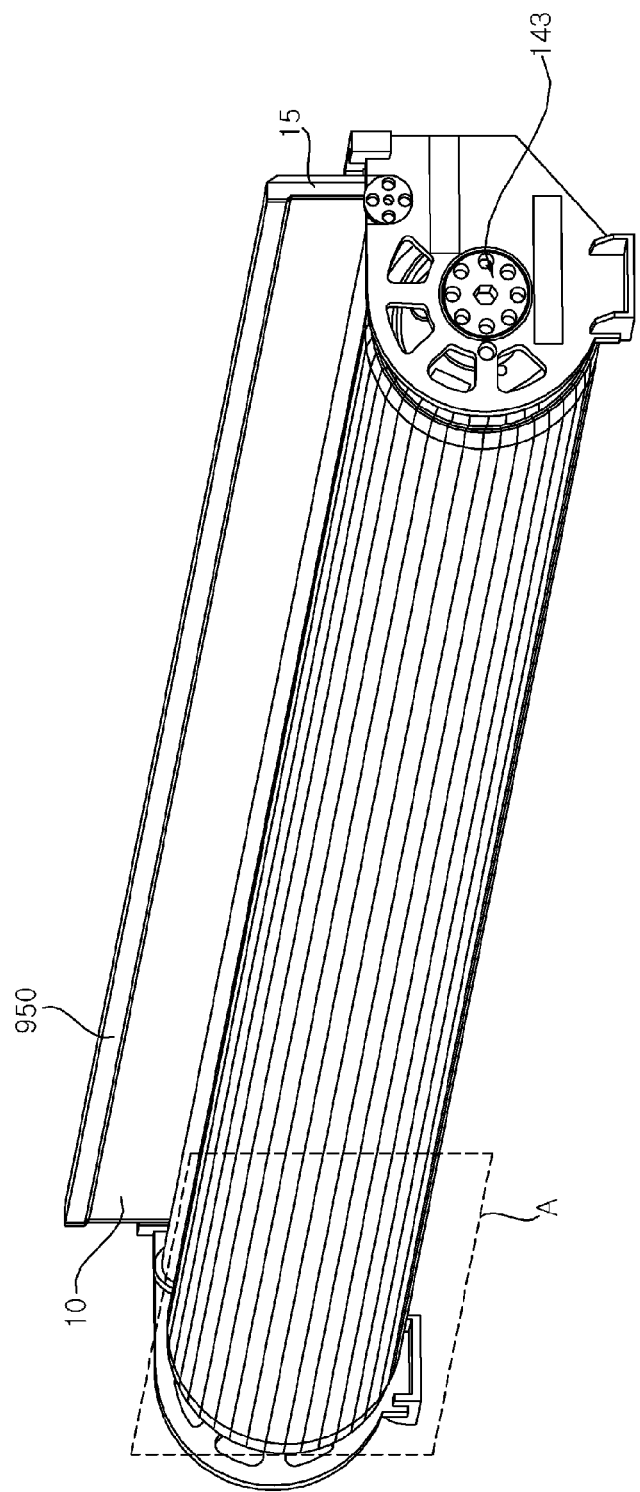
Figure 66:
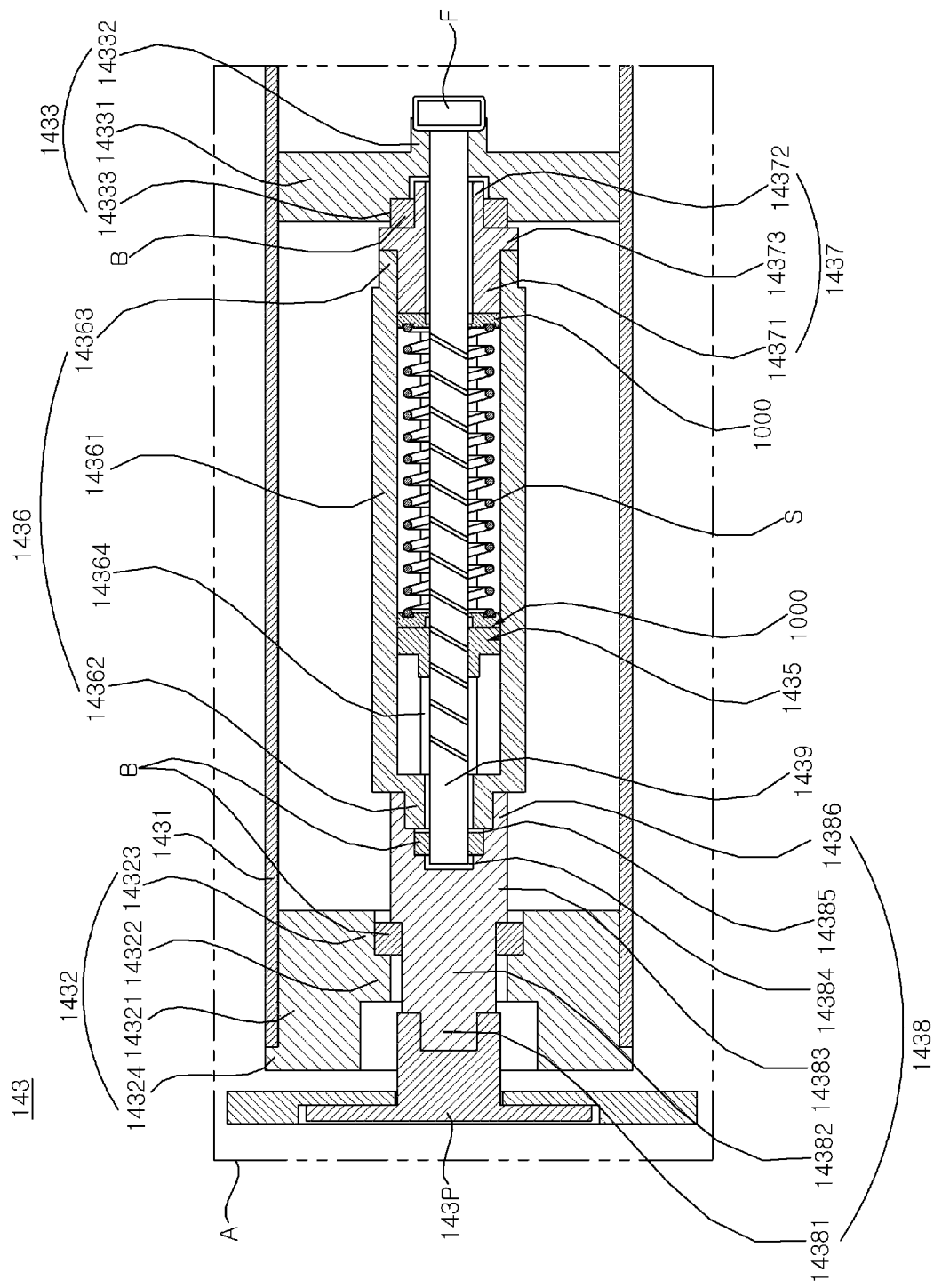

Referring to FIGS. 65 and 66, the display panel 10 and/or the module cover 15 may be wound around the panel roller 143. The display panel 10 and/or the module cover may be wound around the outer circumferential surface of a roll cover 1431 or unwound from the outer circumferential surface of the roll cover 1431.

The roll cover 1431 may have a hollow cylindrical shape. A side coupler 1432 may be inserted into one end of the roll cover 1431. A middle coupler 1433 may be located in the middle of the inner side of the roll cover 1431. The couplers 1432 and 1433 may be referred to as a shaft coupler 1432, 1433.

The side coupler 1432 may include a body 14321, a flange 14324, a first inner ring 14322, and a second inner ring 14323. The body 14321 may have a ring shape. The outer circumferential surface of the body 14321 may face or contact the inner circumferential surface of the roll cover 1431. The body 14321 may be press-fitted into the roll cover 1431. The flange 14324 may be formed in one end of the body 14321. The flange 14324 may protrude from the outer circumferential surface of the body 14321. The outer diameter of the flange 14324 may be substantially the same as the outer diameter of the roll cover 1431. The outer circumferential surface of the flange 14324 may form a step with the outer circumferential surface of the body 14321. The flange 14324 may restrict a location where the body 14321 is inserted into the roll cover 1431. The side coupler 1432 may rotate together with the roll cover 1431.

A first inner ring 14322 may protrude from the inner circumferential surface of the body 14321. The inner diameter of the first inner ring 14322 may be smaller than the inner diameter of the body 14321. The first inner ring 14322 may be located in a central portion of the body 14321. A second inner ring 14323 may protrude from the inner circumferential surface of the body 14321. The second inner ring 14323 may be located adjacent to the first inner ring 14322. The second inner ring 14323 may face the flange 14324 with respect to the first inner ring 14322. The inner diameter of the second inner ring 14323 may be larger than the inner diameter of the first inner ring 14322.

A middle coupler 14333 may include a body 14331, a fixing ring 14332, and a coupling ring 14333. The body 14331 may have a disk shape as a whole. The fixing ring 14332 may be formed on one surface of the body 14331. The fixing ring 14332 may have a ring shape that has the same center as the circle center of the body 14331 and protrudes from one surface of the body 14331. The fixing ring 14332 may be referred to as a fixing portion 14332. The coupling ring 14333 may be formed by being recessed inward from the inner circumferential surface of the body 14331. The coupling ring 14333 may be formed by cutting out the inner circumferential surface of the body 14331 and the other surface of the body 14331. The coupling ring 14333 may be a square ring. The inner diameter of the coupling ring 14333 may be larger than the inner diameter of the body 14331. The coupling ring 14333 may be referred to as a coupling portion 14333.

A lead screw 1439 may be an elongated pole. One end of the lead screw 1439 may be coupled to or fixed to the fixing portion 14332 of the middle coupler 1433. The lead screw 1439 may be fixed to the middle coupler 1433 by a fixing flange F. The lead screw 1439 may rotate together with the middle coupler 1433.

A shaft 1436, 1438 may include an outer shaft 1438 and an inner shaft 1436. The outer shaft 1438 may be inserted into the side coupler 1432. The outer shaft 1438 may rotate on the side coupler 1432. The outer shaft 1438 may include a first part 14381, a second part 14382, and a third part 14383. The first part 14381 may have a cylindrical shape, the second part 14382 may have a cylindrical shape and may be connected to a distal end of the first part 14381, and the third part 14383 may have a cylindrical shape and may be connected to a distal end of the second part 14382. The second part 14382 may be located between the first part 14381 and the third part 14383. The diameter of the second part 14382 may be larger than the diameter of the first part 14381, and the diameter of the third part 14383 may be larger than the diameter of the second part 14382.

The outer shaft 1438 may be rotatably inserted into the first inner ring 14322 and/or the second inner ring 14323 of the side coupler 1432. A bearing B may be located between the second part 14382 of the outer shaft 1438 and the second inner ring 14323 of the side coupler 1432. The bearing B may contact the outer circumferential surface of the second part 14382 of the outer shaft 1438 and may contact the second inner ring 14323 of the side coupler 1432. The outer circumferential surface of the second part 14382 of the outer shaft 1438 may be spaced apart from the first inner ring 14322 of the side coupler 1432, and the outer circumferential surface of the third part 14383 may be spaced apart from the second inner ring 14323.

The third part 14383 may include a first inner ring surface 14384, a second inner ring surface 14385, and a third inner ring surface 14386. The first inner ring surface 14384, the second inner ring surface 14385, and/or the third inner ring surface 14385 may be formed in the inner side of the third part 14383. The diameter of the second inner ring surface 14385 may be larger than the diameter of the first inner ring surface 14384, and the diameter of the third inner ring surface 14386 may be larger than the diameter of the second inner ring surface 14385. The second inner ring surface 14385 may be located between the first inner ring surface 14384 and the third inner ring surface 14386. The bearing B may be located between the second inner ring surface 14385 and the lead screw 1439. The outer diameter of the lead screw 1439 may be smaller than the diameter of the first inner ring surface 14384. The lead screw 1439 may rotate on the third part 14383 of the outer shaft 1438.

The inner shaft 1436 may include a first part 14361, a second part 14362, and a third part 14363. The first part 14361 may have a cylindrical shape. The second part 14362 may have a ring shape connected to one end of the first part 14361, and the diameter of the second part 14362 may be smaller than the diameter of the first part 14361. The inner diameter of the second part 14362 may be larger than the diameter of the lead screw 1439. The outer diameter of the second part 14362 may be substantially the same as the diameter of the third inner ring surface 14386 of the outer shaft 1438. The third part 14363 may be connected to the other end of the first part 14361. The inner diameter of the third part 14363 may be substantially the same as the inner diameter of the first part 14361, and the outer diameter of the third part 14363 may be smaller than the outer diameter of the first part 14361. The outer shaft 1436 may be coupled to inner shaft 1432, and outer shaft 1438 may rotate along with the inner shaft 1436.

A rear cap 1437 may be inserted into the inner shaft 1436. The rear cap 1437 may be referred to as an inner cap 1437 or an end cap 1437. The rear cap 1437 may have a cylindrical shape as a whole. The rear cap 1437 may include a body 14371, a flange portion 14373, and an insertion portion 14372. The outer diameter of the body 14371 may be substantially the same as the inner diameter of the first part 14361 and/or the third part 14363 of the inner shaft 1436. The flange portion 14373 may be formed in one end of the body 14371. The flange portion 14373 may have a disk or ring shape, and the inner diameter of the flange portion 14373 may be substantially the same as the inner diameter of the body 14371. The insertion portion 14372 may face the body 14371 with respect to the flange portion 14373. The insertion portion 14372 may be connected to the flange portion 14373. The inner diameter of the insertion portion 14372 may be substantially the same as the inner diameter of the body 14371 and/or the flange portion 14373. The insertion portion 14372 may be inserted into the middle coupler 1433. The lead screw 1439 may penetrate the rear cap 1437. The inner diameter of the rear cap 1437 may be larger than the diameter of the lead screw 1439. The lead screw 1439 may be spaced apart from the inner circumferential surface of the rear cap 1437.

The bearing B may be located between the rear cap 1437 and the middle coupler 1433. The bearing B may contact the body 14331 and/or the coupling ring 14333 of the middle coupler 1433. At the same time, the bearing B may contact the insertion portion 14372 and/or the flange portion 14373 of the rear cap 1437. The rear cap 1437 may be inserted into the middle coupler 1433 and rotated. The outer shaft 1438, the inner shaft 1436, and the rear cap 1437 may rotate with respect to the lead screw 1439 and the middle coupler 1433.

The outer cap 143P may be referred to as a front cap 143P or an end cap 143P. The outer cap 143P may be fixed to the outer shaft 1438 and may rotate together with the outer shaft 1438.

The above configuration may be located in one side of the roll cover 1431 of the panel roller 143. The roll cover 1431 may rotate with respect to the outer cap 143P. At this time, the rotational force or restoring force generated by the elastic member S and the lead screw 1439 may form a stress in the outer cap 143P. Different torsional stresses may be formed in both ends of the panel roller 143 while the above mentioned rotational force or restoring force is formed only in one side of the panel roller 143.

Accordingly, in a repeated process where the display panel 10 and/or the module cover 15 are/is wound around or unwound from the panel roller 143, the display panel 10 and/or the module cover may be rolled while sagging or twisting.

Figure 67:
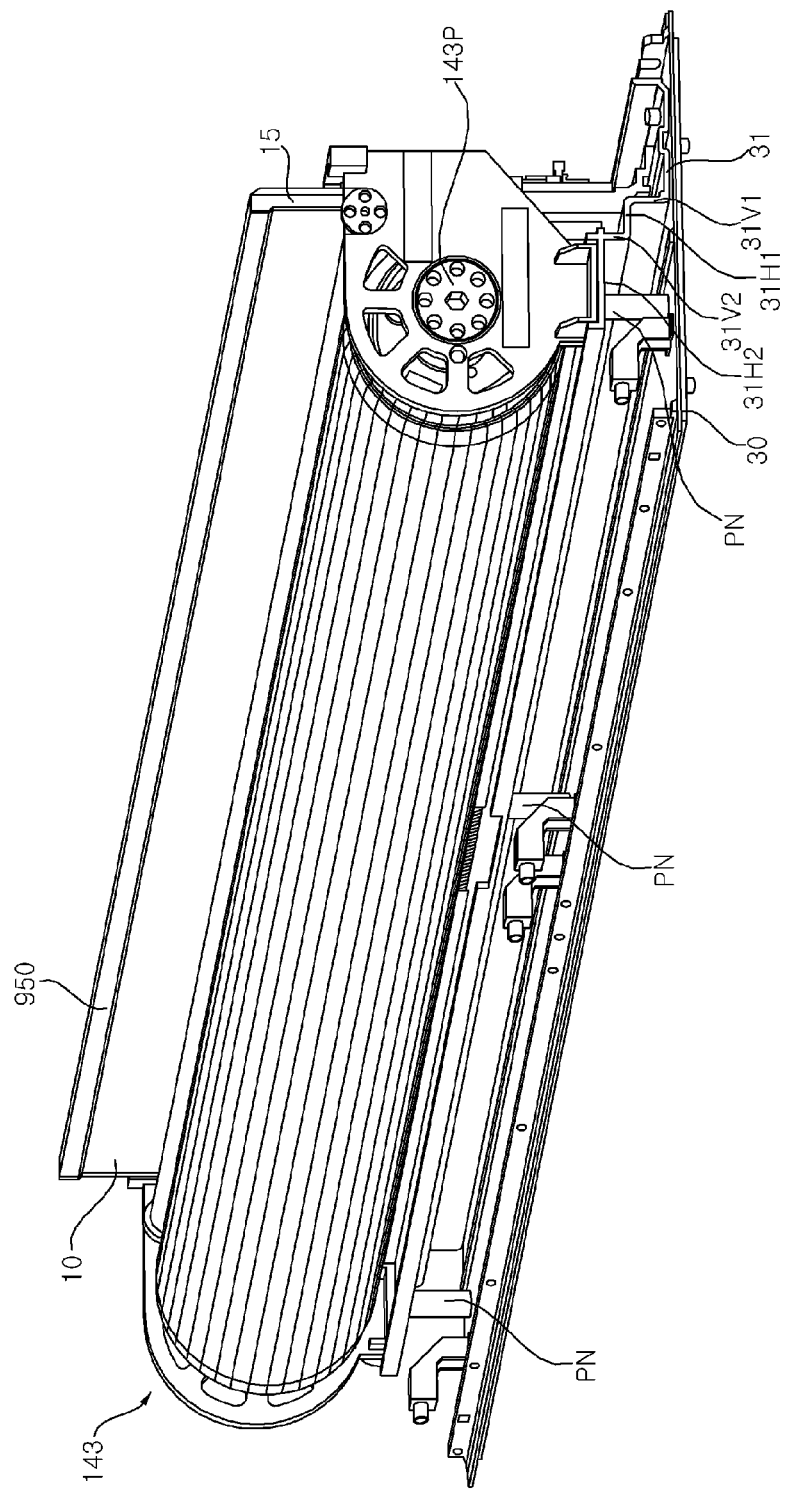

Referring to FIG. 67, the panel roller 143 may be rotatably mounted on the base 30. The panel roller 143 may be mounted or fixed on the second horizontal portion 31H2. A support member PN may be located between the second horizontal portion 31H2 and the bottom of the housing 30. For example, the support member PN may be a pem nut. The number of support members PN may be plural.

A first support member PN may be located adjacent to one end of the second horizontal portion 31H2 in the longitudinal direction, a second support member PN may be located adjacent to the other end of the second horizontal portion 31H2 in the longitudinal direction, and a third support member PN may be located between the first support member PN and the second support member PN in the longitudinal direction of the second horizontal portion 31H2. The support members PN may be fixed to the bottom of the housing 30 and may support the second horizontal portion 31H2.

Figure 68:
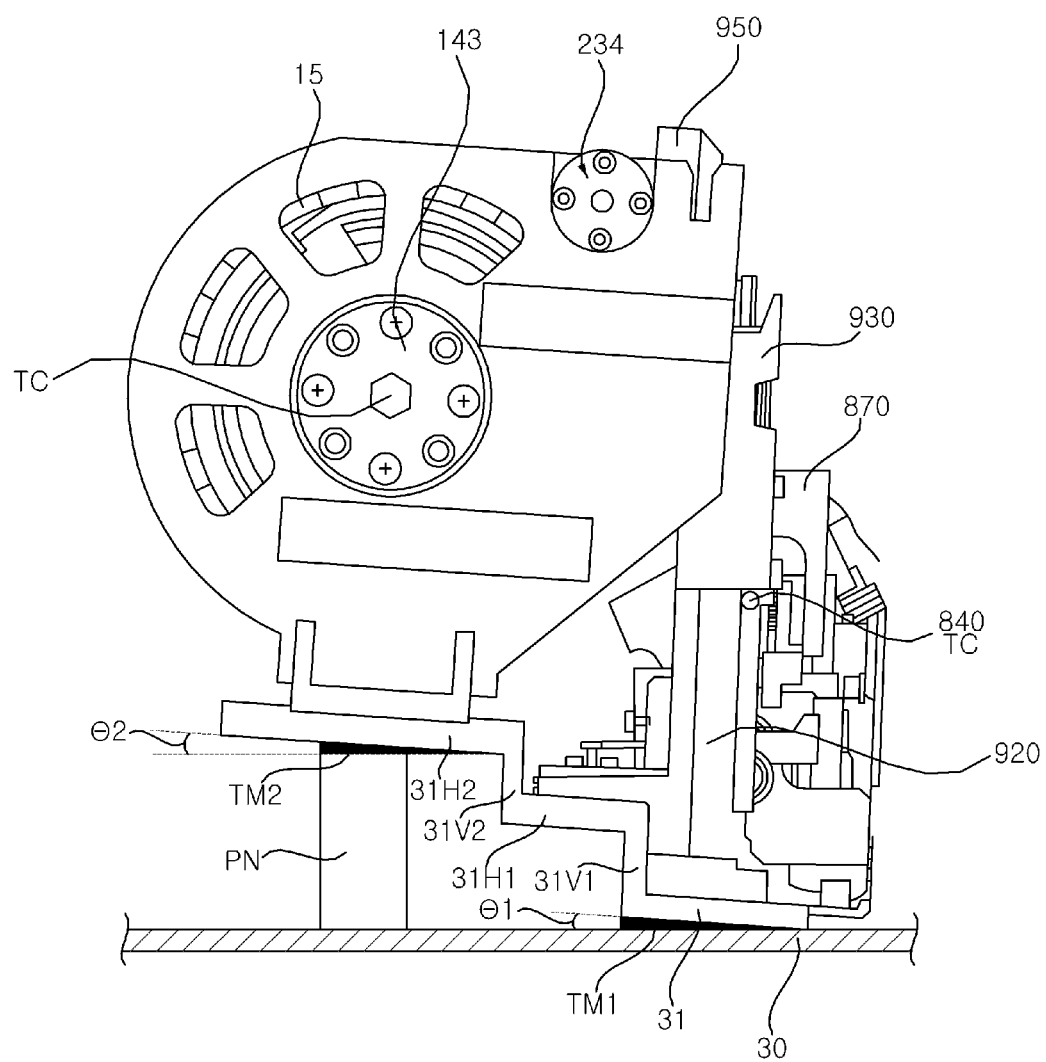

Referring to FIG. 68, a first tilting member TM1 may be located between the bottom of the housing 30 and the base 31. The first tilting member TM1 may have a wedge shape as a whole. The first tilting member TM1 may be inserted or press-fitted into between the bottom of the housing 30 and the base 31 from the front toward the rear. For example, the angle theta 1 formed between the lower surface and the upper surface of the first tilting member TM1 may be 0.5 to 1.5 degrees. For another example, the angle theta 1 between the lower surface and the upper surface of the first tilting member TM1 may be 1 degree. The tilting center 840TC of the base 31 tilted by the first tilting member TM1 may be the rotation center of the lead screw 840.

The second tilting member TM2 may be located between the support member PN and the second horizontal portion 31H2. The second tilting member TM2 may have a wedge shape as a whole. The second tilting member TM2 may be inserted or press-fitted into between the support member PN and the second horizontal portion 31H2 from the front toward the rear. For example, the angle between the lower surface and the upper surface of the second tilting member TM2 may be 0.5 to 1.5 degrees. For another example, the angle between the lower surface and the upper surface of the second tilting member TM2 may be 1 degree. The tilting center TC of the second horizontal portion 31H2 tilted by the second tilting member TM2 may be the rotation center of the panel roller 143. The rotation center of the panel roller 143 may be the rotation center of the shaft 143B (see FIG. 66).

Figure 69:
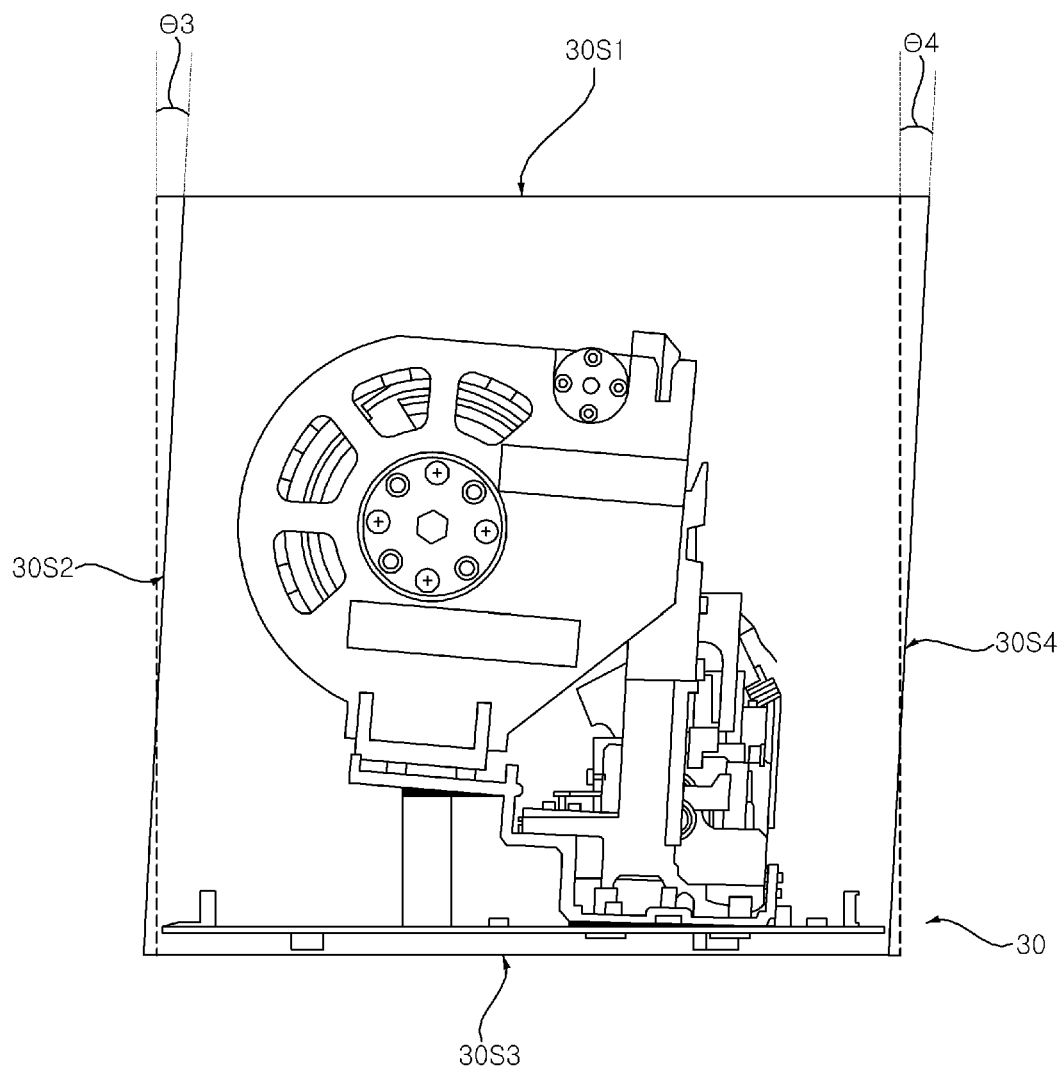

Referring to FIG. 69, the housing 30 may include an upper plate 30S1, a lower plate 30S3, a front plate 30S2, and a rear plate 30S4. A side cross section of the housing may have a rhombus shape as a whole. The front plate 30S2 of the housing 30 may form an acute angle with respect to the lower plate 30S3 of the housing 30, and the front plate 30S2 of the housing 30 may form an obtuse angle with respect to the upper plate 30S1 of the housing 30. The rear plate 30S4 of the housing 30 may form an obtuse angle with respect to the lower plate 30S3 of the housing 30, and the rear plate 30S4 of the housing 30 may form an acute angle with respect to the upper plate 30S1 of the housing 30. The front plate 30S2 of the housing 30 may be inclined to a rear at a third angle theta 3. The rear plate 30S4 of the housing 30 may be inclined to a rear at a fourth angle theta 4. For example, the third angle theta 3 may be 1 degree. For another example, the fourth angle theta 4 may be 1 degree.

Referring to FIGS. 1 to 69, there is provided a display device including: a housing which is elongated, and has a base; a roller which is rotatably installed on the base inside the housing; a display panel which is wound around or unwound from the roller; a module cover which is elongated in a longitudinal direction of the housing, has a plurality of segments arranged sequentially in an up-down direction of the display panel in a rear of the display panel, and is wound around or unwound from the roller along with the display panel; and a foldable link which is located in the rear of the display panel, has one side pivotally connected to the base, and has the other side pivotally connected to an upper side of the module cover so that the display panel and module cover stand up while being unwound from the roller, wherein the base is tilted at a certain angle with respect to a bottom of the housing.

The base includes: a first base coupled to the bottom of the housing; a first horizontal portion forming a step from the first base; and a second horizontal portion forming a step from the first horizontal portion, wherein the foldable link is mounted on the first base or the first horizontal portion, and the roller is mounted on the second horizontal portion.

The display device further includes a support member which is located between the second horizontal portion and the bottom of the housing, is fixed to the bottom of the housing, and supports the second horizontal portion.

The display device further includes a first tilting member which is inserted into between the bottom of the housing and the first base, and has an upper surface and a lower surface that form the certain angle, and the angle is 0.5 to 1.5 degrees.

The display device further includes a second tilting member which is inserted into between the support member and the second horizontal portion, and has an upper surface and a lower surface that form the certain angle, and the angle is 0.5 to 1.5 degrees.

A cross section of the housing in a direction intersecting a longitudinal direction of the housing has a rhombus shape. The housing includes: an upper plate; a lower plate facing the upper plate; a front plate connecting the upper plate and the lower plate; and a rear plate which faces the front plate, and connects the upper plate and the lower plate, and the upper plate forms an obtuse angle with the front plate, and the upper plate forms an acute angle with the rear plate.

Certain embodiments or other embodiments of the invention described above are not mutually exclusive or distinct from each other. Any or all elements of the embodiments of the invention described above may be combined or combined with each other in configuration or function.

For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A display device comprising:
   a housing elongated and including a base;
   a roller rotatably installed on the base inside the housing;
   a display panel wound on or unwound from the roller;
   a module cover elongated in a longitudinal direction of the housing, including a plurality of segments arranged sequentially in an up-down direction of the display panel at a rear of the display panel, and wound on or unwound from the roller along with the display panel; and
   a foldable link at the rear of the display panel, the foldable link including one side pivotally connected to the base and the other side pivotally connected to an upper side of the module cover such that the display panel and module cover stand up while being unwound from the roller,
   wherein the base is tilted at an angle with respect to a bottom of the housing and comprises:
   a first base coupled to the bottom of the housing;
   a first horizontal portion stepped up from the first base;
   a second horizontal portion stepped up from the first horizontal portion;
   a support member located between the second horizontal portion and the bottom of the housing, fixed to the bottom of the housing, and supporting the second horizontal portion; and
   a first tilting member inserted into between the bottom of the housing and the first base, and including an upper surface and a lower surface with a first angle, and
   wherein the foldable link is mounted on the first base or the first horizontal portion, and the roller is mounted on the second horizontal portion.

2. The display device of claim 1, wherein the first angle is 0.5 to 1.5 degrees.

3. The display device of claim 2, further comprising a second tilting member inserted into between the support member and the second horizontal portion, and including an upper surface and a lower surface with a second angle.

4. The display device of claim 3, wherein the second angle is 0.5 to 1.5 degrees.

5. The display device of claim 4, wherein a cross section of the housing in a direction intersecting a longitudinal direction of the housing including a rhombus shape.

6. The display device of claim 5, wherein the housing comprises:
  an upper plate;
  a lower plate facing the upper plate;
  a front plate connecting the upper plate and the lower plate; and
  a rear plate which faces the front plate, and connects the upper plate and the lower plate.

7. The display device of claim 6, wherein the upper plate forms an obtuse angle with the front plate, and
  the upper plate forms an acute angle with the rear plate.

* * * * *